US006765222B2

(12) United States Patent
Bacchi et al.

(10) Patent No.: US 6,765,222 B2
(45) Date of Patent: Jul. 20, 2004

(54) DETECTION OF MOTIVE FORCE APPLIED TO TRANSPORT BOX MOUNTED ON A FIMS SYSTEM

(75) Inventors: Paul Bacchi, Ross, CA (US); Paul S. Filipski, Greenbrae, CA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 10/335,134

(22) Filed: Dec. 30, 2002

(65) Prior Publication Data

US 2003/0173512 A1 Sep. 18, 2003

Related U.S. Application Data

(60) Division of application No. 09/612,757, filed on Jul. 10, 2000, now Pat. No. 6,501,070, which is a continuation-in-part of application No. 09/352,155, filed on Jul. 12, 1999, now Pat. No. 6,281,516.
(60) Provisional application No. 60/092,626, filed on Jul. 13, 1998.

(51) Int. Cl.[7] ............................................... G01N 21/86
(52) U.S. Cl. .................. 250/559.29; 250/239
(58) Field of Search ........................... 250/559.29, 239, 250/559.3, 221; 356/399, 401; 414/936, 937, 938, 939

(56) References Cited

U.S. PATENT DOCUMENTS

| 4,762,228 A | 8/1988 | McConnell, III et al. ... 206/397 |
| 4,895,357 A | * 1/1990 | Lippold ........................ 271/8.1 |
| 5,443,348 A | 8/1995 | Biche et al. ................. 414/416 |
| 5,772,386 A | 6/1998 | Mages et al. ................ 414/411 |
| 5,810,537 A | 9/1998 | Briner et al. ............. 414/217.1 |
| 5,944,475 A | 8/1999 | Bonora et al. .............. 414/754 |
| 6,030,208 A | 2/2000 | Williams et al. ............ 432/253 |
| 6,082,951 A | 7/2000 | Nering et al. ............ 414/217.1 |
| 6,375,403 B1 | 4/2002 | Mages et al. ................ 414/411 |
| 6,502,869 B1 | 1/2003 | Rosenquist et al. ........... 292/59 |

* cited by examiner

Primary Examiner—Que T. Le
(74) Attorney, Agent, or Firm—Stoel Rivers LLP

(57) ABSTRACT

A motive force detection system prevents an overpowering of the movement of a transport box-carrying slidable tray of a FIMS system past a reference location upon detection of improper mating of the transport box to the FIMS system port plate or an obstruction to the movement of the slidable tray.

23 Claims, 35 Drawing Sheets

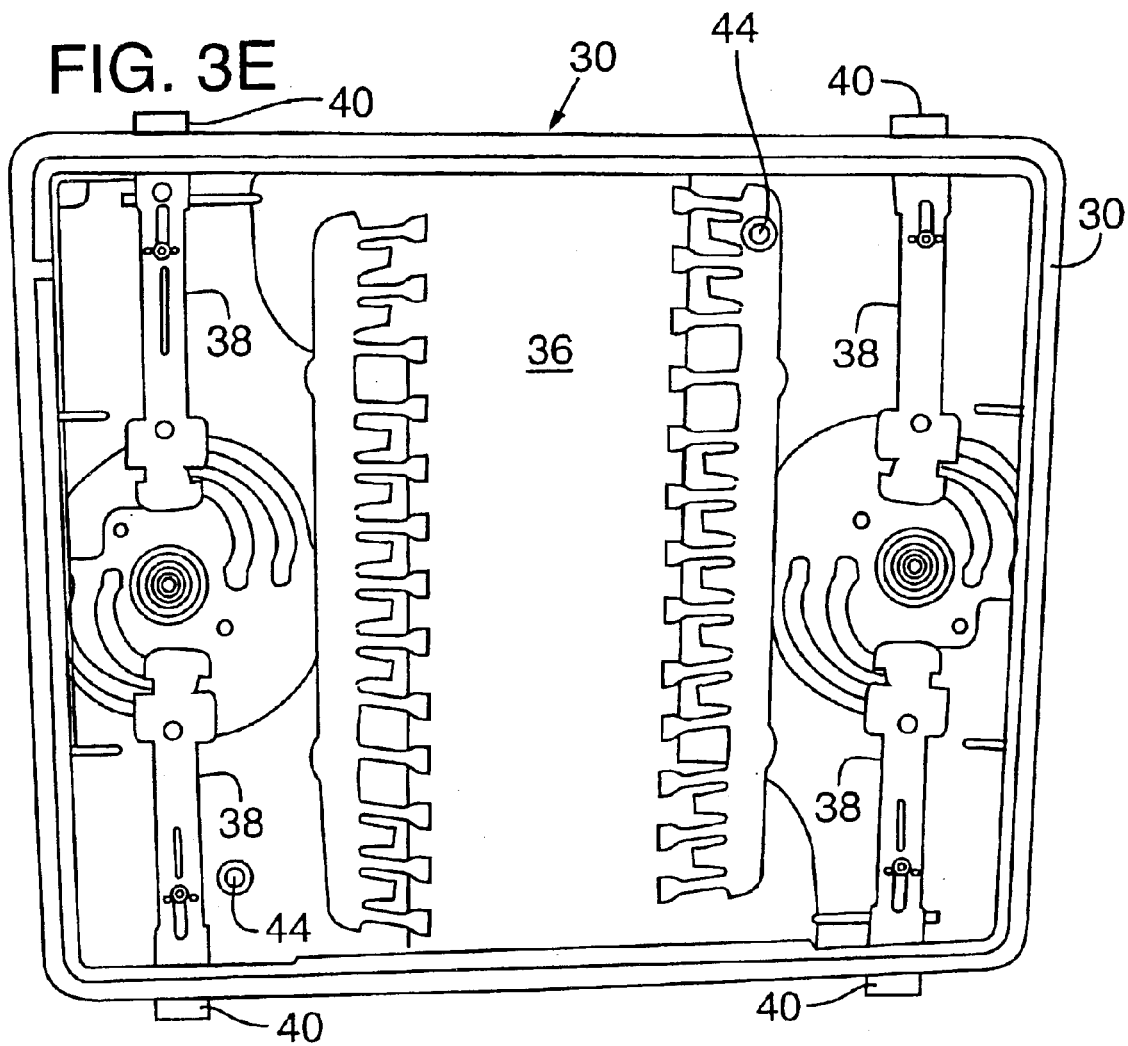

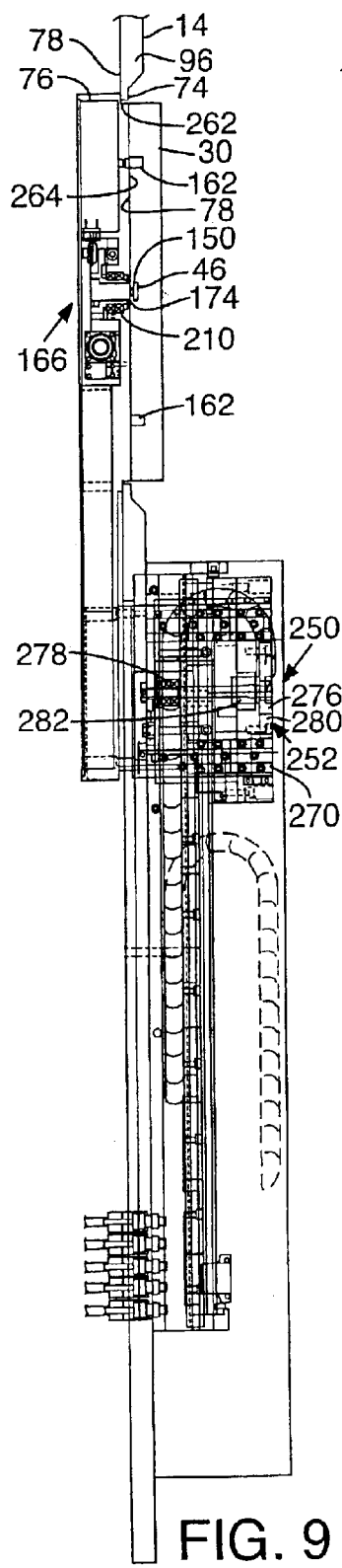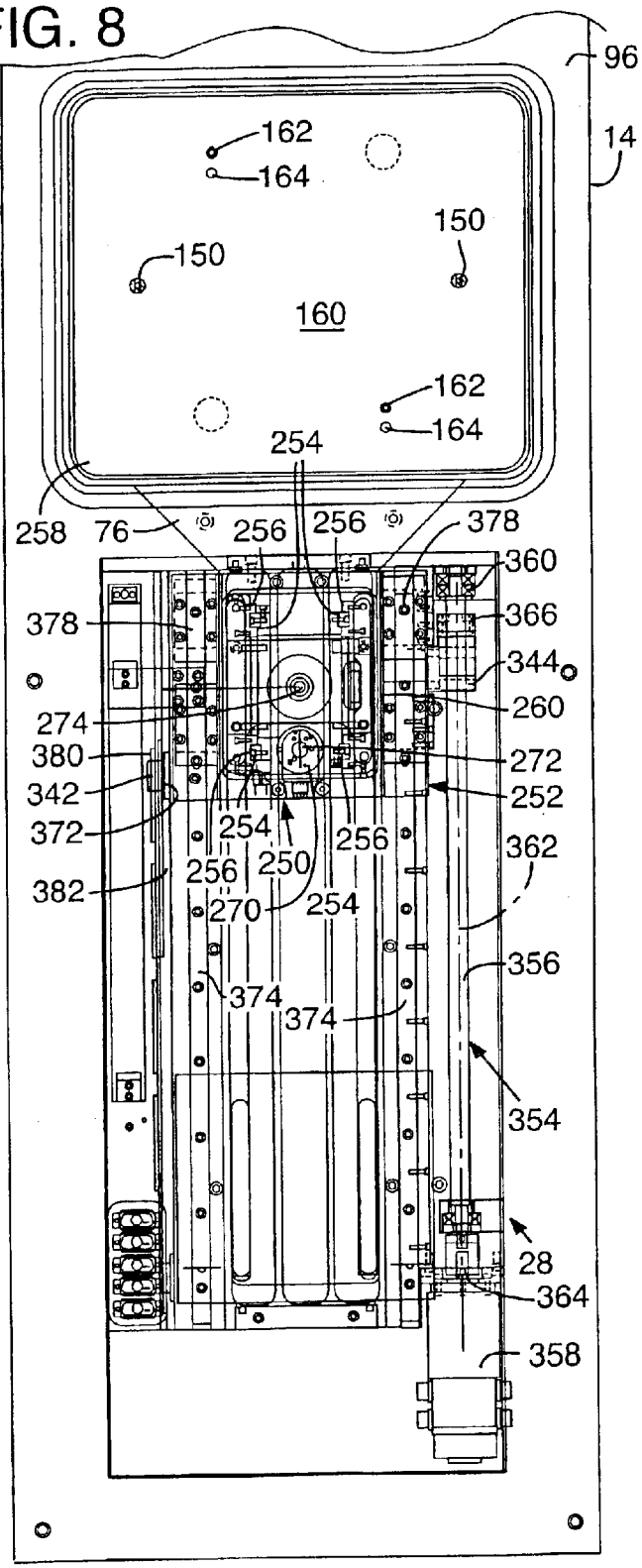

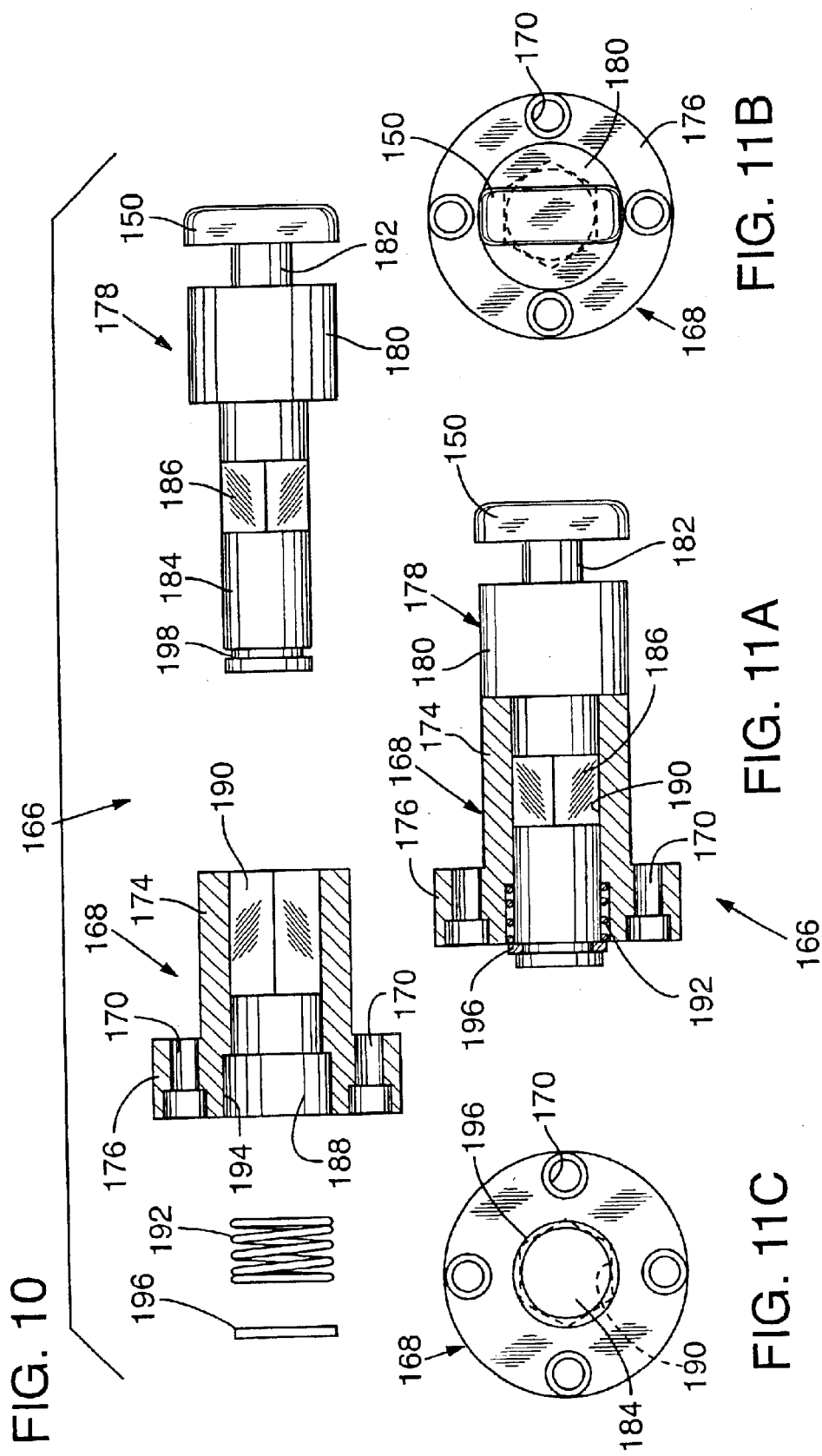

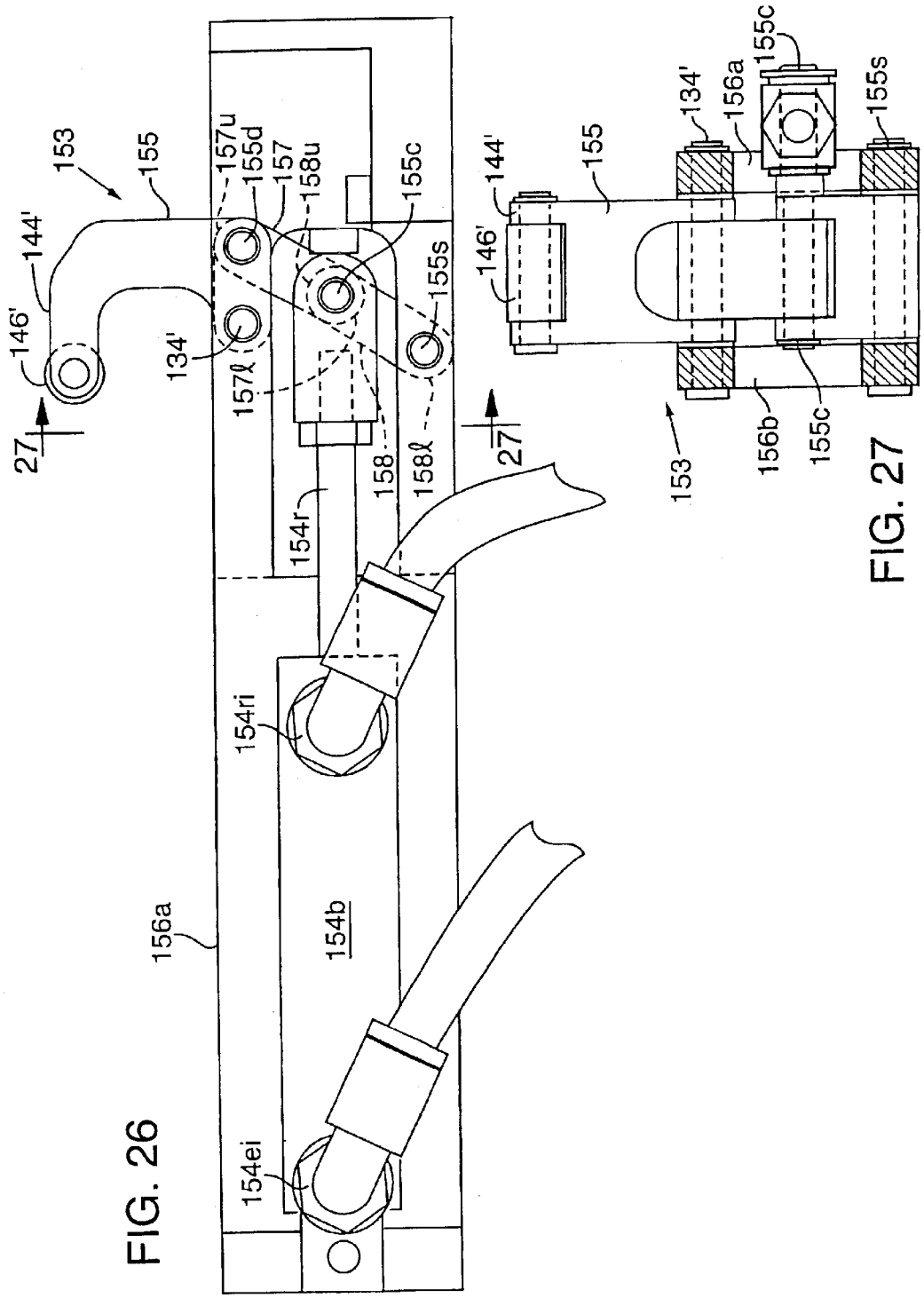

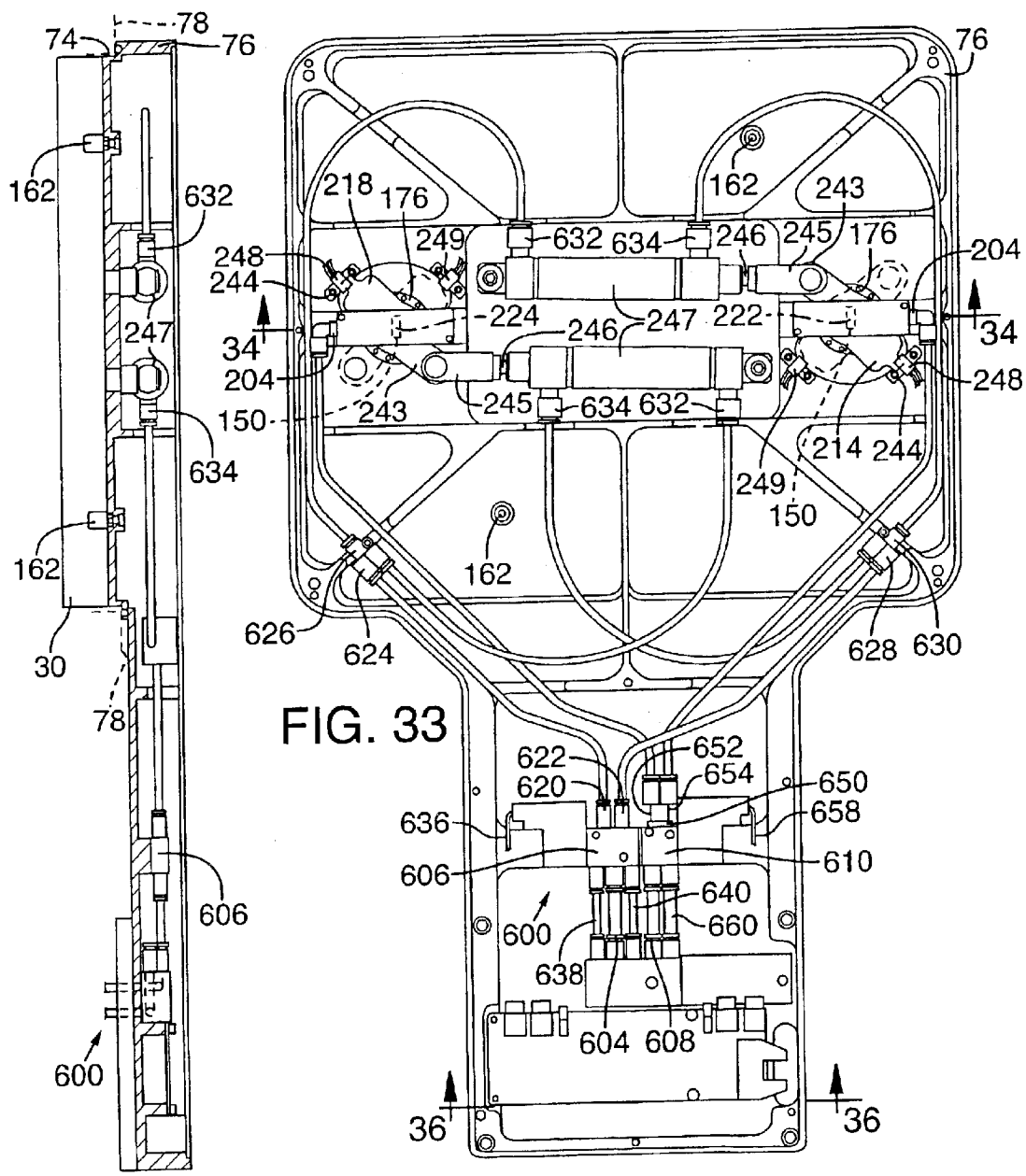

DETECTION OF MOTIVE FORCE APPLIED TO TRANSPORT BOX MOUNTED ON A FIMS SYSTEM

RELATED APPLICATIONS

This application is a division of application Ser. No. 09/612,757, filed Jul. 10, 2000, now U.S. Pat. No. 6,501,070, which is a continuation in part of application Ser. No. 09/352,155, filed Jul. 12, 1999, now U.S. Pat. No. 6,281,516, which claims the benefit of provisional Application No. 60/092,626, filed Jul. 13, 1998.

TECHNICAL FIELD

The present invention relates to front-opening interface mechanical standard (FIMS) system equipment and, in particular, to a FIMS transport box load interface that facilitates proper registration and accurate, secure positioning of a transport box as the specimens it contains are transferred between a minienvironment and a separate, enclosed specimen transport system.

BACKGROUND OF THE INVENTION

A system designed to incorporate FIMS permits handling of semiconductor wafers inside and outside of clean room facilities by interfacing a clean semiconductor wafer cassette transport box or pod to a clean environmental housing for semiconductor processing equipment or to other clean environments. The system concept entails mating a box door on a front-opening unified pod (FOUP) or cassette container box to a port door on an equipment enclosure and transferring the cassette into and out of the processing equipment without exposing to outside contamination the semiconductor wafers carried by the pod or wafer cassette.

A standard interface is required for cassette transport boxes intended to control the transport environment of cassettes containing semiconductor wafers. The standard interface addresses the proper transport box orientation for material transfer and maintains continuity between the transport box and semiconductor processing equipment environment to control particulate matter. The FIMS specifications are set out in the Semiconductor Equipment and Materials International (SEMI) standard SEMI E47-, E57-, E62-, and E63-0298 (1996–1998).

A FIMS system includes minimum volume, sealed front-opening boxes used for storing and transporting semiconductor wafer cassettes and canopies placed over wafer processing areas of semiconductor processing equipment so that the environments inside the boxes and canopies in cooperation with clean air sources become miniature clean spaces. The boxes are made of plastic materials having registration features located relative to one another within and of sizes characterized by relatively wide tolerances that can affect equipment alignment precision. What is needed is a box load interface implemented as part of a transfer mechanism for precise box alignment during loading and unloading of wafer cassettes from a sealed box without external environment contamination of the wafers carried by the wafer cassette.

SUMMARY OF THE INVENTION

The present invention is a box load interface implemented in a FIMS system. The box load interface comprises a retractable port door that is attachable to the box door of a transport box and that selectively moves the box door toward or away from the box cover of the transport box to thereby open or close it. A port plate has a front surface and a port plate aperture through which the box door can move as the port door moves the box door toward or away from the box cover. A slidable tray slidably mounted to a support shelf positioned transversely of the port plate receives the transport box in a predetermined orientation established by kinematic coupling surfaces located on the top surface of the slidable tray.

A slidable tray positioning mechanism selectively moves the slidable tray on the support shelf and thereby moves the transport box toward or away from the port plate. There are three preferred embodiments of a box hold down clamping mechanism mounted to the support shelf. The positioning mechanism is operatively connected to a first embodiment of the clamping mechanism to engage the clamping mechanism to a front clamping feature positioned on the bottom surface of the transport box and thereby apply an urging force to the box cover against the kinematic coupling surfaces while the slidable tray advances toward the port plate to push the front opening of the box cover against the front surface of the port plate. The positioning mechanism is operatively connected to the clamping mechanism also to disengage the clamping mechanism from the front clamping feature and thereby release the urging force from the box cover against the kinematic coupling surfaces while the slidable tray retracts from the port plate to pull the box cover away from the front surface of the port plate.

The box hold down clamping mechanism preferably includes a pivot finger pivotally mounted to the support shelf, and the slidable tray includes a push pin. The pivot finger has a recessed area that forms first and second angularly offset push pin contact surfaces that receive the push pin as the slidable tray moves the transport box toward the port plate and thereby rotates the pivot finger in a first rotational sense to engage the pivot finger to the front feature and moves the transport box away from the port plate and thereby rotates the pivot finger in a second rotational sense that is opposite to the first rotational sense to disengage the pivot finger from the front feature. The pivot finger includes a roller bearing that engages the front feature as the pivot finger rotates in the first rotational sense.

The positioning mechanism and each of second and third embodiments of the clamping mechanism are fixed with respect to each other so that a clamping mechanism operating under fluidic control engages and disengages from the front clamping feature in the absence of force applied by the sliding motion of the slidable tray.

The port plate includes a surface from which two compliant latch keys extend to mate with and operate the latch actuating coupler mechanism within its relatively wide alignment tolerance range, and a latching motor mechanism operatively connected to the compliant latch keys selectively rotates them between first and second angular positions. The latch keys are designed to "wobble" laterally to accommodate the tolerance range of the corresponding mating features on the box door and thereby ensure proper alignment to it. The first angular position secures the port door to and the second angular position releases the port door from the box door when the port and box doors are in matable connection.

An alternative embodiment of the two compliant latch keys includes a latch key pull back mechanism operating under fluidic control to securely hold the box door in alignment against the port door when the box and port doors are in matable connection. Maintaining the alignment established to fit the port door latch keys into the box door mating features ensures that there is no post-separation alignment shift between the box door and port door resulting from the loose tolerance range necessitating the wobbly latch key design.

The box load interface system also comprises a port door translation mechanism that is operatively connected to the port door to advance it in a forward direction toward the port plate aperture to attach the port door to the box door and then retract it and the attached box door in reverse direction away from the box cover and through the port plate aperture. A port door elevator assembly operates in cooperation with the port door translation mechanism to move the port door in a direction generally parallel to the front surface of the port plate after the box door has been moved away from the box cover and through the port plate aperture.

In a first embodiment, the port door translation mechanism and the port door elevator assembly are independent systems operating under coordinated control of separate motor drive assemblies. In a second embodiment, the port door translation mechanism and the port door elevator assembly are combined as a unitary mechanism. The unitary mechanism is implemented with a pivot link structure operating under control of a motor-driven lead screw mechanism to move the port door sequentially in transverse directions of movement that are the same as those accomplished by the translation mechanism and the elevator assembly of the first embodiment.

The transport box holds a container in which multiple wafer specimens are stored in spaced-apart, stacked arrangement. The container has an open front side from which the specimens are removed or into which the specimens are inserted. The box load interface comprises a differential optical scanning assembly for detecting positions of the wafer specimens. The scanning assembly scans the wafer specimens in a direction parallel to a facial datum plane, which is defined as a vertical plane that bisects the wafer specimens and is parallel to the open front side where the wafer specimens are removed or inserted. Scanning assembly includes two spaced-apart, pivotally mounted scanner fingers that are operable to center and push back dislodged specimens before determining their orientations in the cassette.

A robot assembly is supported by a linear traveling assembly between adjacent port plate apertures for removing and inserting wafer specimens from the transport box. The linear traveling assembly includes a nut mechanism contained within a housing secured to a carriage that supports the robot assembly. The carriage travels along a lead screw between the port plate apertures and is driven by the nut mechanism that includes a lead nut threadably engaged with the lead screw and rotated by a drive motor through a belt and pulley arrangement.

Additional objects and advantages of this invention will be apparent from the following detailed description of preferred embodiments thereof, which proceeds with reference to the accompanying drawings.

BRIEF DESCRIPTION OF THE DRAWINGS

FIGS. 3A–3G show various views of a front-opening wafer carrier box and its components and features.

FIG. 8 is an enlarged front elevation view of the box load interface with the sheet metal cover removed to show the elevator assembly.

FIG. 9 is a left side elevation view of the box load interface of FIG. 8.

FIG. 10 is an exploded view and FIGS. 11A, 11B, and 11C are respective side, front, and rear elevation views of the latch key assembly.

FIG. 26 is an enlarged side elevation view of the pneumatic actuating mechanism of the pivotable latch of FIG. 25 in its carrier box clamping position.

FIG. 27 is a sectional view taken along lines 27—27 of FIG. 26.

FIG. 33 is a rear elevation view of a fluidic pressure controlled latch key actuating mechanism.

FIG. 34 is a sectional view taken along lines 34—34 of FIG. 33.

FIG. 35 is a cross-sectional view of the port door of FIG. 33, showing certain pneumatic control components of the latch key actuating mechanism.

FIG. 36 is a sectional view taken along lines 36—36 of FIG. 33.

DETAILED DESCRIPTION OF PREFERRED EMBODIMENTS

Figure 1:
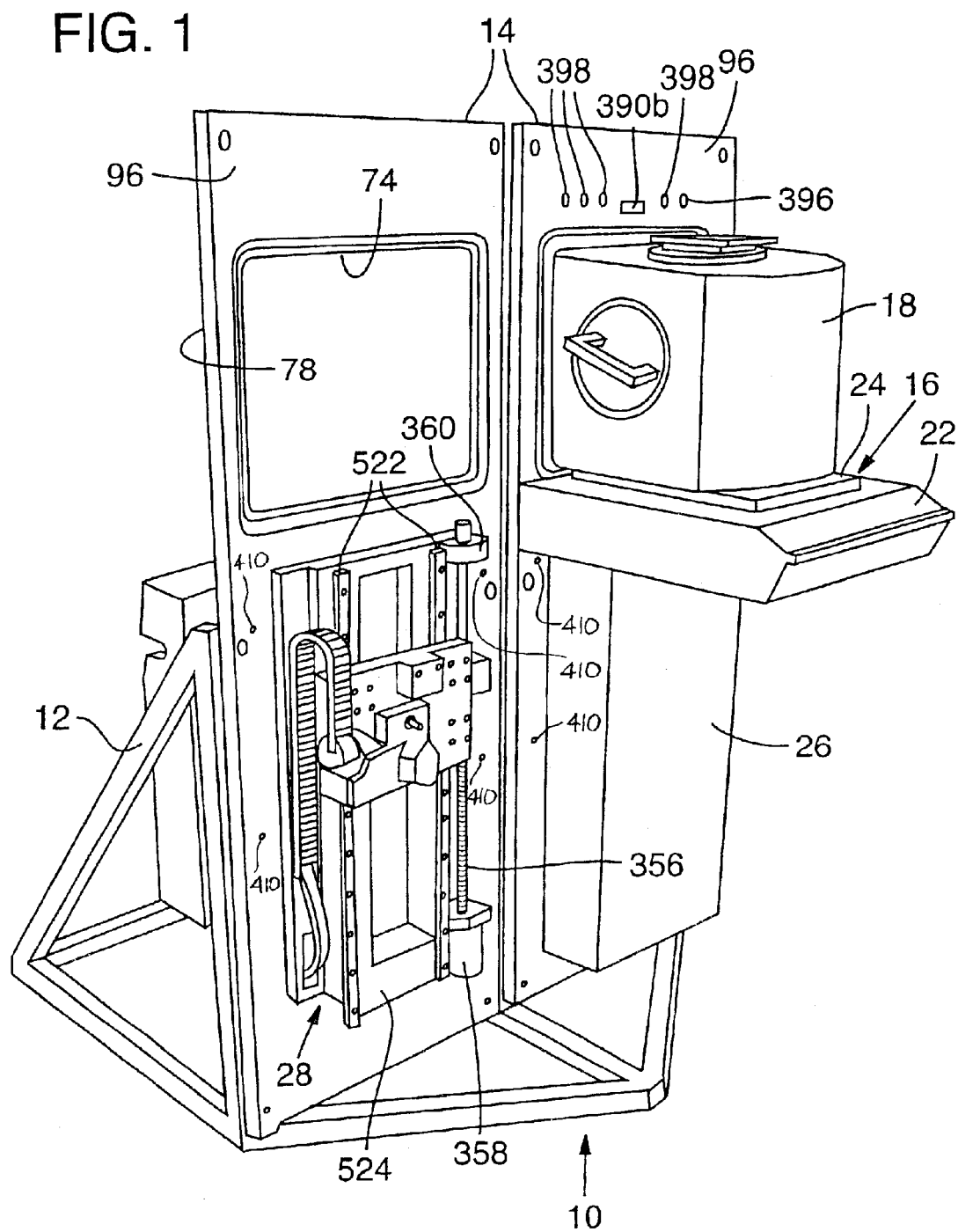
FIGS. 1 and 2 are respective front and rear perspective views of a wafer transport system in which a box load interface of the present invention for use in a FIMS system is implemented.
Figure 2:
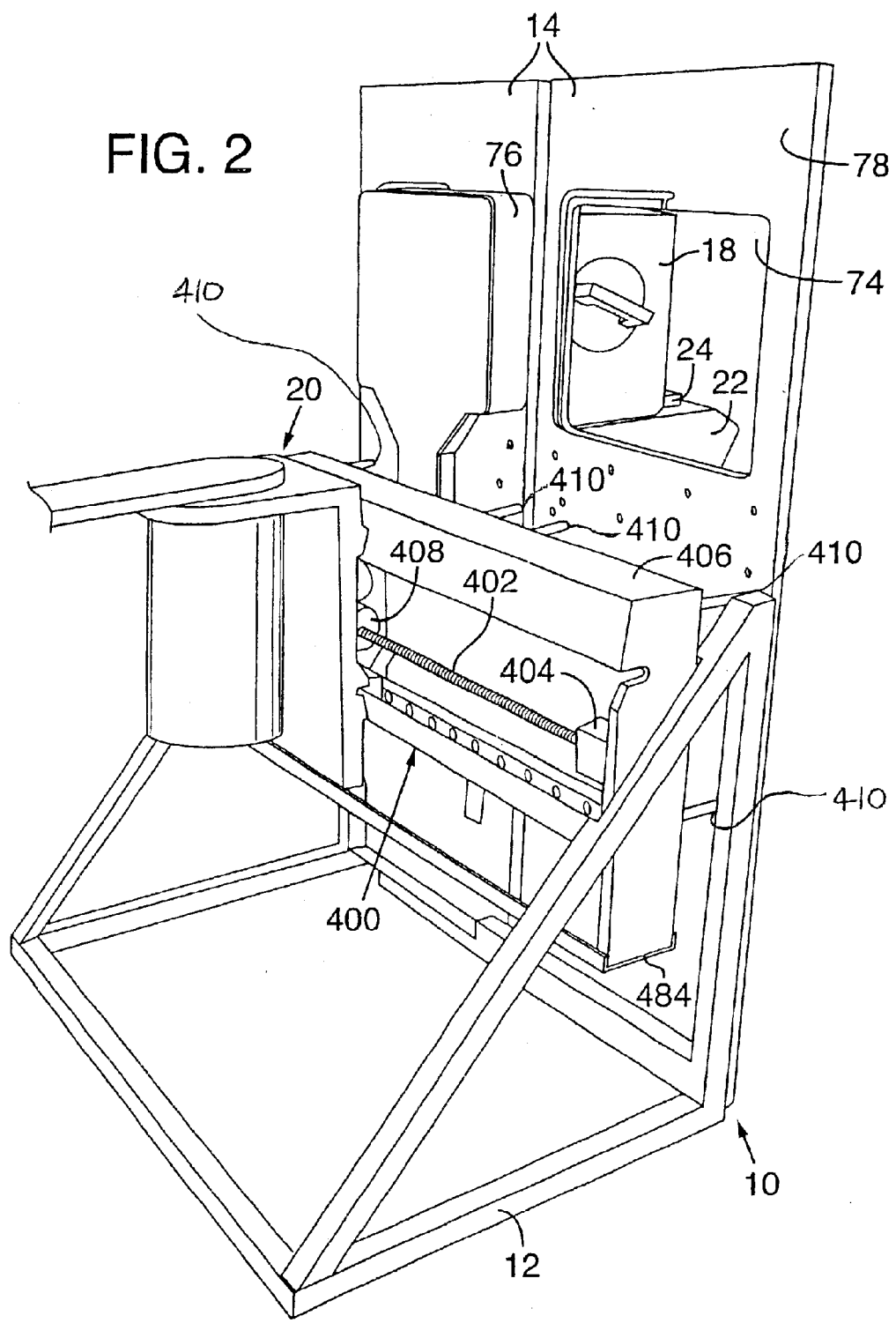

FIGS. 1 and 2 show a wafer transport system 10 that has an assembly frame 12 to which two front or port plates 14 are attached. Each front plate 14 supports one of two substantially identical box load interface systems 16 for front-opening semiconductor wafer carrier boxes 18 and a linear traveling robot assembly 20 positioned to access the wafers stored in carrier boxes 18 after they have been opened. A right side interface system 16 is shown with a shelf 22 having a slidable tray 24 supporting a carrier box 18; and a left side interface system 16 is shown partly disassembled without a carrier box 18, a shelf 22, and a sheet metal cover 26 to show the components of an elevator assembly 28.

FIGS. 3A–3G show various views of carrier box 18 and its components and features.

Figure 3A:
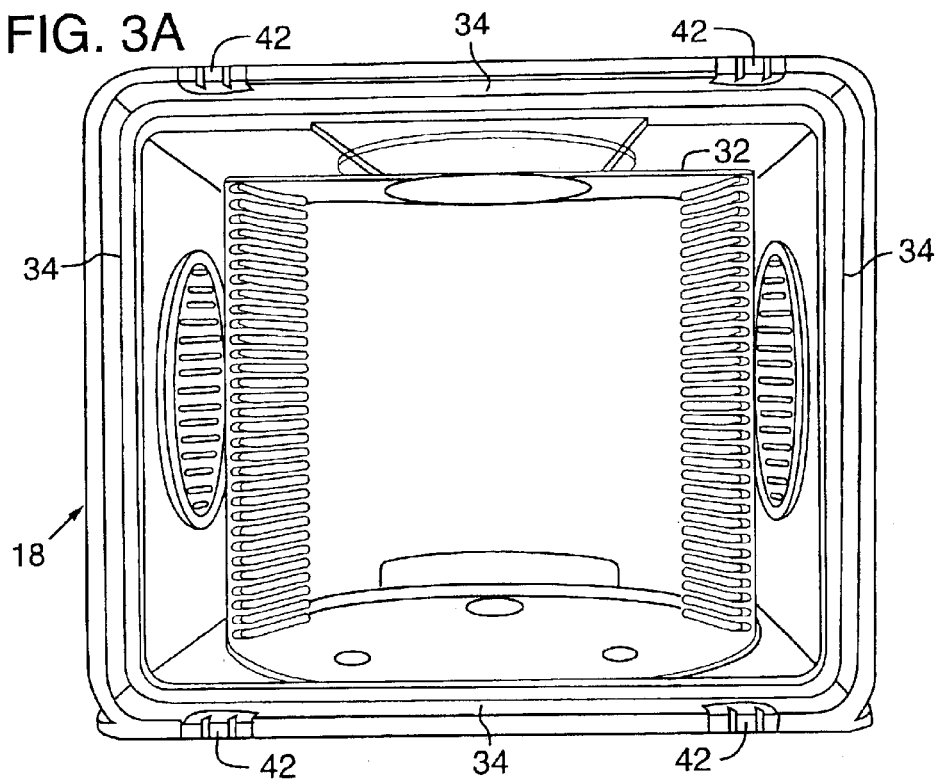

FIG. 3A shows carrier box 18 with its box door 30 removed to reveal in the interior of carrier box 18 a wafer cassette 32 with slots spaced apart to accommodate 300 mm diameter semiconductor wafers. Carrier box 18 has a recessed, stepped interior side margin 34 against which the perimeter of an interior surface 36 of box door 30 rests when carrier box 18 is closed.

Figure 3B:
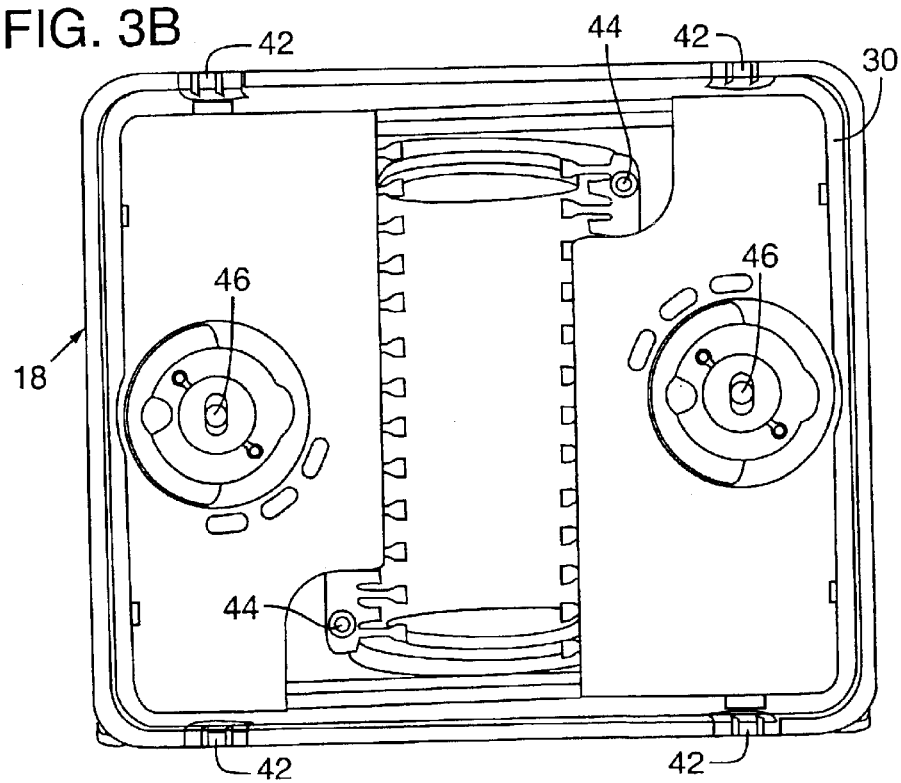
Figure 3C:
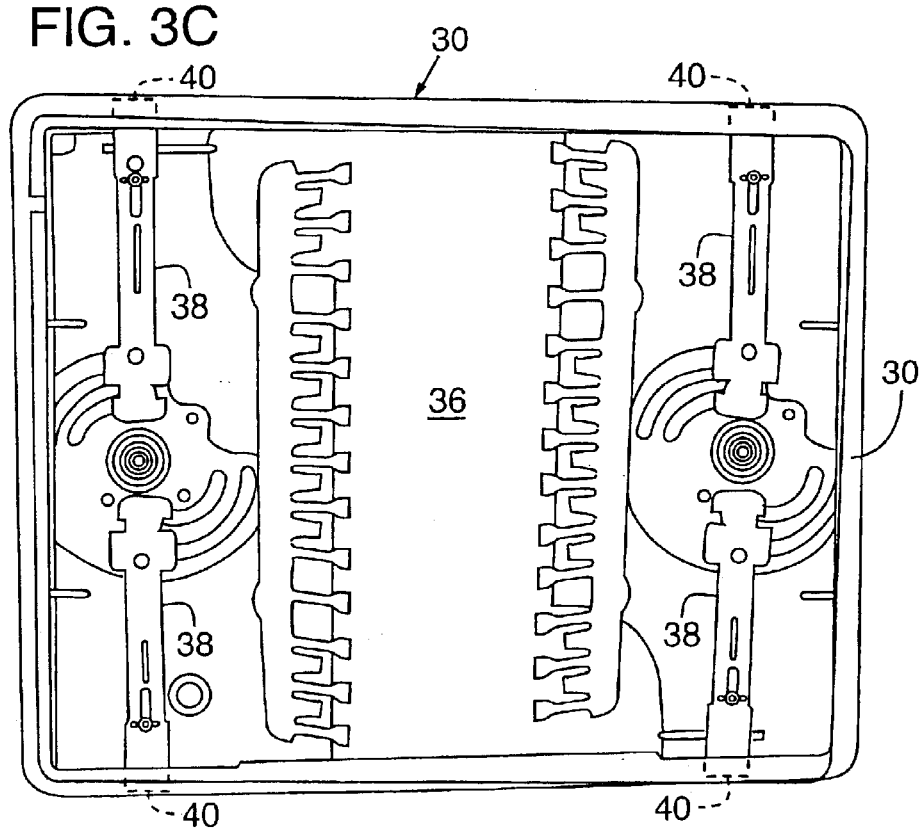
Figure 3D:
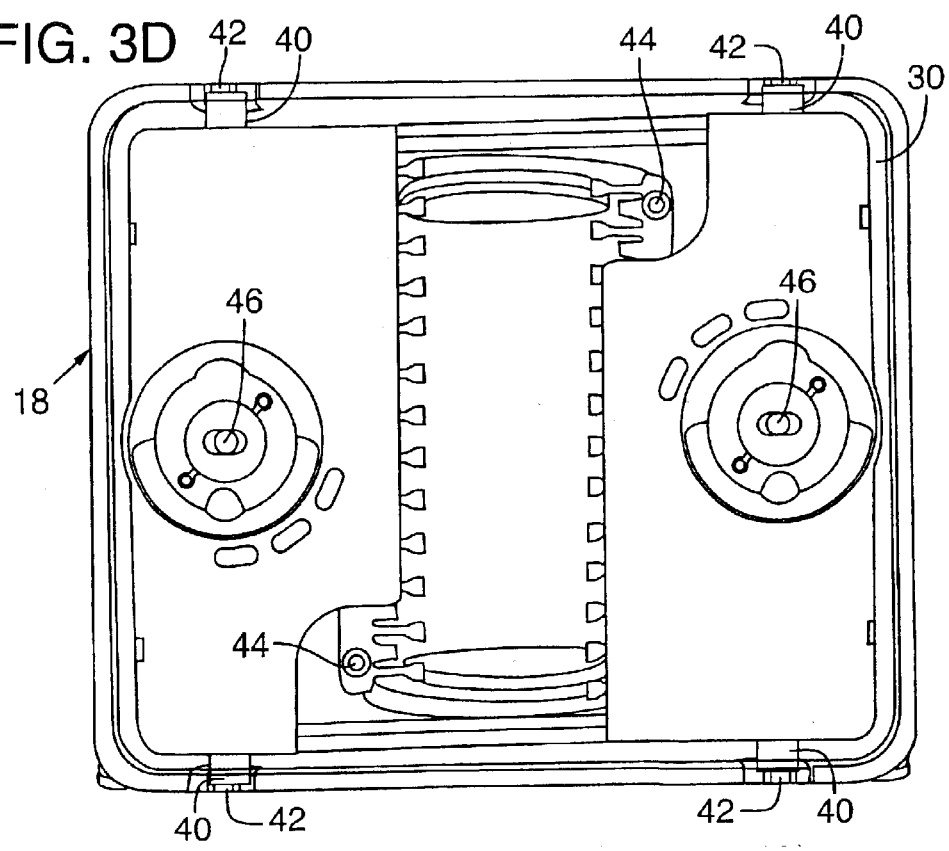

FIGS. 3B and 3C show, respectively, carrier box 18 closed with box door 30 unlocked and interior surface 36 of box door 30 in its unlocked condition; and FIGS. 3D and 3E show, respectively, carrier box 18 closed with box door 30 locked and interior surface 36 of box door 30 in its locked condition. FIG. 3C shows four locking slats 38 fully retracted so that their end tabs 40 remain inside the interior of box door 30, and FIG. 3E shows locking slats 38 fully extended so that their end tabs 40 extend outwardly of the top and bottom side margins of box door 30.

FIG. 3B shows end tabs 40 positioned outside of slots 42 located in the outermost portion of recessed side margin 34 when box door 30 is unlocked, and FIG. 3D shows end tabs 40 fitted into slots 42 when box door 30 is locked in place. FIGS. 3B and 3D also show two locator pin depressions 44 and two box lock actuating mechanism slots 46 required by the SEMI specification for a FIMS box door.

Figure 3F:
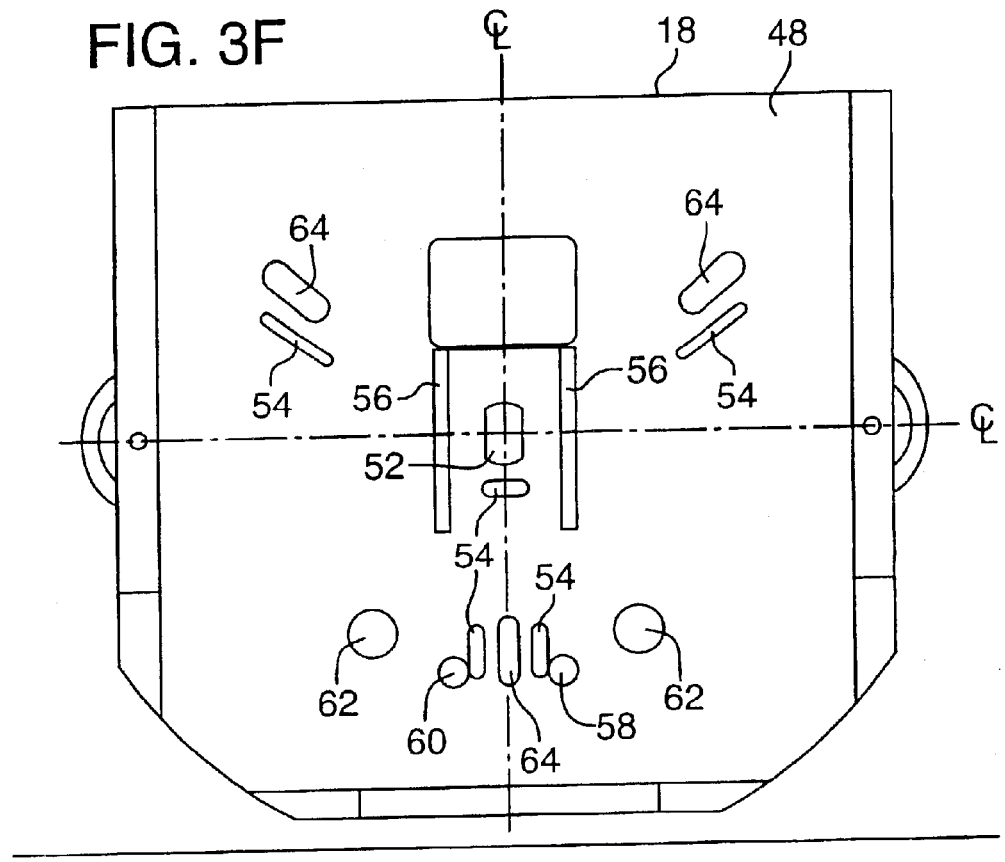
Figure 3G:
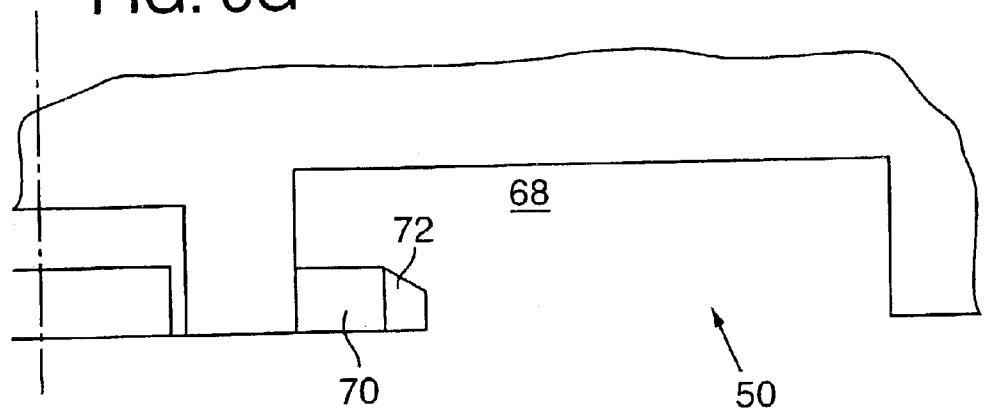
Figure 25:
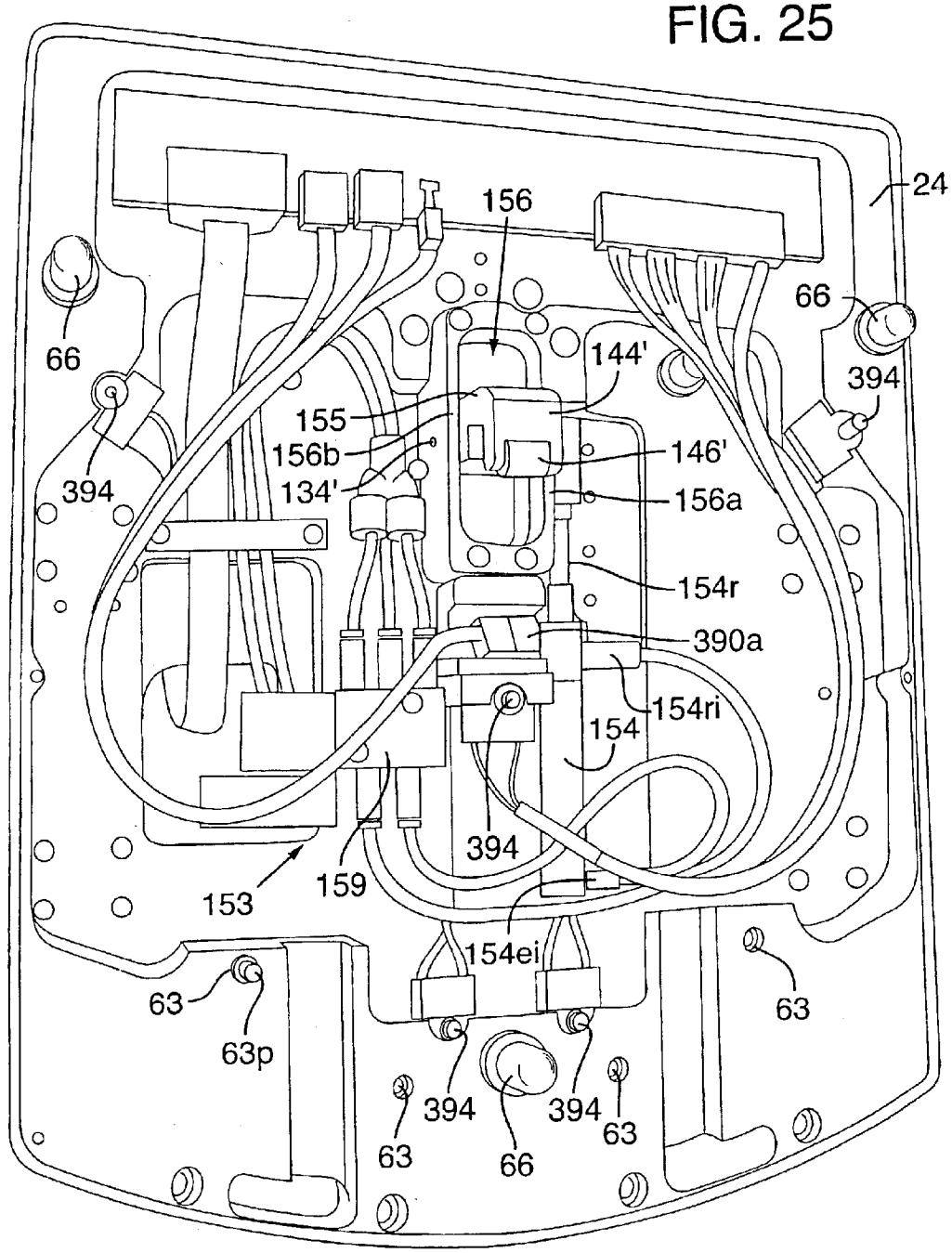
FIG. 25 is a top perspective view of a fluidic pressure controlled pivotable latch for securing a carrier box to the slidable tray.
Figure 29:
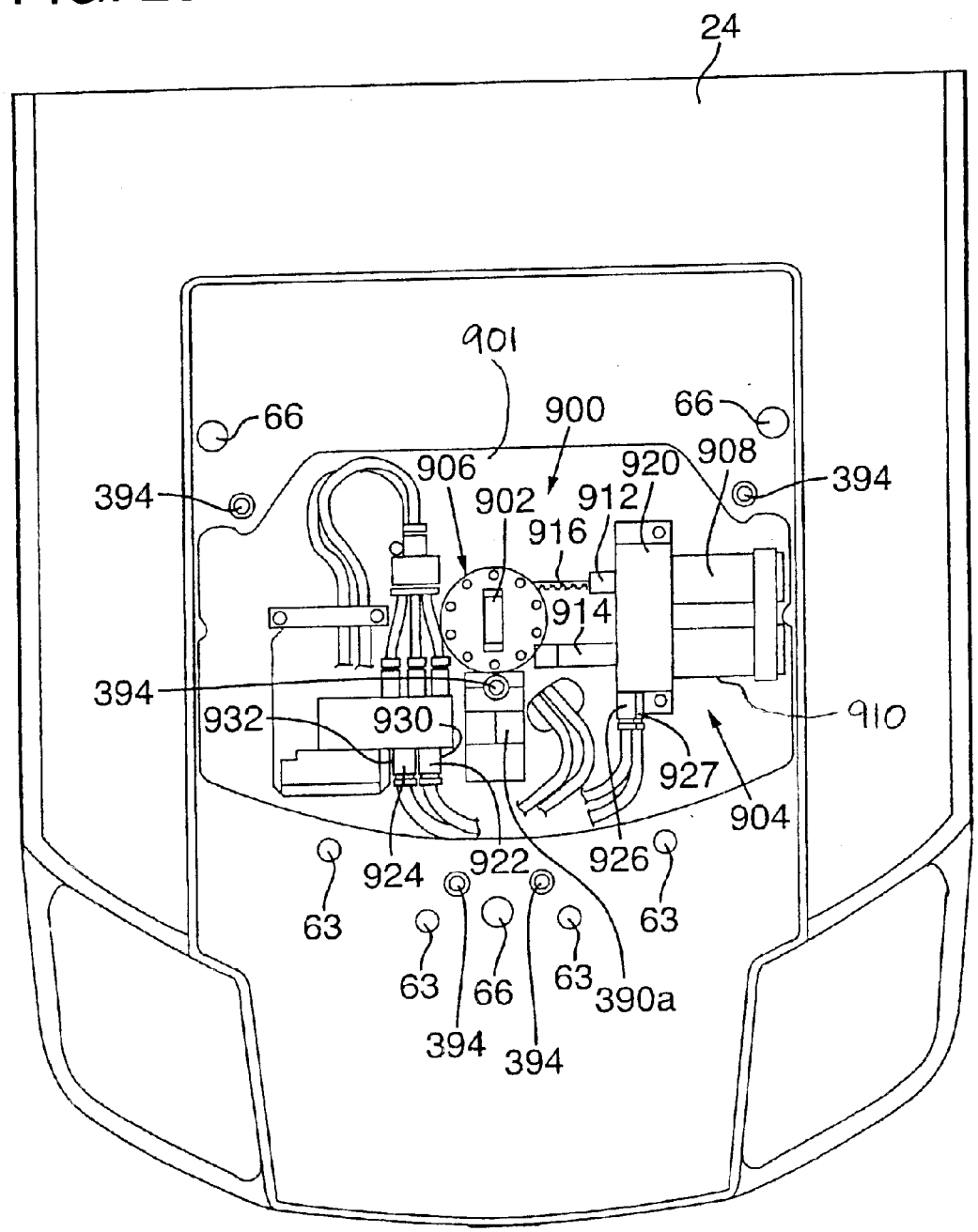
FIG. 29 is a top plan view of a fluidic pressure controlled carrier box bottom latch actuating mechanism.

FIGS. 3F and 3G show, respectively, a bottom surface 48 and a box front retaining or clamping feature 50 on bottom surface 48 of a front-opening carrier box 18. FIG. 3F also shows a center retaining feature 52, which is an alternative to box front retaining feature 50 for securing carrier box 18 in place on slidable tray 24. A preferred box 18 is a model F300 wafer carrier manufactured by Integris, Inc., Chaska, Minn. With reference to FIG. 3F, box 18 has on its bottom surface 48 five carrier sensing pads 54, two advancing box sensing pads 56, a carrier capacity (number of wafers) sensing pad 58, a box or cassette information pad 60, and one each of front end of line (FEOL) and back end of line BEOL information pads 62 required under SEMI E47.1 (Mar. 5, 1998). (FIGS. 25 and 29 show on slidable tray 24 four locations 63 corresponding to the locations of pads 58, 60, and 62 on bottom surface 48 of box 18. FIG. 25 shows a lockout pin 63p placed in the location 63 corresponding to one of the two tray information pads 62.) Three oblong, inwardly sloped depressions in bottom surface 48 form kinematic pin receiving features 64 that mate with kinematic coupling pins 66 (FIG. 4) fixed in corresponding locations on slidable tray 24 when box 18 is properly installed. Kinematic coupling pins 66 preferably have threaded stem portions that engage threaded holes in slidable tray 24 so that shims can be used as a height adjustment for kinematic coupling pins 66 and thereby facilitate proper alignment of box 18. When box 18 is placed in proper alignment on slidable tray 24, sensing pads 54 and 58 and information pads 60 and 62 contact switches mounted in corresponding positions on slidable tray 24 and advancing box sensing pads 56 contact switches mounted in corresponding positions on shelf 22.

With reference to FIGS. 3F and 3G, a depression 68 partly covered by a projection 70 having a beveled surface 72 forms front retaining or clamping feature 50. Beveled surface 72 provides a ramp along which a wheel or roller can roll up while tray 24 slides box 18 toward an aperture 74 in front plate 14 to mate with a port door 76 (FIGS. 4, 5, 8, 9, 12, and 13) secured to an interior surface 78 of front plate 14.

Figure 4:
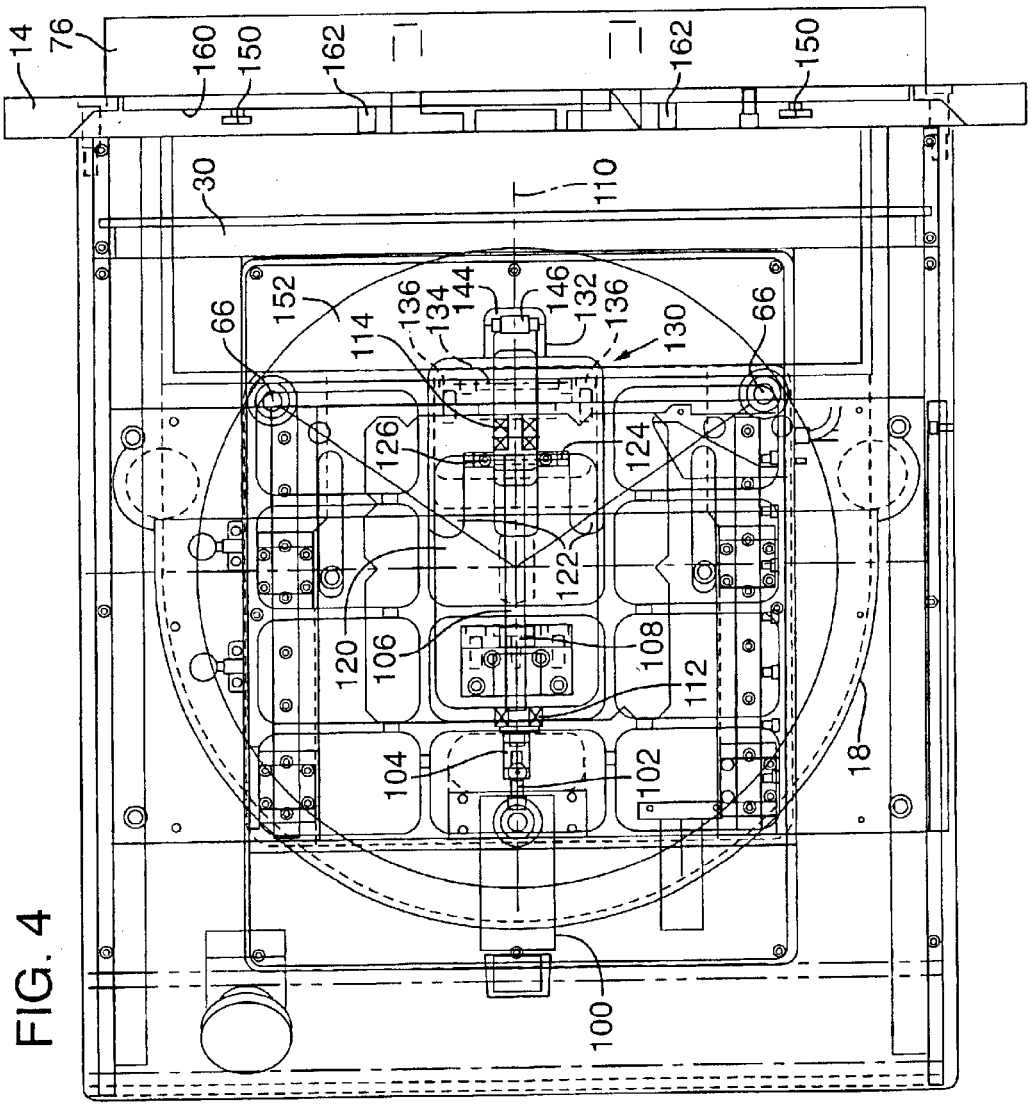
FIG. 4 is a plan view of a front-opening carrier box positioned on the slidable tray mounted to the interface system shelf with its top cover removed to show the slidable tray positioning mechanism components.
Figure 5:
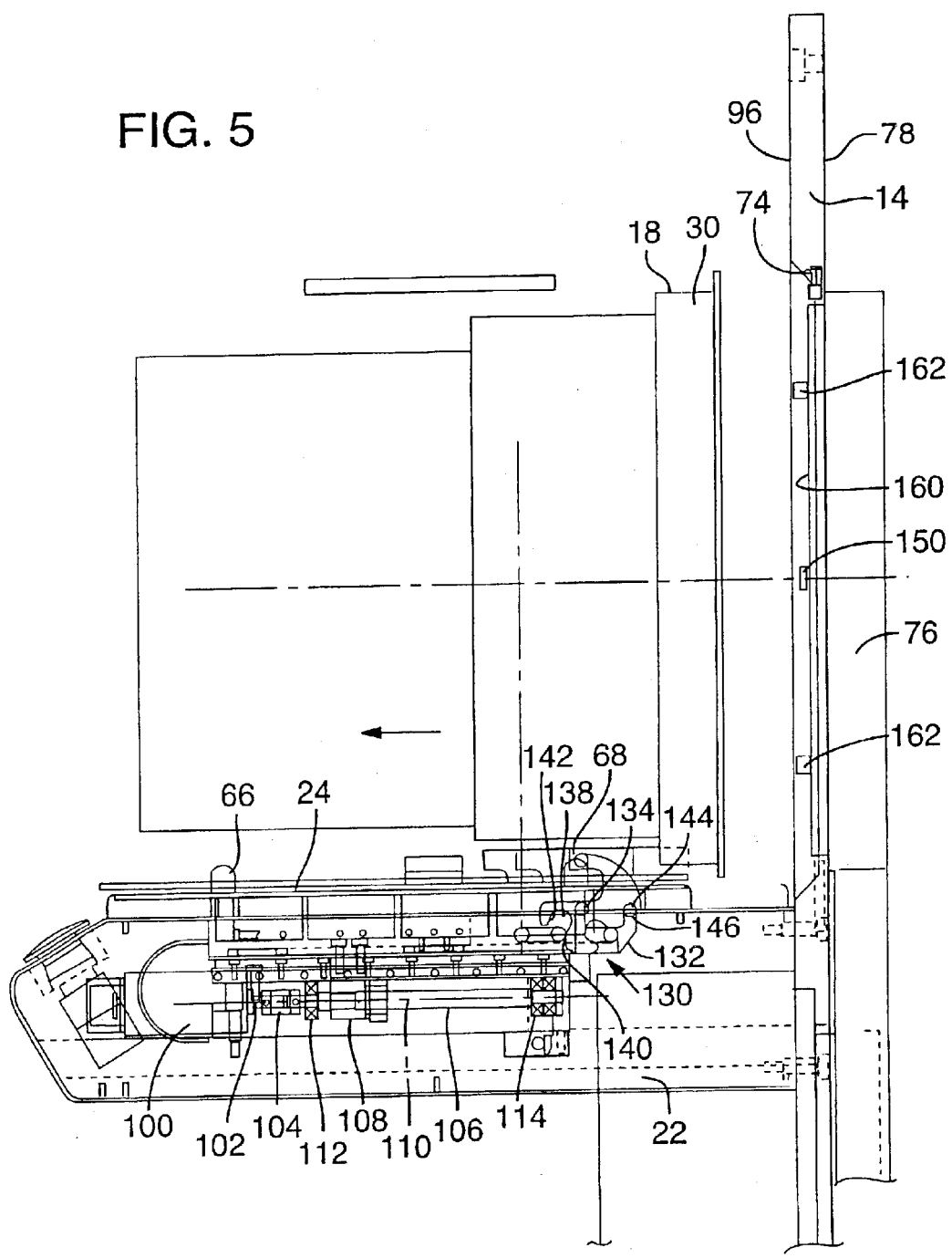
FIG. 5 is a side elevation view of the front-opening carrier box positioned on the interface system as shown in FIG. 4 but with the side cover of the interface system shelf removed.
Figure 6:
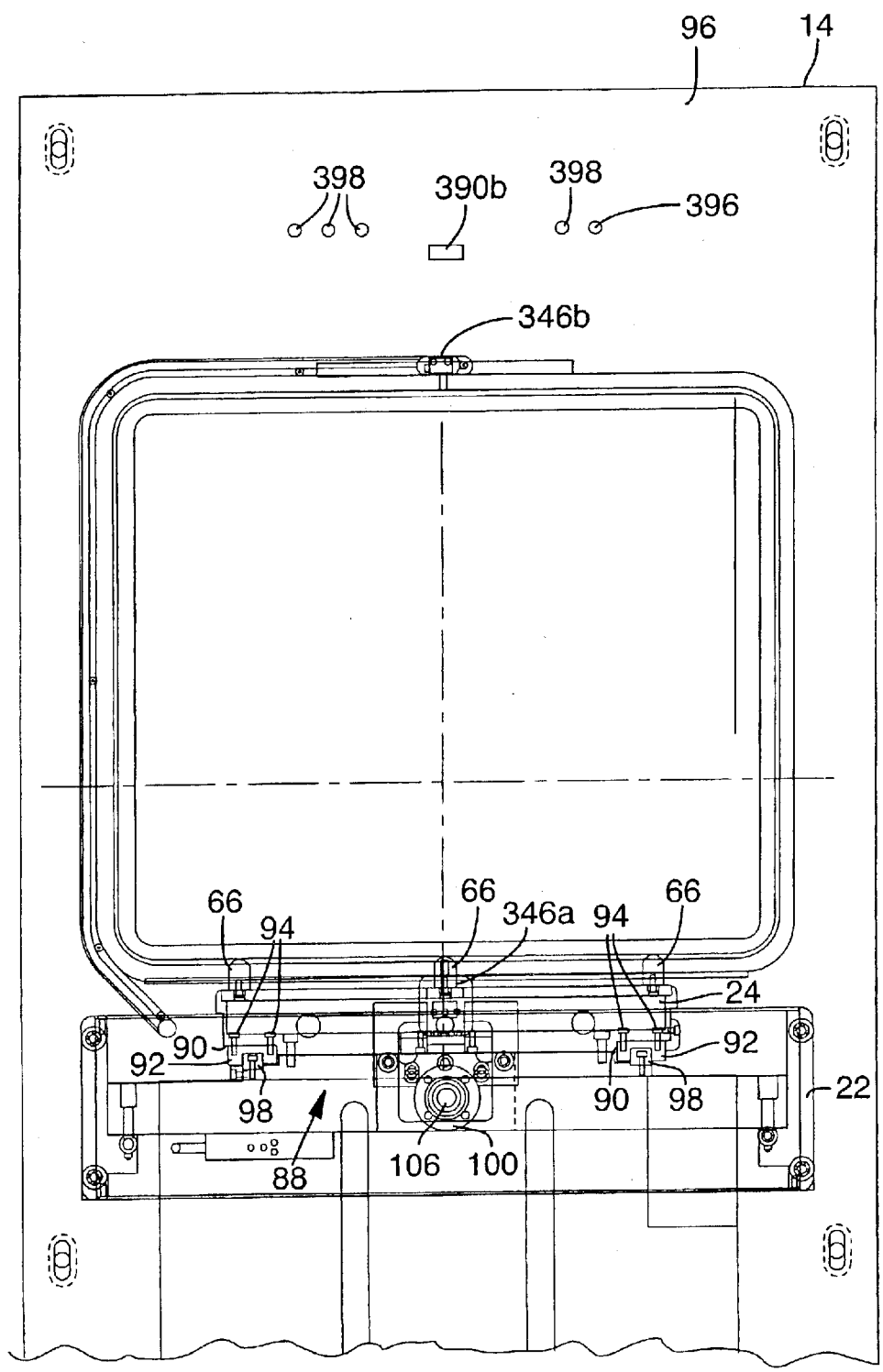
FIG. 6 is a front side elevation view of the slidable tray and shelf with the carrier box and front cover removed.
Figure 7A:
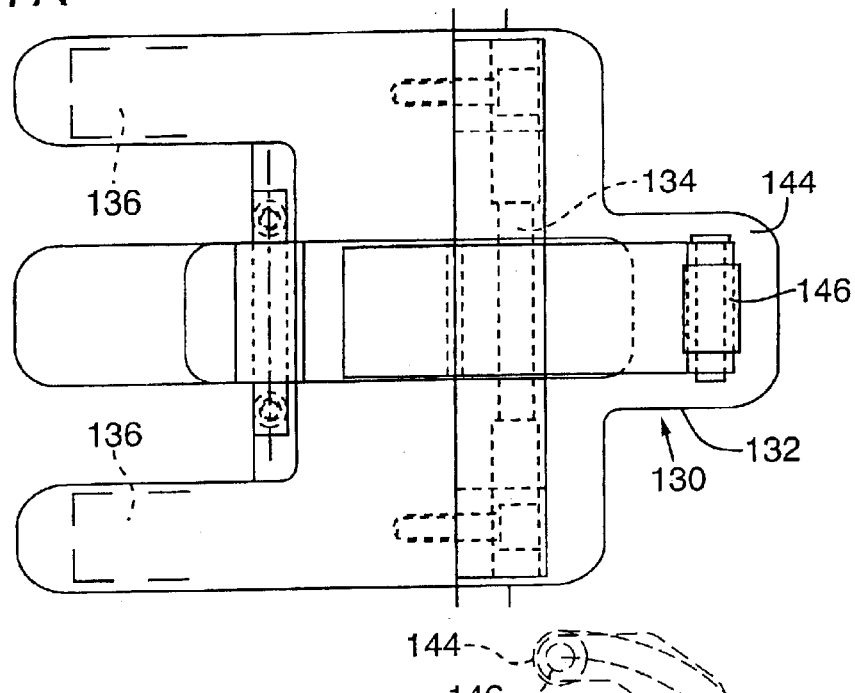
FIGS. 7A and 7B are plan and side elevation views of the carrier box clamping feature shown in FIGS. 4, 5, and 6.
Figure 7B:
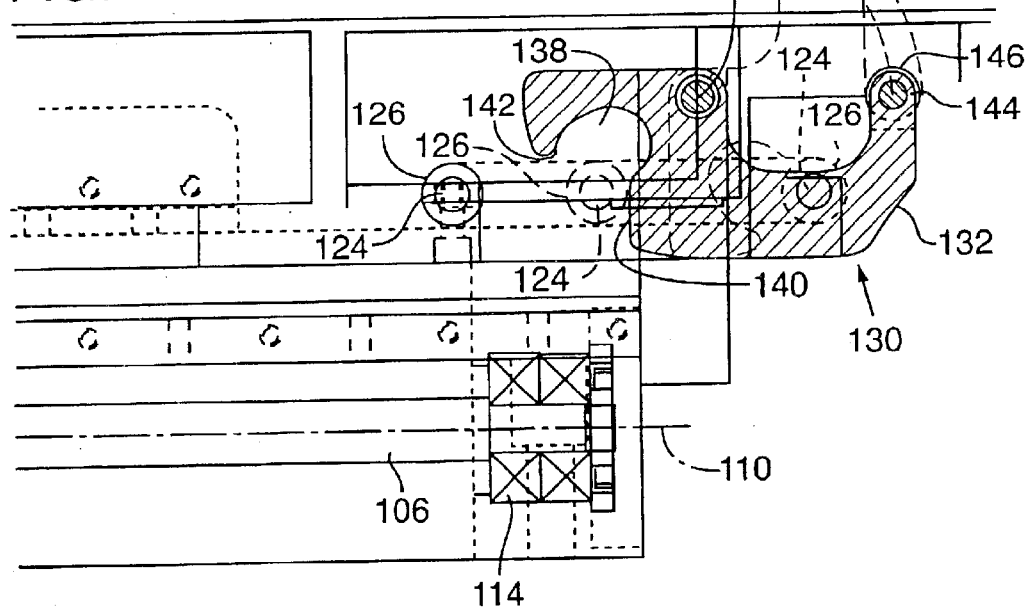

FIGS. 4, 5, 6, 7A, and 7B show carrier box 18 placed on slidable tray 24 with portions shown in phantom lines to indicate the operation of a slidable tray positioning mechanism 88. With particular reference to FIGS. 4 and 6, slidable tray 24 has a bottom surface 90 to which two U-shaped guide rails 92 are fixed by bolts 94. Guide rails 92 extend near the side margins of slidable tray 24 in a direction perpendicular to an exterior surface 96 of front plate 14. Two guide tracks 98 are bolted to shelf 22 in positions to receive guide rails 92 so that slidable tray 24 can move in a direction toward and away from exterior surface 96 of front plate 14 in response to the operation of tray positioning mechanism 88.

Tray positioning mechanism 88 is mounted to shelf 22 and includes a tray motor 100 from which a shaft 102 extends to a coupler 104 that operatively joins shaft 102 to rotate a lead screw 106 that passes through a nut assembly 108. Lead screw 106 has an axis 110 and is supported at a proximal end in a tail bearing 112 and at a distal end in a preloaded bearing 114. Nut assembly 108 is fixed to bottom surface 90 of slidable tray 24 to move it in a direction along lead screw axis 110.

Slidable tray 24 has in its bottom side an open region 120 into which two support members 122 extend in a direction parallel to tray bottom surface 90 to hold at their ends a push pin 124 carrying a cylindrical roller bearing 126. A first embodiment of a pivotable latch 130 includes a clamping finger 132 mounted to a pivot pin 134 supported between pivot mounting blocks 136 that extend upright from shelf 22 and through open region 120 of tray 24. Clamping finger 132 has a recessed area 138 that forms a first contact surface 140 and a second contact surface 142 that are angularly offset from each other and a hooked end 144 to which a cylindrical roller bearing 146 is mounted. Push pin 124 is set in a position to contact first and second contact surfaces 140 and 142 as slidable tray 24 moves in response to the operation of tray positioning mechanism 88 so as to, respectively, engage clamping feature 50 with and disengage clamping feature 50 from hooked end 144 of clamping finger 132 in accordance with the following operational sequence.

Whenever carrier box 18 is to be positioned against front plate 14 to mate box door 30 with port door 76, tray motor 100 rotates lead screw 106 in a first lead screw rotational sense to advance nut assembly 108 and thereby translate slidable tray 24 along shelf 22 in a direction toward front plate 14. This movement of slidable tray 24 causes roller bearing 126 to contact first contact surface 140 and as a consequence cause clamping finger 132 to rotate about pivot pin 134. As slidable tray 24 continues to advance toward front plate 14, clamping finger 132 continuously rotates in a first clamping finger rotational sense so that hooked end 144 rolls up beveled surface 72 and fits within box clamping feature 50 and so that roller bearing 126 fits within recessed area 138. The distances separating roller bearing 126, pivot pin 134, and front plate 14 are set so that box door 30 mates with port door 76, and a front side margin 148 (FIG. 3A) of carrier box 18 is in a sealing relationship with exterior surface 96 of front plate 14 when hooked end 144 fully engages clamping feature 50. Full engagement of clamping feature 50 urges carrier box 18 against kinematic coupling pins 66 so that it is not dislodged when latch keys 150 extending from port door 76 unlock and remove box door 30.

Whenever carrier box 18 is to be retracted from front plate 14 after box door 30 has separated from port door 76 and sealed carrier box 18, tray motor 100 rotates lead screw 106 in a second lead screw rotational sense that is opposite to the first lead screw rotational sense to retract nut assembly 108 and thereby translate slidable tray 24 along shelf 22 in a direction away from front plate 14. This movement of slidable tray 24 causes roller bearing 126 to roll out of recessed area 138 and contact second contact surface 142 and as a consequence cause clamping finger 132 to rotate about pivot pin 134. As slidable tray 24 continues to retract from front plate 14, clamping finger 132 continually rotates in a second clamping finger rotational sense that is opposite to the first clamping finger rotational sense so that its hooked end 144 rolls down beveled surface 72 and separates from box clamping feature 50. Full disengagement of clamping feature 50 releases the urging force applied to carrier box 18 against kinematic coupling pins 66 so that carrier box 18 and its contents (one semiconductor wafer 152 shown in FIG. 4) can be removed from slidable tray 24.

A second embodiment of a pivotable latch 153 is shown in FIGS. 25–28. Unlike pivotable latch 130, pivotable latch 153 is supported on slidable tray 24 (instead of shelf 22) and is actuated by a pneumatic cylinder 154, instead of by push pin 124 as slidable tray 24 slides along guide rails 92.

Figure 28:
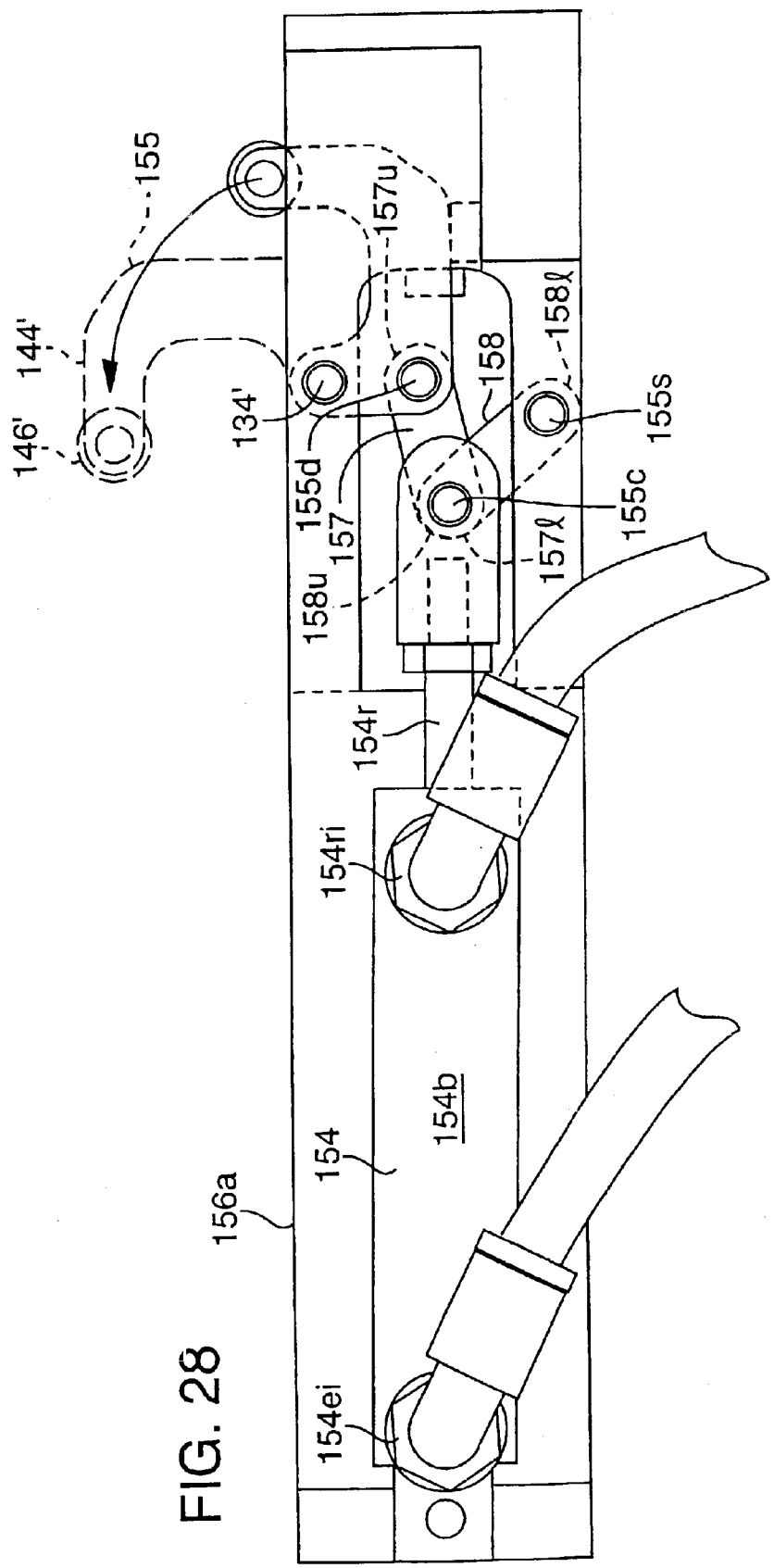
FIG. 28 is an enlarged side elevation view of the pneumatic actuating mechanism of the pivotable latch of FIG. 25 in a carrier box nonclamping, retracted position.

With particular reference to FIGS. 25 and 27, pivotable latch 153 includes a clamping finger 155 mounted to a pivot pin 134' fixed between sidewalls 156a and 156b of a rectangular, open interior mounting block 156 extending upright from slidable tray 24. Clamping finger 155 is of similar construction to that of clamping finger 132, except for the omission of recessed area 138. Components of clamping finger 155 corresponding to those of clamping finger 132 are identified by the same reference numerals followed by primes. Clamping finger 155 has a hooked end 144' to which a cylindrical roller bearing 146' is mounted and a drive pivot pin 155d offset from pivot pin 134' and projecting from one side of clamping finger 155. Clamping finger 155 pivotally moves within the interior space of mounting block 156 so that hooked end 144' projects upwardly outside of and recedes within the interior space bounded by the top surfaces of sidewalls 156a and 156b when hooked end 144', respectively, engages and disengages box clamping feature 50. FIG. 28 shows clamping finger 155 in its fully upward position (in phantom lines) and in a downward position (in solid lines).

With particular reference to FIGS. 26 and 28, pivotable latch 153 includes a first or top drive link 157 and a second or bottom drive link 158. Top drive link 157 has an upper end 157u pivotally connected to drive pivot pin 155d, and bottom drive link 158 has a lower end 158l pivotally connected to a stationary pivot pin 155s fixed inside sidewall 156b. A lower end 157l and an upper end 158u of the respective top and bottom drive links 157 and 158 are pivotally connected to a common pivot pin 155c fixed in a distal end of an extensible rod 154r of pneumatic cylinder 154. Pneumatic cylinder 154 has a body portion 154b into and out from which extensible rod 154r moves and which is fixed to slidable tray 24. Drive pivot pin 155d and common pivot pin 155c move between their respective positions shown in FIGS. 26 and 28 as extensible rod 154r moves between its fully extended and fully retracted positions. Pneumatic cylinder body portion 154b includes a cylinder rod extension gas inlet 154ei and a cylinder rod retraction inlet 154ri to which gas conduits selectively deliver pressurized gas delivered by a switchable gas flow valve to, respectively, engage clamping feature 50 with and disengage clamping feature 50 from hooked end 144' of clamping finger 155 in accordance with the following operational sequence.

Whenever carrier box 18 is to be positioned against front plate 14 to mate box door 30 with port door 76, a user by means of software control actuates a solenoid valve 159, which in response delivers pressurized gas to cylinder rod extension inlet 154ei and, as a consequence, causes clamping finger 155 to rotate about pivot pin 134'. As extensible rod 154r increases its length of extension from body portion 154b, clamping finger 155 continuously rotates in a first clamping finger rotational sense (counterclockwise) so that hooked end 144' rolls up beveled surface 72 and fits within clamping feature 50 so that top link 157 and bottom link 158 form between themselves an obtuse included angle that causes an over-center alignment that ensures positive locking action in the clamped position (FIG. 26). The distances separating common pivot pin 155c in full extension of extensible rod 154r, pivot pin 134', and front plate 14 are set so that box door 30 mates with port door 76, and front side margin 148 (FIG. 3A) of carrier box 18 is in a sealing relationship with exterior surface 96 of front plate 14 when hooked end 144' fully engages clamping feature 50. Full engagement of clamping feature 50 urges carrier box 18 against kinematic coupling pins 66 so that it is not dislodged when latch keys 150 extending from port door 76 unlock and remove box door 30. Tray motor 100 then rotates lead screw 106 in a first lead screw rotational sense to advance nut assembly 108 and thereby translate slidable tray 24 along shelf 22 in a direction toward front plate 14.

Whenever carrier box 18 is to be retracted from front plate 14 after box door 30 has separated from port door 76 and sealed carrier box 18, tray motor 100 rotates lead screw 106 in a second lead screw rotational sense that is opposite to the first lead screw rotational sense to retract nut assembly 108 and thereby translate slidable tray 24 along shelf 22 in a direction away from front plate 14. After carrier box 18 reaches its fully retracted position, the user again by means of software control actuates solenoid valve 159, which in response delivers pressurized gas to cylinder rod retraction inlet 154ri and, as a consequence, causes clamping finger 155 to rotate about pivot pin 134'. As extensible rod 154r decreases its length of extension from body portion 154b, clamping finger 155 continually rotates in a second clamping finger rotational sense that is opposite to (clockwise) the first clamping finger rotational sense so that its hooked end 144' rolls down beveled surface 72 and separates from box clamping feature 50. Full disengagement of clamping feature 50 releases the urging force applied to carrier box 18 against kinematic coupling pins 66 so that carrier box 18 and its contents (one semiconductor wafer 152 shown in FIG. 4) can be removed from slidable tray 24.

Figure 30:
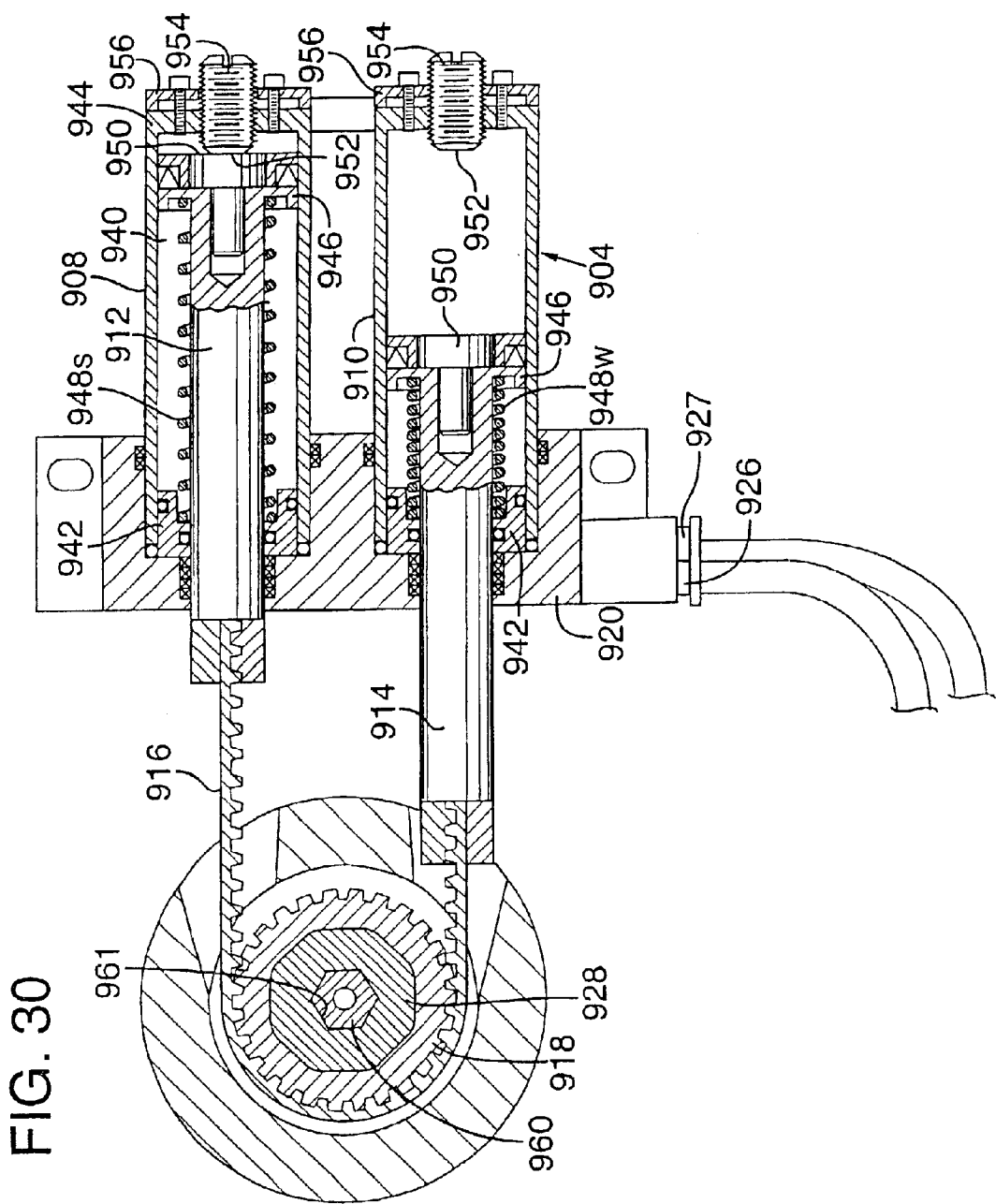
FIG. 30 is a cross-sectional view of a latch key rotation mechanism of the bottom latch actuating mechanism of FIG. 29.
Figure 31:
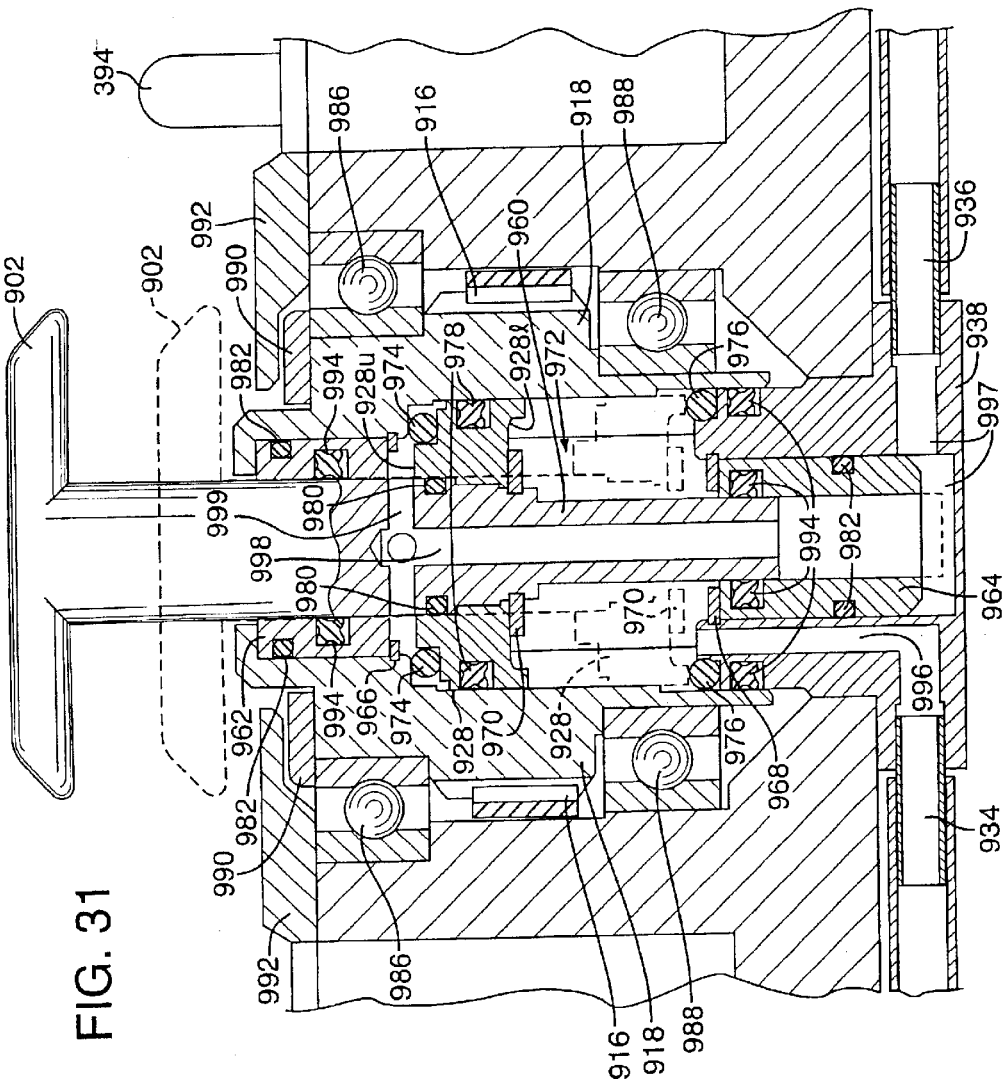
FIG. 31 is an enlarged cross-sectional view of a latch key raise/lower mechanism of the bottom latch actuating mechanism of FIG. 29.

A third embodiment of a fluidic pressure controlled bottom latch actuating mechanism 900 is shown in FIGS. 29, 30, and 31. Bottom latch actuating mechanism 900 rotates a bottom latch key 902 between first and second angular positions to latch and unlatch center retaining feature 52 (FIG. 3F) of carrier box 18 and thereby hold down carrier box 18 against and release carrier box 18 from slidable tray 24. Center retaining feature 52 formed in carrier box bottom surface 48 includes a recessed area covered by a top piece having a slot opening of sufficient size to receive a latch key inserted in one angular position and to retain the inserted latch key in another angular position. Like pivotable latch 153, bottom latch actuating mechanism 900 is supported on slidable tray 24; but unlike pivotable latch 153, bottom latch actuating mechanism 900 does not include a pivotable latch having a clamping finger that engages box clamping feature 50. As shown in FIG. 29, bottom latch actuating mechanism 900 fits within a recessed area on an interior bottom surface 901 of slidable tray 24. Bottom latch actuating mechanism 900 includes a latch key rotation mechanism 904 and a latch key raise/lower mechanism 906.

Latch key rotation mechanism 904 is comprised of two pneumatic cylinders 908 and 910 having respective extensible rods 912 and 914 that are connected to different free ends of a timing belt 916. Timing belt 916 engages a timing pulley 918 to which latch key 902 is attached. Pneumatic cylinders 908 and 910 are contained by a common housing 920, which is fixed to slidable tray 24 by bolts or other fasteners. Solenoid valves 922 and 924 deliver pressurized gas to gas inlet ports 926 and 927 of the respective pneumatic cylinders 908 and 910 to operate them in push-pull fashion to rotate timing pulley 918 and thereby turn latch key 902 between the first and second angular positions, which are preferably angularly displaced by 90 degrees. FIG. 29 shows latch key 902 in its open (unlatched) position.

Latch key raise/lower mechanism 906 is comprised of a pneumatic polygonal piston 928, the outer surface of which is preferably of octagonal shape that mates with complementary inner surface features of timing pulley 918, as shown in FIG. 30. Solenoid valves 930 and 932 (positioned beneath the respective solenoid valves 922 and 924 in FIG. 29) deliver pressurized gas to respective gas inlet/outlet ports 934 and 936 mounted to an inlet housing 938 to selectively raise and lower polygonal piston 928 and thereby raise and lower latch key 902. A central control system 349 coordinates the operation of solenoid valves 922, 924, 930, and 932 to turn latch key 902 between the first (latched) and second (unlatched) angular positions when latch key 902 is present within center retaining feature 52 and turn latch key 902 to its second (unlatched) angular position to insert latch key 902 into or remove latch key 902 from center retaining feature 52. Latch key 902 in its lower position is set sufficiently low to provide clearance to accommodate an approximately 10 mm side-to-side misalignment tolerance for carrier box. 18 during its initial positioning on slidable tray 24.

FIG. 30 is a cross-sectional view of latch key rotation mechanism 904. With reference to FIG. 30, pneumatic cylinders 908 and 910 are (with one exception noted below) of the same structural design; therefore, the following description of their components and construction is directed only to pneumatic cylinder 908. Pneumatic cylinder 908 includes an interior chamber 940 that is enclosed by a bushing 942 at one end and an end cap 944 at the other end. A piston 946 pushes against an interior end of extensible rod 912, and a free end of extensible rod 912 extends through bushing 942 and outside of interior chamber 940 by a length of extension determined by the position of piston 946 in interior chamber 940. A return coil spring 948s having a relatively large spring constant and positioned between bushing 942 and piston 946 of pneumatic cylinder 908 biases extensible rod 912 to retract into interior chamber 940 in the absence of pressurized gas. A return coil spring 948w having a relatively weak spring constant and positioned between bushing 942 and piston 946 of pneumatic cylinder 910 takes up the slack in timing belt 916 when extensible rod 912 of pneumatic cylinder 908 is in its fully retracted position to unlatch latch key 902 from center retaining feature 52 in the absence of pressurized gas. A bumper 950 fitted within a recess in piston 946 rests against an end 952 of an adjustment screw 954 secured against end cap 944 by a locking plate 956. Adjustment screw 954 sets the minimum length of extension of the free end of extensible rod 912 in response to the force applied to piston 946 by return coil spring 948s.

FIG. 31 is a cross-sectional view of latch key raise/lower mechanism 906 showing bottom latch key 902 in its raised position (solid lines) and lowered position (phantom lines). With reference to FIG. 31, latch key 902 includes a shaft 960 supported within a central opening 961 partly of octagonal shape and extending along the length of polygonal piston 928 by an upper bushing 962 and a lower bushing 964 held in place by respective retainer rings 966 and 968. Shaft 960 is secured to polygonal piston 928 by a retainer ring 970. Polygonal piston 928 moves in the direction of the length of shaft 960 in a cavity 972 formed within central opening 961 between circular end-of-travel cushions 974 and 976 positioned against the interior faces of the respective retainer rings 966 and 968. Pressurized gas introduced by way of gas inlet/outlet ports 934 and 936 into cavity 972 moves polygonal piston 928 in the manner described below.

A seal 978 fitted within a recess in the outer surface of polygonal piston 928 and a seal 980 positioned between shaft 960 and polygonal piston 928 ensure gas tight separation of the regions in cavity 972 on either an upper face 928u or a lower face 928l of polygonal piston 928. Seals 982 positioned between timing pulley 918 and upper bushing 962 and between gas inlet housing 938 and lower bushing 964 ensure that cavity 972 remains gas tight.

With reference to FIGS. 29, 30, and 31, latch key rotation mechanism 904 rotates latch key 902 between the first (latched) and second (unlatched) angular positions by alternate delivery of pressurized gas to gas inlet ports 926 and 927 of pneumatic cylinders 908 and 910. Extensible rods 912 and 914 alternately extend from and retract into the respective pneumatic cylinders 908 and 910 in response to the delivery of pressurized gas and thereby impart reciprocating motion to timing belt 916. Timing pulley 918, which is journaled for rotation in an upper bearing assembly 986 and a lower bearing assembly 988 that are fixed in slidable tray 24, rotates back and forth between the first and second angular positions in response to the reciprocating motion of timing belt 916. Lower bearing assembly 988 is positioned closer than upper bearing assembly 986 to shaft 960 to provide clearance for timing belt 916. An inner clamp 990 and an outer clamp 992 hold upper bearing assembly 986 within slidable tray 24 and thereby contain within slidable tray 24 the movable components associated with latch key 902. A rotary seal 994 positioned between shaft 960 and upper bushing 962 forms a gas tight seal for the top end of cavity 972. Rotary seals 994 positioned between shaft 960 and lower bushing 964 and between inlet housing 938 and timing pulley 918 form a gas tight seal for the bottom end of cavity 972.

With reference to FIG. 31, latch key raise/lower mechanism 906 moves latch key 902 up and down by alternate delivery of pressurized gas to either upper face 928u or lower face 928l of polygonal piston 928. Solenoid valves 930 and 932 deliver pressurized gas to gas inlet/outlet ports 934 and 936 of inlet housing 938. Inlet port 934 is connected to an internal passageway 996 within inlet housing 938 to deliver pressurized gas to lower face 928l of polygonal piston 928. Inlet port 936 is connected to an internal passageway 997 below lower bushing 964 within inlet housing 938 that communicates with a hole 998 drilled along the length of shaft 960 and terminating in a transverse hole 999 through shaft 960 to deliver pressurized gas to upper face 928u of polygonal piston 928.

Polygonal piston 928 responds to sequential delivery of pressurized gas by alternate upward and downward movement within cavity 972 and thereby corresponding upward and downward movement of latch key 902, shaft 960 of which is attached to polygonal piston 928 by retainer ring 970. Skilled persons will appreciate that each of inlet ports 934 and 936 serves as an exhaust port for the other when it is delivering pressurized gas to cavity 972.

Optical interrupter devices of a type similar to optical interrupter devices 248 and 249 used as sector control end of travel switches can be implemented in latch key rotation mechanism 904 or latch key raise/lower mechanism 906 to detect latch key 902 in, respectively, either of its latched or unlatched angular positions or either of its raised or lowered positions.

FIGS. 8 and 9 are respective front and side elevation views of box load interface system 16 showing the spatial relationship of port door 76 and other system components when port door 76 is in a fully elevated position in which it is aligned with and can fit within aperture 74 of front plate 14. With reference to FIG. 8, port door 76 has a front surface 160 on which two locating pins 162 are positioned to mate with locator pin depressions 44 (FIGS. 3B and 3D) in box door 30 when it and port door 76 are brought into contact by the operation of tray positioning mechanism 88. A box presence switch 164 may optionally be positioned below each locating pin 162 to provide an electrical signal indicating that box door 30 is properly registered with port door 76 when they are in matable connection. Two pod door latch key assemblies 166 are rotatably positioned within port door 76. Latch key assemblies 166 include laterally compliant latch keys 150 extending through front surface 160 to fit into spatially aligned slots 46 (FIGS. 3B and 3D) in box door 30 to operate its latching mechanism.

FIG. 10 is an exploded view and FIGS. 11A, 11B, and 11C are respective side (partly in section), front, and rear elevation views of latch key assembly 166. With reference to FIGS. 10, 11A, and 11C, latch key assembly 166 includes a latch key housing 168 that fits within and is secured by bolts passing through counterbored bolt holes 170 to a component of either a latch key motor mechanism 172 (FIGS. 12 and 13) or a fluidic pressure controlled latch key actuating mechanism 242 (FIGS. 33–37) positioned behind front surface 160 of and within port door 76. Latch key housing 168 is of cylindrical shape having a neck portion 174 and a base portion 176 of greater diameter. A latch key body 178 has positioned at one end a latch key 150 connected to a shaft that includes concatenated cylindrical portions 180, 182, and 184 of different diameters. Cylindrical portion 184 has located between its ends a hexagonal section 186. Latch key housing 168 has a centrally located stepped bore 188 that receives latch key body 178 and includes a hexagonal section 190 of complementary shape to the shape of and of the same length as the length of hexagonal section 186. Neck portion 174 and cylindrical portion 180 are of the same diameter so that they abut each other, and the width (i.e., the distance between opposite sides) of hexagonal section 190 is slightly larger than the width (i.e., distance between opposite faces) of hexagonal section 186 to permit lateral motion of latch key body 178 within latch key housing 168. A coil spring 192 fitted within a counterbored region 194 in latch key housing 168 and a clip ring 196 fitted around an annular recess 198 in cylindrical portion 184 holds latch key assembly 166 together as a single unit.

Latch key housing 168 and latch key body 178 are provided with respective complementary hexagonal sections 190 and 186 to prevent mutual rotation between them. Both latch key assemblies 166 are rotated between first and second angular positions to open and close box door 30. The widths of hexagonal sections 190 and 186 are slightly different to form a compliant latch key 150 that can "wobble" laterally to accommodate the tolerance range of the corresponding slot 46 in box door 30 and thereby ensure proper alignment to it.

With reference again to FIG. 9, port door 76 is shown in matable connection with box door 30, with latch key 150 turned in secure position within box door slot 46. Each latch key housing 168 carries on its neck portion 174 a bearing 210 that is supported on an interior surface 212 of port door 76.

Once box door 30 is unlocked, latch keys 150 remain in box door slots 46 and port door 76, while holding box door 30, moves away from carrier box 18. Box door 30 is supported on port door 76 only by latch keys 150. The loose range of tolerances of the dimensions of box door slots 46 and the design of latch keys 150 allowing them to "wobble" make box door 30 susceptible under its own weight to slippage against front surface 160 of port door 76. This change in the initial alignment between box door 30 and front plate 14 makes it difficult when re-installing box door 30 to fit its interior surface 36 within the recessed, stepped interior side margin 34 of carrier box 18.

Figure 32:
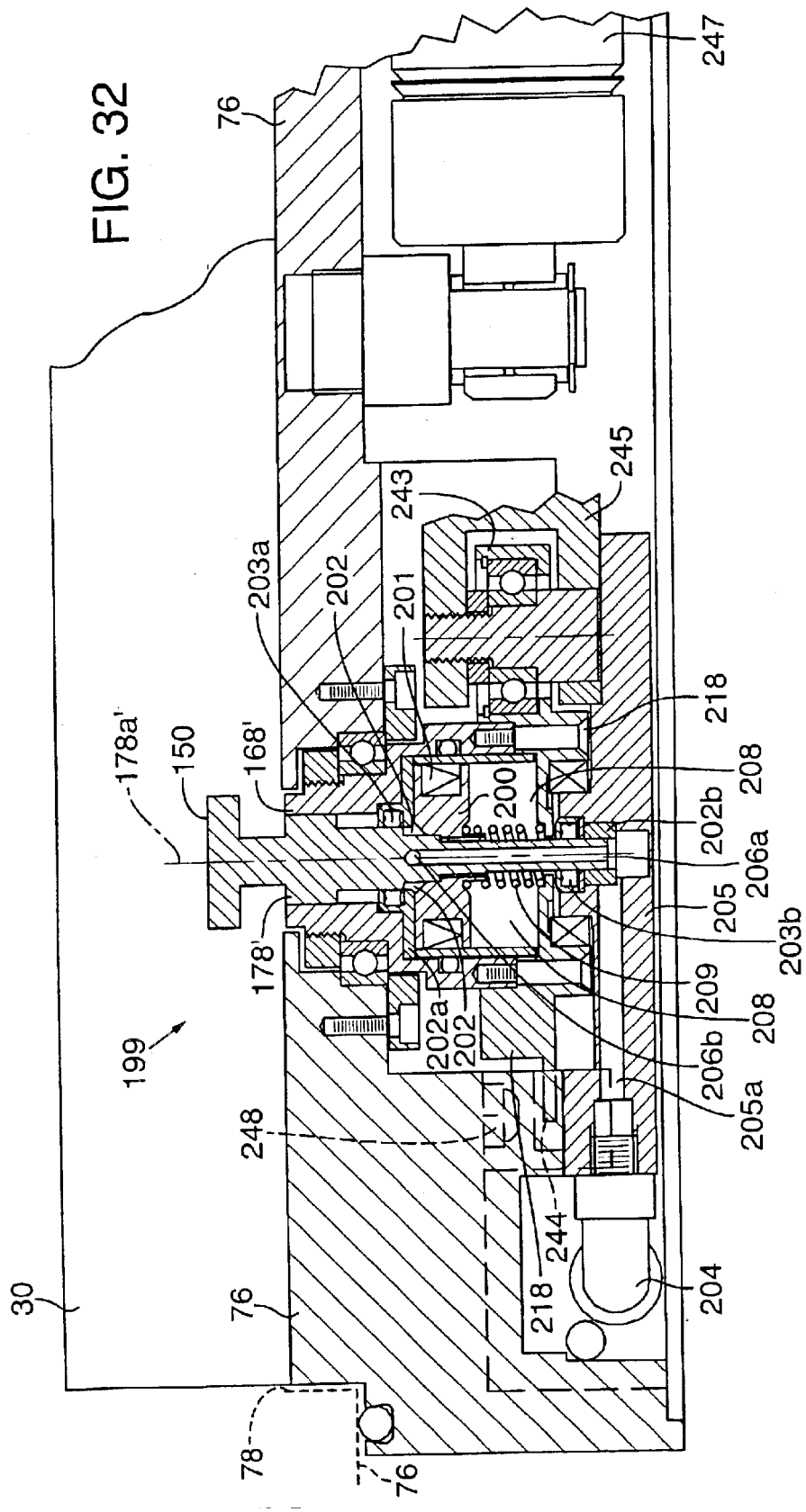
FIG. 32 is a sectional view taken along lines 32—32 of FIG. 37, showing a latch key pull back assembly that is a modification of the latch key assembly of FIGS. 9, 10, and 11A–11C.
Figure 37:
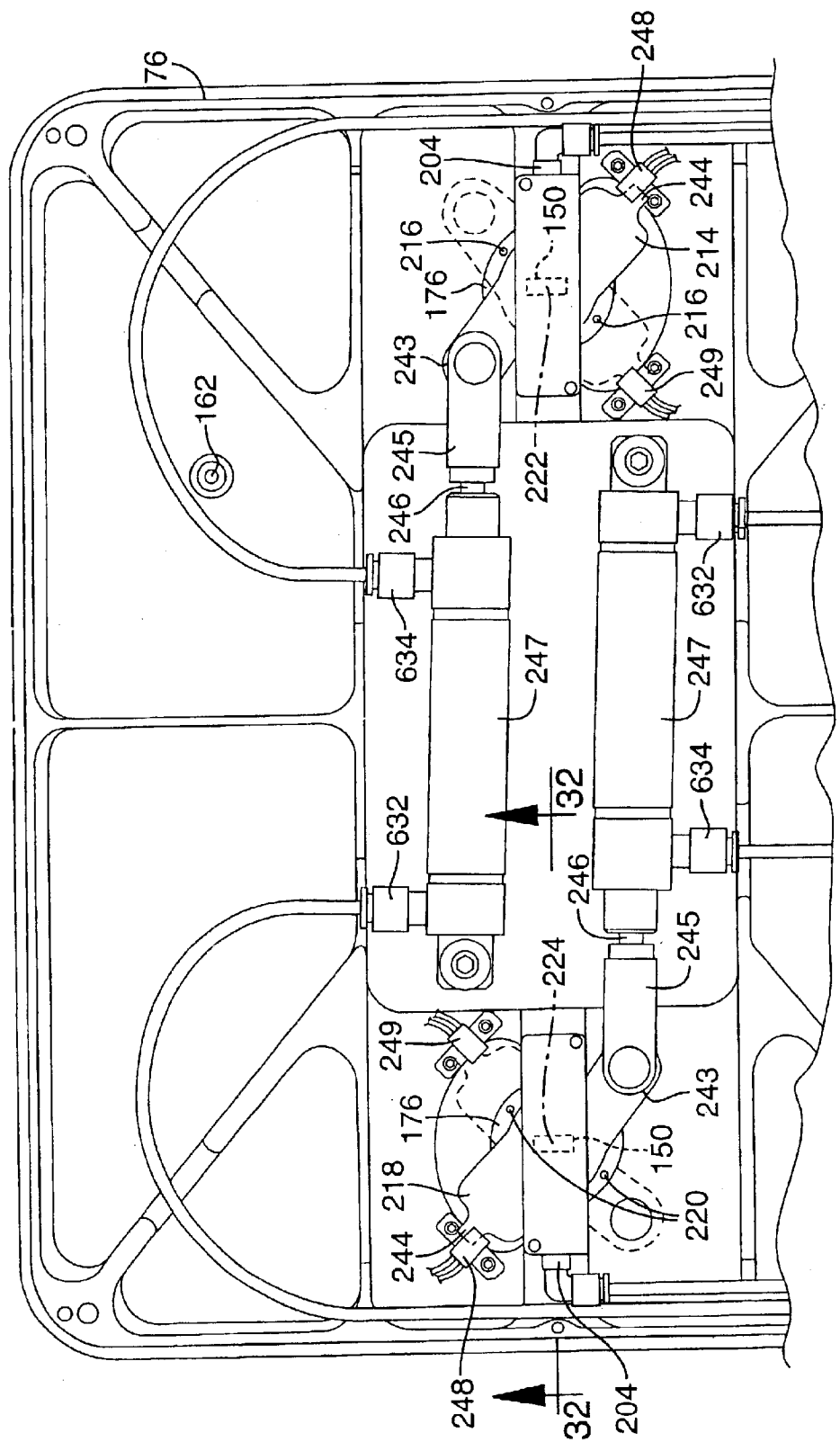
FIG. 37 is an enlarged fragmentary view of the latch key actuating mechanism of FIG. 33.
Figure 38:
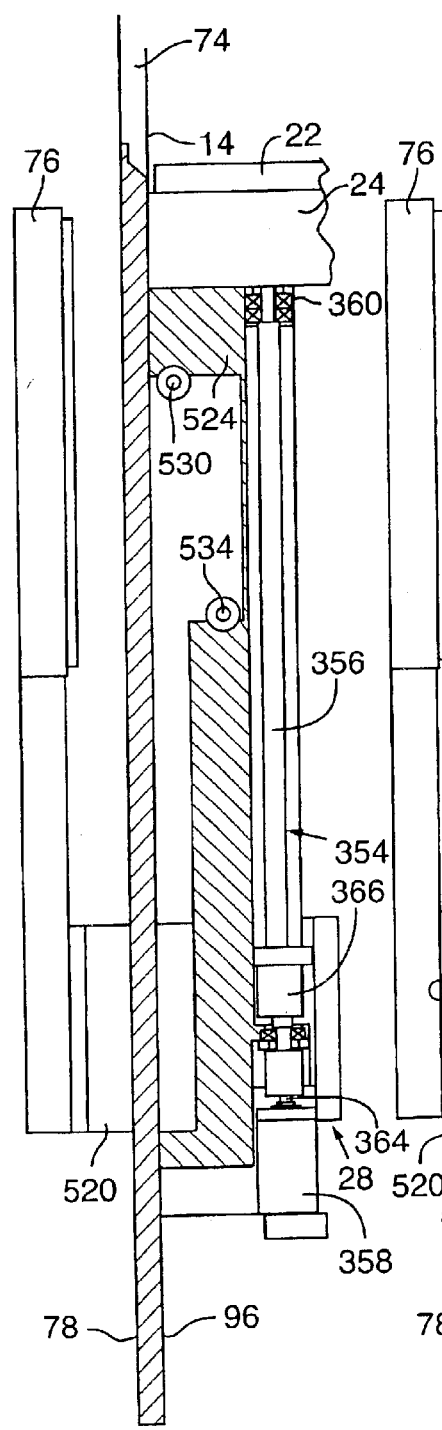
FIGS. 38, 39, and 40 are side elevation views (with FIG. 38 shown partly in cross section) of a four-bar carriage assembly of unitary construction that combines the functions of the port door translation and port door carriage mechanisms shown in FIGS. 8, 9, and 12.

To prevent box door 30 from slipping out of its initial mutual alignment with port door 76, an alternative embodiment of latch key assembly 166 includes a latch key pull back assembly 199, which is shown in FIGS. 32 and 34. Latch key pull back assembly 199 pulls box door 30 into a tight relationship with front surface 160 of port door 76 to preserve their initial mutual alignment. Each latch key 150 is non-rotatably mounted within latch key housing 168 through hexagonal sections 186 and 190, thereby allowing latch key 150 to "wobble" as previously described to accommodate a range of tolerances of box door slots 46. Cylindrical portion 184 of latch key body 178 and centrally located stepped bore 188 of latch key housing 168 are modified to accommodate a piston 200 that implements the pull back function of pull back assembly 199.

With reference to FIGS. 32 and 34, a piston 200 encircled by an annular seal 201 is secured to a latch key body 178' by screw threads or another suitable attachment method. Piston 200 is slidably movable within a housing 168' to move latch key 150 in either direction along a longitudinal axis 178a' of latch key body 178'. Piston 200 is driven by pressurized gas, such as air, supplied to a drive chamber 202 that is formed between an upper bushing 202a and a lower bushing 202b and sealed gas tight by seals 203a and 203b. Pressurized gas is supplied to drive chamber 202 from a pressurized gas supply (not shown) through a gas supply line 204 connected to a supply housing 205 having a gas passageway 205a. Passageway 205a communicates with intersecting ports 206a and 206b in latch key body 178', which extends through housing 168' and into supply housing 205 through lower bushing 202b and seal 203b. Port 206a is a hole formed along longitudinal axis 178a' of latch key body 178', and port 206b is a hole formed in latch key body 178' to intersection port 206a in a transverse direction. Port 206b opens up into drive chamber 202 to supply pressurized gas that acts on the face of piston 200 to drive it in a direction to pull box door 30 against front surface 160 of and into a tight relationship with port door 76 whenever latch key 150 is in its secure position within box door slot 46.

A return chamber 208 is located on the opposite side of piston 200 where a return coil spring 209 is positioned around latch key body 178' to urge piston 200 and thereby extend latch key 150 to their original positions to permit release of box door 30.

In operation, after each latch key 150 has been rotated to unlock box door 30, pressurized gas is supplied to drive chamber 202 through passageway 205 and gas inlet ports 206a and 206b. The pressurized gas acts on the face of piston 200, causing it to move against return spring 209 to retract latch key 150 and thereby draw box door 30 into firm and secure engagement with port door 76. One of two embodiments of a port door translation mechanism described below moves port door 76 together with box door 30 away from carrier box 18 to open it.

When box door 30 is ready to be re-installed to close carrier box 18, the port door translation mechanism moves port door 76 toward carrier box 18 and box door 30 in alignment with it. Each latch key inserted into a box door slot 46 is rotated to lock box door 30 on carrier box 18, and pressurized gas is then released from drive chamber 202 through gas inlet ports 206a and 206b and passageway 205. Return spring 209 acts in response to the release of pressurized gas to push against the opposite face of piston 200 to return latch key 150 to its original, extended position. The port door translation mechanism can then retract port door 76 away from box door 30 and thereby withdraw latch keys 150 out of box door slots 46 to completely separate port door 76 from a closed carrier box 18. Skilled persons will appreciate that latch key pull back assembly 199 can be advantageously used in a latch key assembly implemented in the absence of the "wobble" design feature.

Figure 12:
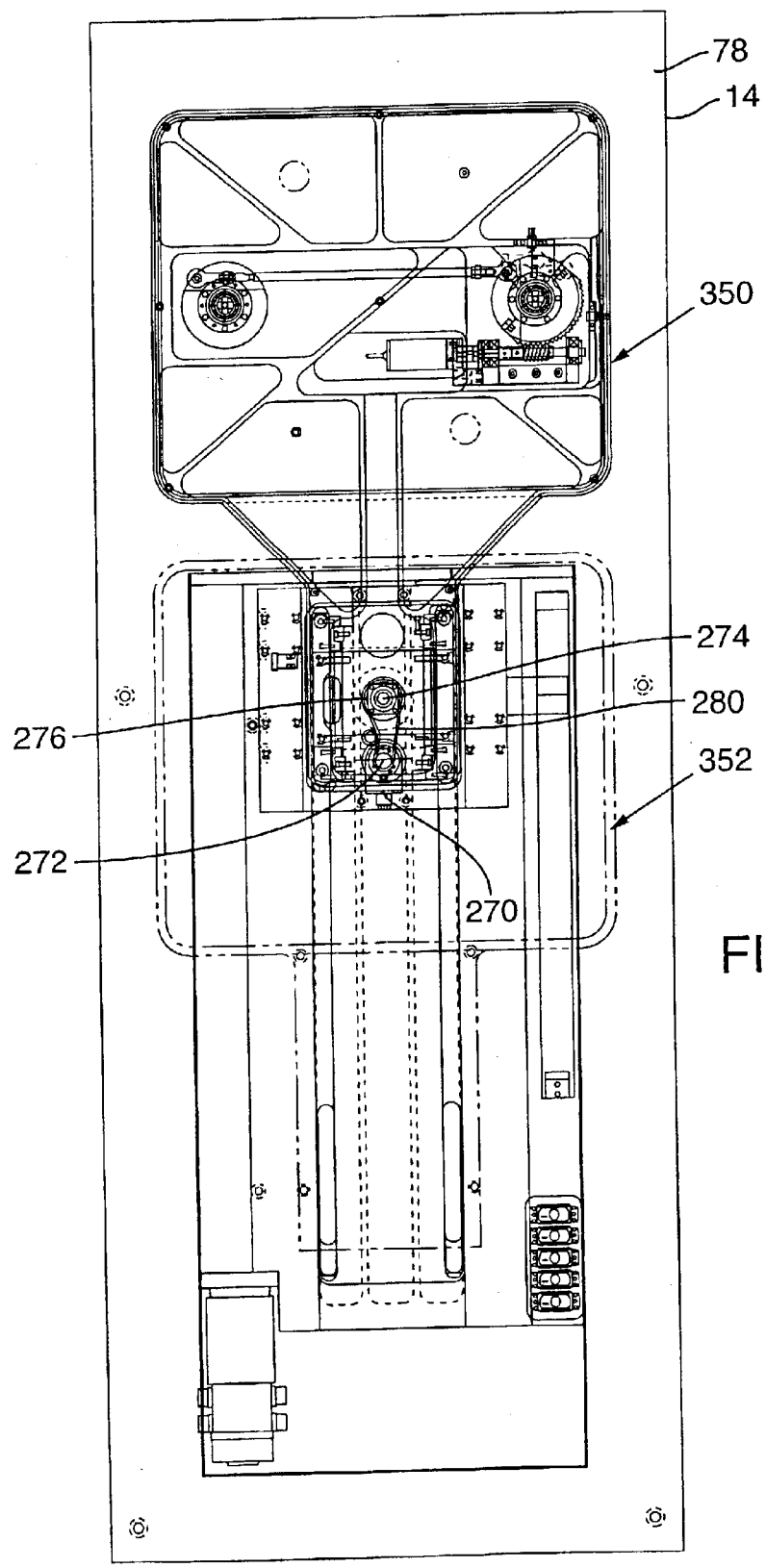
FIG. 12 is a rear elevation view of the latch key motor mechanism mounted in the port door and the port door translation mechanism mounted on the interior surface of the front plate.
Figure 13:
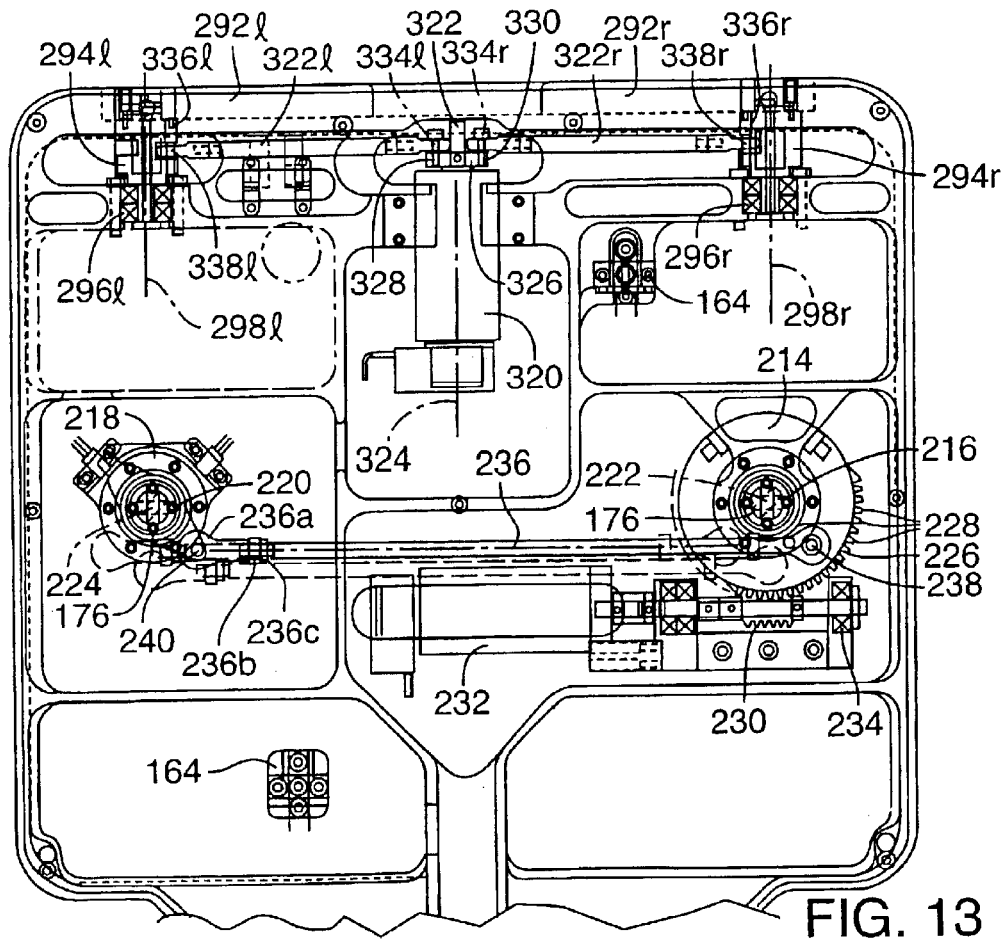
FIG. 13 is an enlarged rear elevation view of the latch key motor mechanism shown in FIG. 12 and of the positioning mechanism for the wafer scanning assembly.

FIGS. 12 and 13 show latch key motor mechanism 172, which rotates latch keys 150 between the first and second angular positions to lock and unlock box door 30 of carrier box 18. With reference to FIGS. 12 and 13, base portion 176 of one latch key housing 168 is fixed to a master disk member 214 by bolts 216 engaging tapped bolt holes 170, and base portion 176 of the other latch key housing 168 is fixed to a slave disk member 218 by bolts 220 engaging tapped bolt holes 170. Disk members 214 and 218 and therefore their corresponding latch keys 150 are mounted for rotation about respective axes 222 and 224. Master disk member 214 includes a worm gear section 226 having worm gear teeth 228 with which a worm gear shaft 230 driven at one end by a motor 232 and terminated at the other end in a bearing 234 engages to move disk member 214 and thereby its corresponding latch key 150 about axis 222 between the first and second angular positions. The operation of motor 232 is controlled to provide a 90° displacement between the first and second angular positions.

An elongated coupling or rod member 236 of adjustable length is mounted at its proximal end to disk member 214 for pivotal movement about a first rod pivot axis 238 and at its distal end to disk member 218 for pivotal movement about a second rod pivot axis 240. Rod member 236 is composed of a spherical joint 236a and a turnbuckle portion 236b coupled at each of its ends by locknuts 236c that after rotary adjustment fix the length of rod member 236. Disk member 218 is slaved to the motion of disk member 214 and thereby moves its corresponding latch key 150 about axis 224 between the first and second angular positions. Spherical joint 236a facilitates the length adjustment of rod member 236 without disassembly by rotation of turnbuckle portion 236b but is otherwise not needed to practice the invention.

FIGS. 33–37 show a fluidic pressure controlled latch key actuating mechanism 242, which represents an alternative to latch key motor mechanism 172 and is shown implemented for use with latch key pull back assembly 199. As does motor mechanism 172, actuating mechanism 242 rotates latch keys 150 between the first and second angular positions to lock and unlock box door 30 of carrier box 18.

With reference to FIGS. 33–37, base portion 176 of one latch key housing 168' is fixed to a disk member 214 by bolts 216 engaging tapped bolt holes 170, and base portion 176 of the other latch key housing 168 is fixed to a disk member 218 by bolts 220 engaging tapped bolt holes 170. Disk members 214 and 218 and therefore their corresponding latch keys 150 are mounted for rotation about respective axes 222 and 224. Each of disk members 214 and 218 functions as a lever arm that has a coupling end 243 and an opposite end with a protruding vane 244. Coupling end 243 provides a pivot mounting for a cylinder attachment block 245 that is connected to the distal end of an extensible rod 246 of a pneumatic cylinder 247. Vane 244 extends from each of disk members 214 and 218 for movement between emitter and sensor legs of respective U-shaped transmissive optical interrupter devices 248 and 249 angularly displaced by 90° on and mounted to port door 76. The presence of vane 244 in either of optical interrupter devices 248 and 249 causes them to function as sector control end of travel switches that indicate whether either of latch keys 150 is in the first or second angular position. The lengths of extension of each extensible rod 246 between the first and second angular positions is set by hard stop blocks (not shown) positioned in port door 76 to limit the ranges of angular displacement of disk members 214 and 218. Bumpers made of Delrin® or other suitable material fixed to disk members 214 and 218 can be of selected thicknesses to provide an adjustment of the extent of travel of extensible rods 246. Each pneumatic cylinder 247 controls, therefore, a key latch mechanism operating as a "bang—bang" device between two angular positions and using end point detection.

Extensible rods 246 move disk members 214 and 218 and thereby rotate their corresponding latch keys 150 about the respective axes 222 and 224 between the first and second angular positions. The position and length of extension of each extensible rod 246 provides a 90° displacement between the first and second angular positions.

Figure 18:
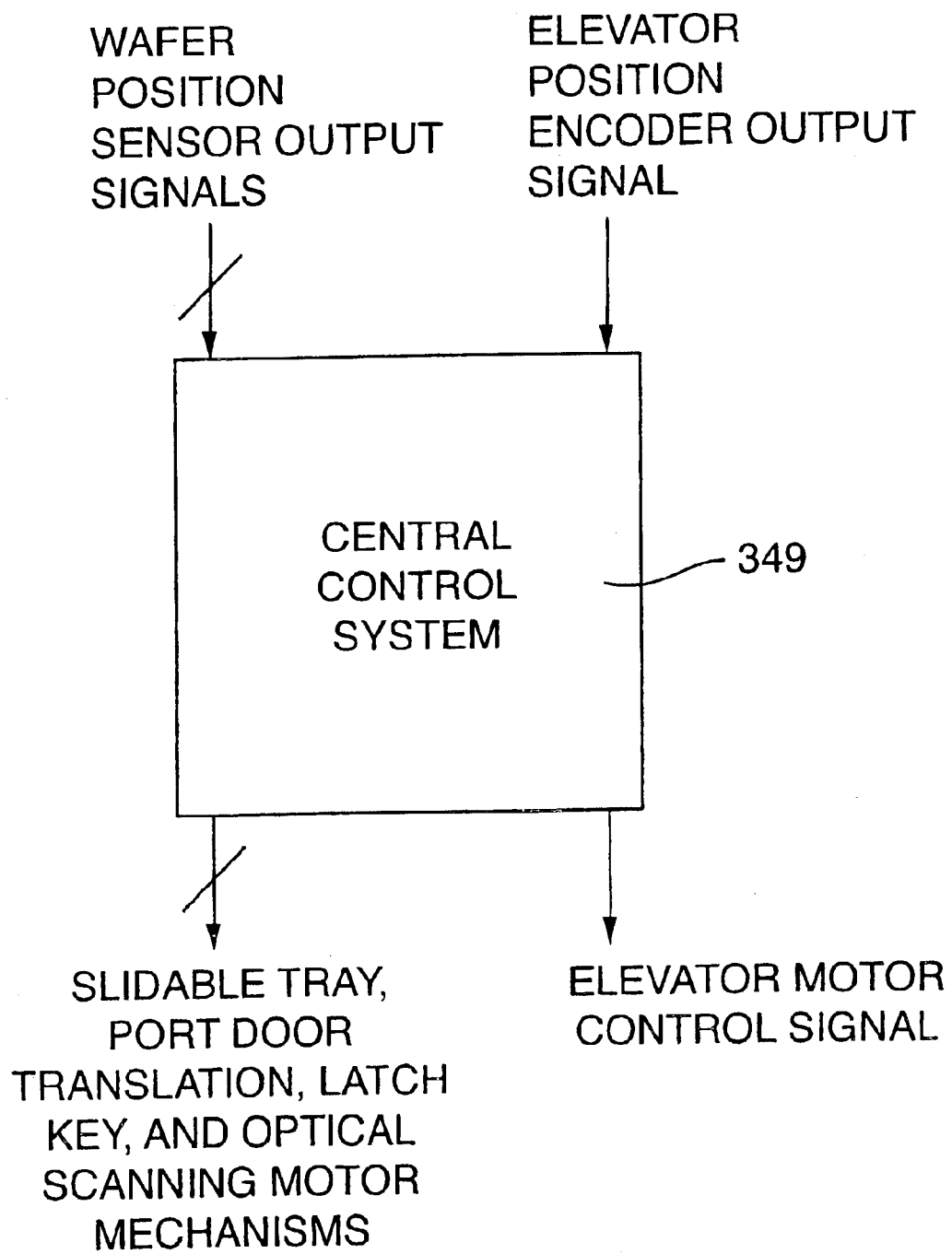
FIG. 18 is a simplified block diagram showing the input signals to and output signals from a central control system that coordinates the operations of the various components of the box load interface mechanism of the invention.
Figure 19:
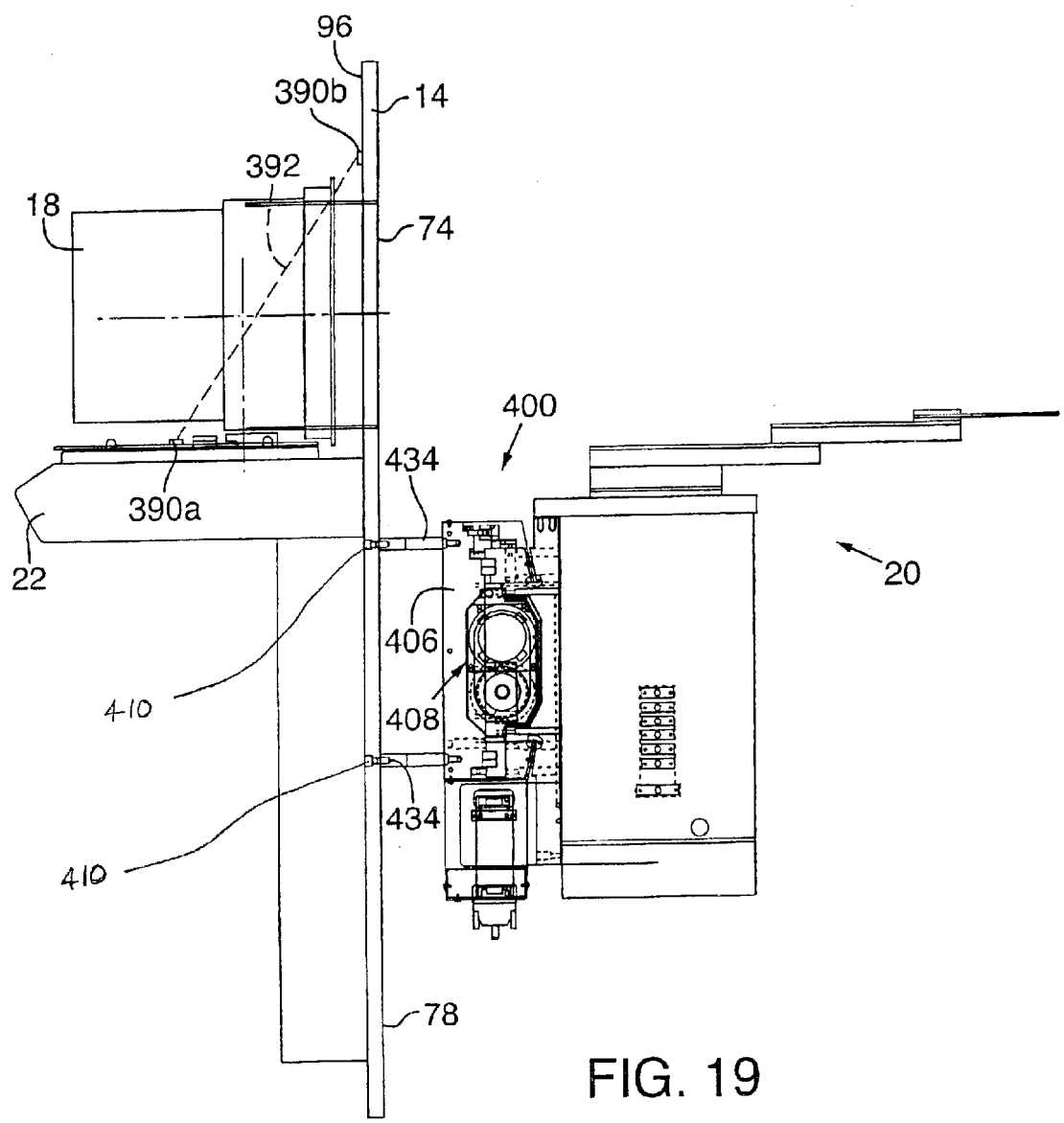
FIG. 19 is a side elevation view of a robot assembly mounted to a lead nut assembly.
Figure 20:
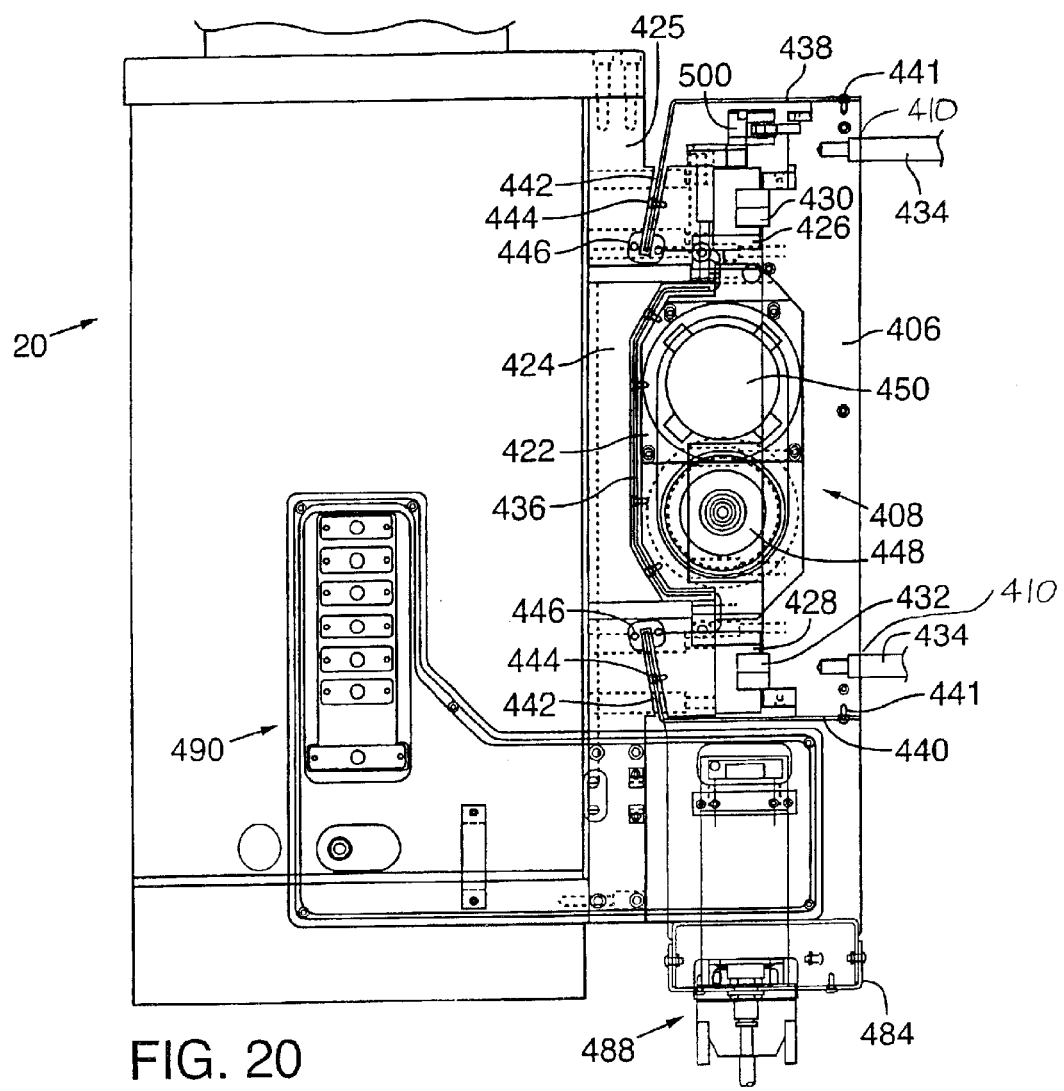
FIG. 20 is a partial side elevation view of the opposite end of the robot assembly.
Figure 21:
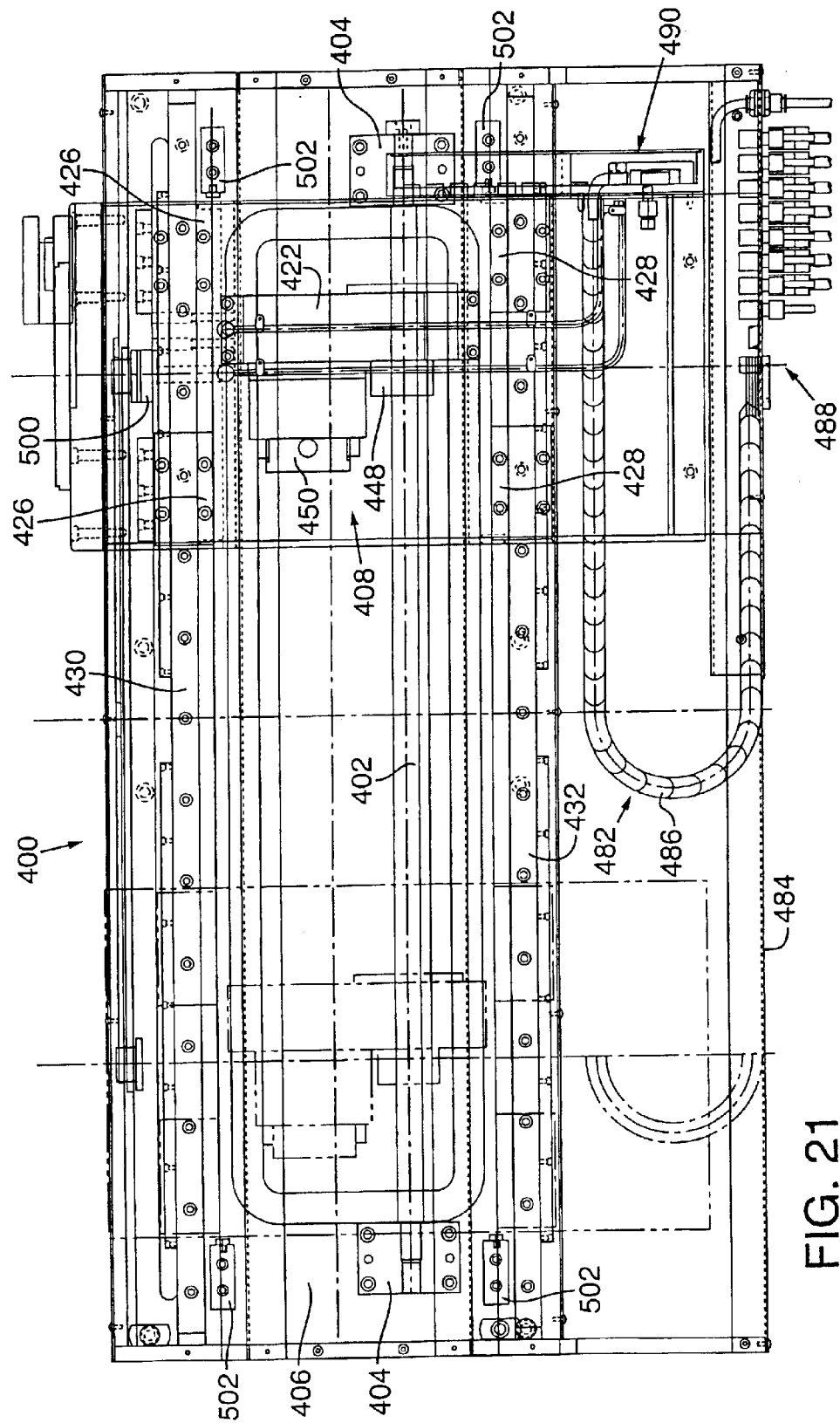
FIG. 21 is a plan view of the lead screw and lead nut assembly.
Figure 24:
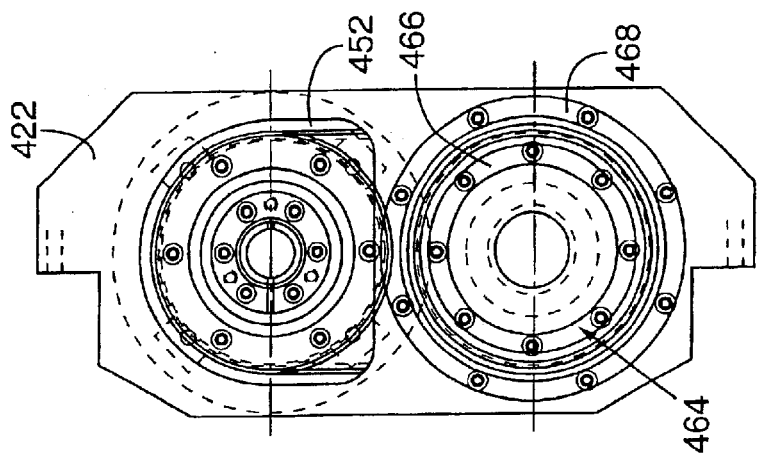
FIGS. 22–24 are respective left end, plan, and right end views of the lead nut assembly.
Figure 23:
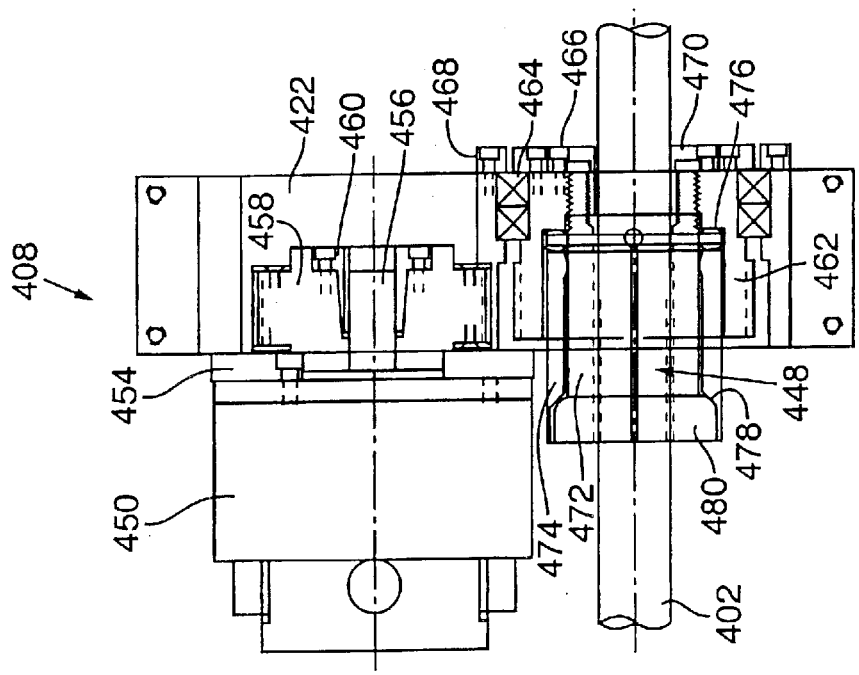
Figure 22:
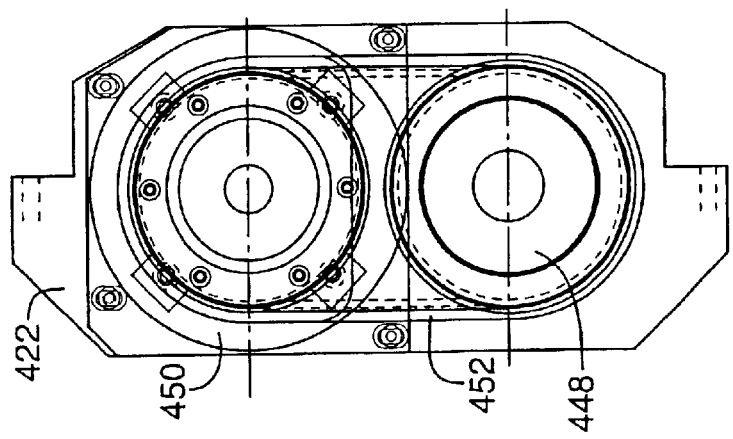

With particular reference to FIG. 33, a pneumatic pressure control system 600 selectively delivers pressurized gas to each pneumatic cylinder 247 in response to latch key position commands provided by central control system 349 (FIG. 18). The presence of vane 244 in a corresponding one of optical interrupter devices 248 and 249 provides to central control system 349 initial condition information about the position of each latch key 150. Pressure control system 600 includes a gas supply line that delivers gas from a pressurized gas source (not shown) to an inlet port 604 of a two-outlet port solenoid valve 606 that controls the operation of pneumatic cylinders 247 and an inlet port 608 of a single-outlet port solenoid valve 610 that controls the operation of latch key pull back assembly 199.

Solenoid valve 606 has outlet ports 620 and 622 that deliver pressurized gas through separate conduits to, respectively, an inlet port 624 of a fluid flow divider 626 and an inlet port 628 of a fluid flow divider 630. Flow divider 626 has two outlet ports, each connecting through a separate conduit to a cylinder rod extension inlet 632 of a different one of pneumatic cylinders 247. Flow divider 630 similarly has two outlet ports, each connecting through a separate conduit to a cylinder rod retraction inlet 634 of a different one of pneumatic cylinders 247. A command signal provided by central control system 349 to an electrical conductor 636 selectively controls the flow path of pressurized gas from inlet port 604 to one of outlet ports 620 and 622 to either extend or retract extensible rods 246 and thereby rotate latch keys 150 between their first and second angular positions. Solenoid valve 606 has gas exhaust ports 638 and 640 corresponding to the gas flow paths produced by the respective outlet ports 620 and 622 to which conduits are connected to release exhaust gases away from the enclosed, clean environmental housing.

Solenoid valve 610 has an outlet port 650 that delivers pressurized gas to an inlet port 652 of a fluid flow divider 654, which has two outlet ports, each connecting through a separate conduit to gas supply line 204 of a different one of latch key pull back assemblies 199. A command signal provided by central control system 349 to an electrical conductor 658 delivers the flow of pressurized gas from inlet port 608 to outlet port 650 to retract latch keys 150 after they have fit into slots 46 of and opened box door 30 so that it and port door 76 are in secure matable connection. Solenoid valve 610 has a gas exhaust port 660 corresponding to the gas flow path produced by outlet port 650 to which a conduit is connected to release exhaust gases away from the enclosed, clean environmental housing.

FIGS. 8, 9, and 12 show a port door translation mechanism 250 mounted to a port door carriage mechanism 252 to which elevator assembly 28 is operatively connected. Port door 76 has guide tracks 254 that slide along guide rails 256 on port door carriage mechanism 252 so that it can move port door 76 toward or away from interior surface 78 of front plate 14 when port door 76 is aligned with aperture 74.

Port door 76 includes an upper rectangular section 258 that houses latch key motor mechanism 172 and a lower rectangular section 260 that houses port door translation mechanism 250. Upper section 258 of port door 76 includes a stepped region 262 of a height that defines a surface portion 264 and causes port door 76 to form a sealed connection against interior surface 78 of front plate 14 as surface portion 264 fits within aperture 74 to present latch keys 150 to mate with slots 46 in box door 30. Lower section 260 of port door 76 supports a motor 270 coupled to a spindle 272 and a lead screw 274 connected at one end to a pulley 276 and supported at the other end in a preloaded bearing 278. A belt 280 connecting spindle 272 to pulley 276 causes lead screw 274 to rotate and drive a nut assembly 282 to cause port door 76 to slide along guide rails 256 toward or away from interior surface 78, depending on the direction of lead screw rotation.

Because surface portion 264 is sized to fit within aperture 74, motor 270 is not operated unless elevator assembly 28 has moved port door carriage mechanism 252 to its uppermost position. Elevator assembly 28 moves port door carriage mechanism 252 to its lowermost position after port door translation mechanism 250 has moved port door 76 completely away from interior surface 78 of front plate 14.

Figure 14:
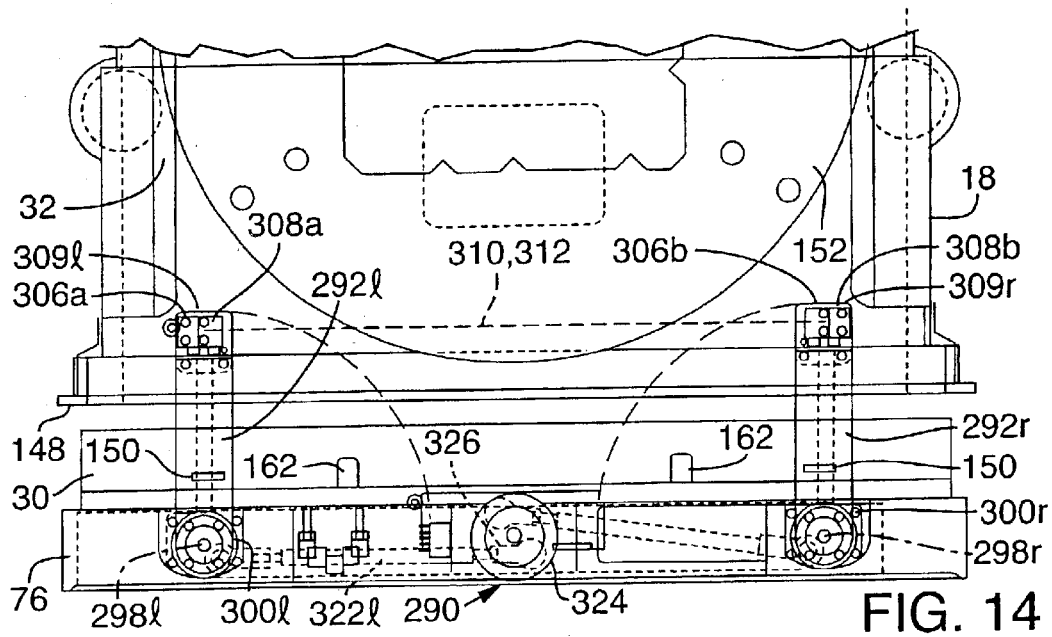
FIGS. 14 and 15 are respective plan and side elevation views of the wafer scanning assembly mounted on the port plate.
Figure 15:
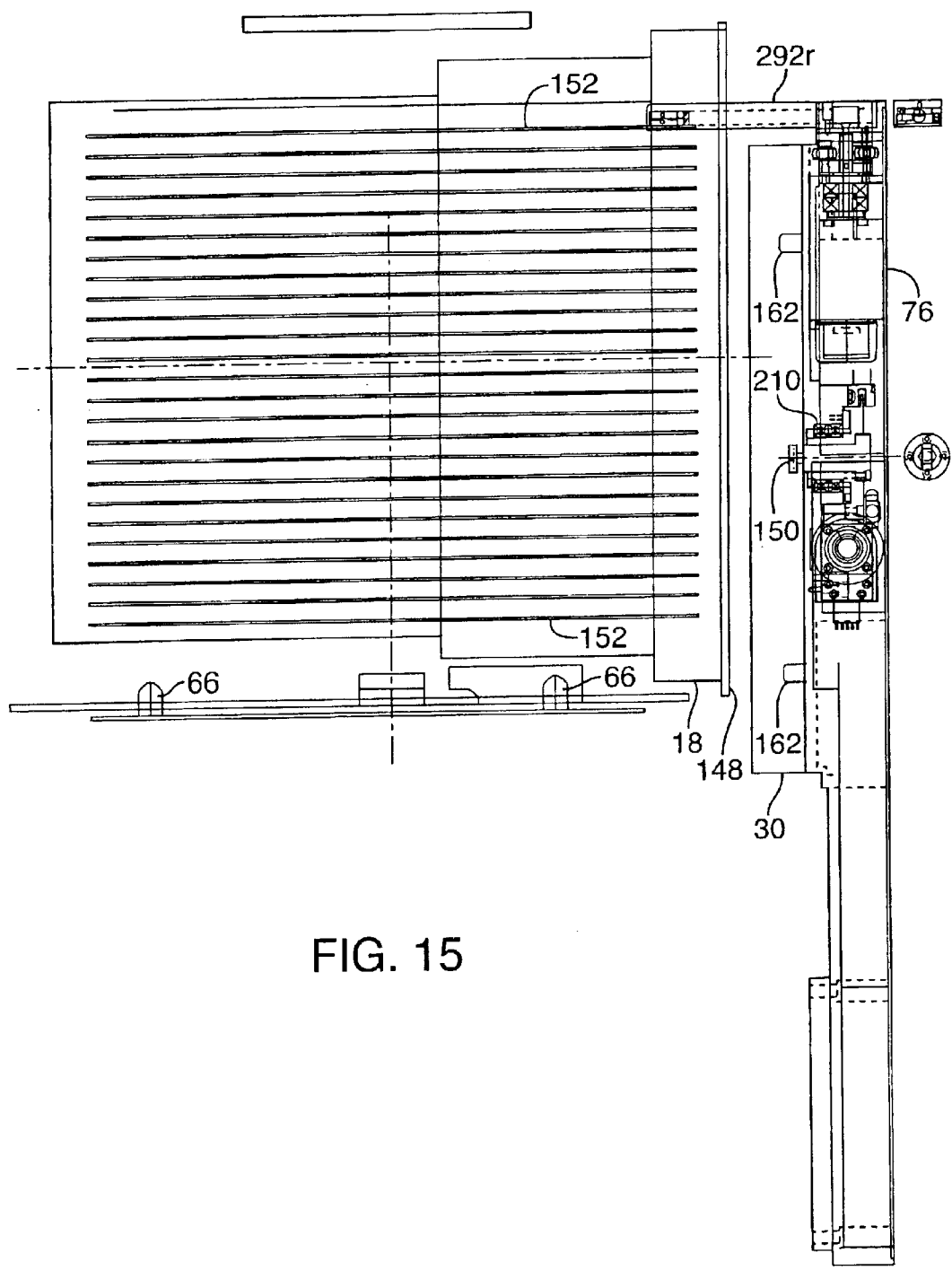

FIGS. 13, 14, and 15 show respective rear elevation, plan, and side elevation views of a differential, transmissive optical scanning assembly 290 mounted within the interior and in a recess near the top side of port door 76. Scanning assembly 290, which operates in conjunction with elevator assembly 28, includes two scanning fingers 292$l$ and 292$r$, the former having a finger shaft 294$l$ mounted for pivotal movement in a bearing 296$l$ about a finger pivot axis 298$l$ at a proximal end 300$l$ and the latter having a finger shaft 294$r$ mounted for pivotal movement in a bearing 296$r$ about a finger pivot axis 298$r$ at a proximal end 300$r$. Scanning finger 292$l$ supports light sensors 306$a$ and 308$a$ positioned one on top of the other at a distal end 309$l$. Scanning finger 292$r$ supports light emitters 306$b$ and 308$b$ positioned one on top of the other at a distal end 309$r$. A light propagation path 310 between light sensor 306$a$ and light emitter 306$b$ and a light propagation path 312 between light sensor 308$a$ and light emitter 308$b$ are coplanar in a direction normal to the major surface of wafer 152. Light propagation paths 310 and 312 cross over at a point 314 (FIG. 17) in the plane.

A scanner motor 320 mounted within port door 76 includes a central shaft 322 having an axis of rotation 324 set at an equidistant position between finger pivot axes 298$l$ and 298$r$. Central shaft 322 carries a disk member 326 to which are mounted two stationary pins 328 and 330 angularly spaced apart from each other to carry out the function described below. A rod member 322$l$ is mounted at a proximal end to pin 328 on disk member 326 for pivotal movement about a rod proximal pivot axis 334$l$ and at its distal end to a coupling recess mount 336$l$ in finger shaft 294$l$ for pivotal movement about a rod distal pivot axis 338$l$.

A rod member 322r is mounted at a proximal end to pin 330 on disk member 326 for pivotal movement about a rod proximal pivot axis 334r and at its distal end to a coupling recess mount 336r in finger shaft 294r for pivotal movement about a rod distal point pivot axis 338r.

Scanner motor 320 imparts ±45° reciprocal motion to central shaft 322 and pins 328 and 330 are angularly spaced apart on disk member 326 to pivotally move scanning fingers 292l and 292r between fully extended positions (shown in solid lines in FIG. 14) and fully retracted positions (shown in phantom lines in FIG. 14). Thus, scanning fingers 292l and 292r move 90° about their respective finger pivot axes 298l and 298r between the fully extended and fully retracted positions. Skilled persons will appreciate that the extension and retraction of scanning fingers 292l and 292r can also be accomplished with the use of fluidic cylinders.

FIG. 14 shows that the respective distal ends 309l and 309r of scanning fingers 292l and 292r in their fully extended positions straddle wafers 152 stored in wafer cassette 32 and that light propagation paths 310 and 312 intersect a chord of each of wafers 152 as they are scanned.

When they are fully extended, sensors 306a and 308a and emitters 306b and 308b are located inside of the region where a wafer carrier box 18 would occupy and are aligned to form two light propagation paths 310 and 312 that cross each other. The presence of a wafer 152 aligned to intersect one or both light propagation paths 310 and 312 interrupts light propagating from one or both of emitters 306b and 308b from reaching its corresponding sensor 306a and 308a. Thus, interruption of one or both of light propagation paths 310 and 312 provides information that can be used to position robot assembly 20 for wafer pickup or to determine the presence or absence of a wafer 152 in a slot in wafer cassette 32, whether two wafers 152 occupy the same slot in wafer cassette 32, or whether a wafer 152 occupies two slots (i.e., in a cross slot position) in wafer cassette 32. The mounting configuration and operation of light sensors 306a and 308a and emitters 306b and 308b are described below with particular reference to FIGS. 16A and 16B.

Figure 16A:
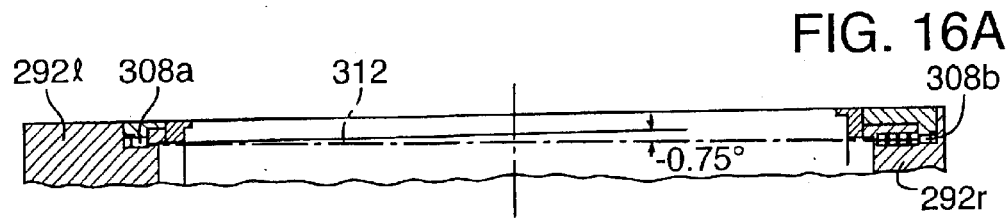
FIGS. 16A and 16B are diagrams showing the light beam paths of two sets of light emitters and light sensors.
Figure 16B:
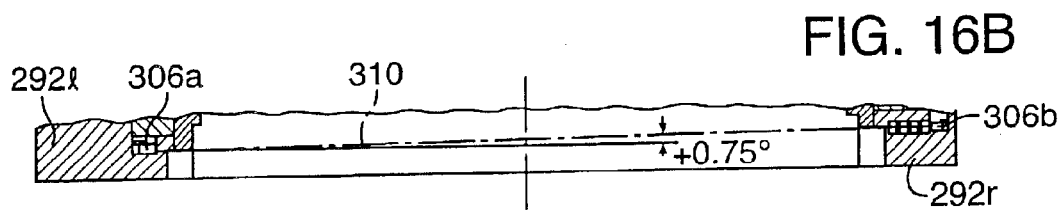
Figure 17:
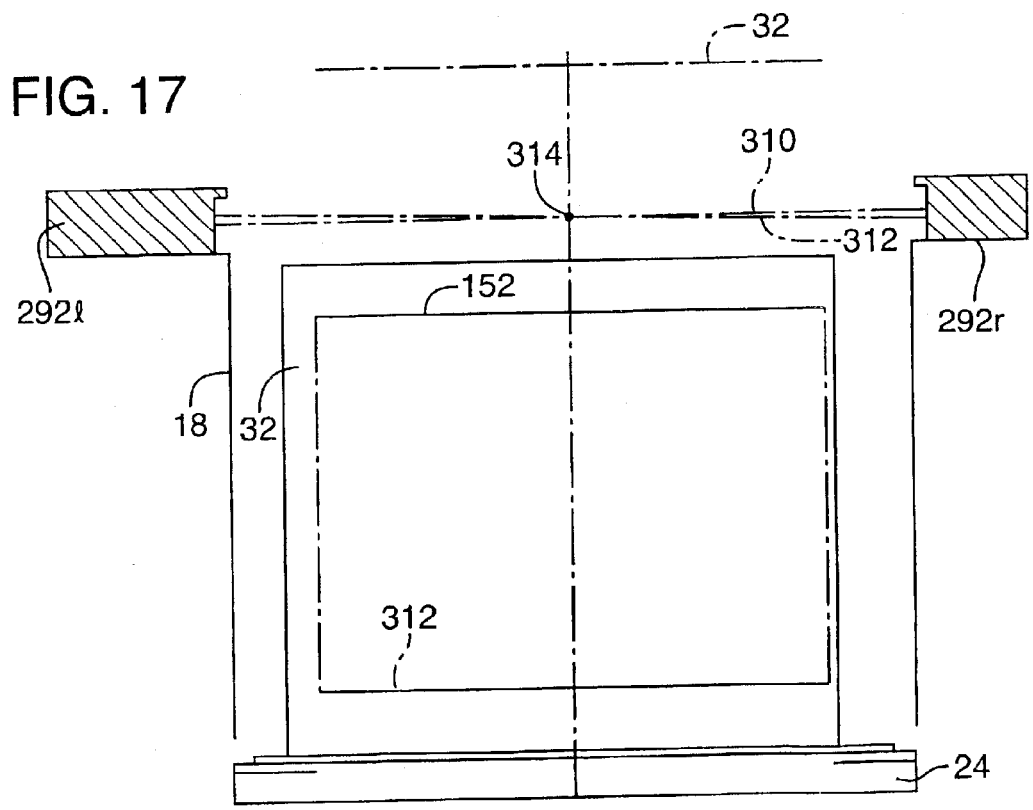
FIG. 17 is a diagram showing a front elevation view of the placement of a wafer cassette on a slidable tray (with the position of a properly registered semiconductor wafer shown in phantom) relative to the crossed beam paths of the light emitters and light sensors shown in FIGS. 16A and 16B.

FIG. 16A shows in greatly enlarged detail a diagram of the placement of sensor 308a and emitter 308b in the respective scanning fingers 292l and 292r, and FIG. 16B shows in greatly enlarged detail a diagram of the placement of sensor 306a and emitter 306b in the respective scanning fingers 292l and 292r. With reference to FIGS. 16A and 16B, sensor 306a and emitter 306b are secured within the respective scanning fingers 292l and 292r in slightly upwardly beveled mounting surface areas that provide a straight line light propagation path 310 inclined at a +0.75° angle relative to the plane of the top surfaces of scanning fingers 292l and 292r. Sensor 308a and emitter 308b are secured within the respective scanning fingers 292l and 292r in slightly downwardly beveled mounting surface areas that provide a straight line light propagation path 312 inclined at a −0.75° angle relative to the plane of the top surfaces of scanning fingers 292l and 292r. FIG. 17 is a diagram showing a front elevation view of the placement of wafer cassette 32 on slidable tray 24 relative to crossed light propagation paths 310 and 312. Propagation paths 310 and 312 are coplanar in a vertical plane and are angularly inclined in opposite directions to cross over at a point 314 at the midpoint of the distance between scanning fingers 292l and 292r. FIG. 17 also shows in phantom lines a semiconductor wafer 152 positioned above wafer cassette 32 and in a location representing proper registration of wafer 152 in wafer cassette 32.

Light propagation paths 310 and 312 are angularly inclined so that a single wafer 152 properly registered in a slot of wafer cassette 32 and in a specified elevator position interrupts both beams equally. As shown in FIGS. 8 and 15 and described in greater detail below, scanning assembly 290 is supported on elevator assembly 28 that moves a port door carriage 344, the vertical position of which is measured by an optical position encoder 342. The movement of port door carriage 344 provides a continuous scan of the contents of wafer cassette 32. As port door carriage 344 travels past a next specified elevator position, sensors 306a and 308a produce output signals of equal magnitude for an elevator displacement equal to the wafer thickness. (The same wafer thickness is measured by the corresponding sensors and emitters for light propagation paths 310 and 312 when wafer 152 is registered in its slot.) The magnitudes of the signals will change, but the difference between the signals will not change as port door carriage 344 moves to the next specified elevator position.

A wafer 152 in cross slot position will interrupt only one light propagation path for a specified elevator position and thereby cause sensors 306a and 308a to produce output signals of different magnitudes. The sensor output that indicates the presence of incident light represents the open slot and thus the direction of the horizontal tilt angle of wafer 152.

The common mode rejection properties of differential optical scanning assembly 290 reject signal perturbations caused by mechanical vibrations and provides for an accurate individual wafer thickness measurement. Two wafers 152 occupying the same slot in wafer cassette 32 will interrupt both light propagation paths 310 and 312 for a specified elevator position; however, the magnitudes and difference between the signals will not change for a longer than nominal vertical displacement of port door carriage 344 as it moves to the next specified elevator position. The continuous signal interruption indicates a greater than nominal wafer thickness in a slot and thereby represents double wafer occupancy of a slot in wafer cassette 32. The above-described crossed light propagation path detection arrangement is described in U.S. patent application Ser. No. 09/141,890, filed Aug. 27, 1998, now U.S. Pat. No. 6,160,265, which is assigned to the assignee of this application.

A light beam sensor 346a and emitter 346b form a light propagation path 348 in a transverse (preferably perpendicular) direction to that of coplanar light propagation paths 310 and 312 described above. Sensor 346a and emitter 346b are positioned at the top and bottom sides of aperture 74 on exterior surface 96 of front plate 14 and outside of the region where a wafer carrier box 18 would occupy to detect whether a wafer 152 has been dislodged to protrude from its slot in the front opening of carrier box 18. A dislodged wafer 152 descending out of carrier box 18 would interrupt light propagation path 348 to provide a signal that disables port door carriage 344 from descending farther and thereby prevent the protruding wafer 152 from being clipped by scanning fingers 292l and 292r as port door 76 is lowered. As indicated in FIG. 18, the output signals of sensors 306a, 308a, and 346a and of position encoder 342 are processed by central control system 349 to make the above-described wafer registration determinations.

For any of the above-described preferred embodiments of a box hold down clamping mechanism, box load interface system 16 may be equipped with instrumentation indicating carrier box presence and alignment information on slidable tray 24. With reference to FIGS. 1, 6, 19, 25, and 29, a light beam sensor 390a (FIGS. 19, 25, and 29) and a light beam emitter 390b (FIGS. 1, 6, and 19) form a light propagation path 392 (FIG. 19) in a transverse direction to exterior surface 96 of front plate 14 and the carrier box mounting surface of slidable tray 24: Sensor 390a and emitter 390b are mounted to slidable tray 24 and above aperture 74 on exterior surface 96 of front plate 14 in locations that establish a direction of propagation path 392 that passes through the region occupied by a wafer carrier box 18 when it is placed on slidable tray 24. Five carrier box placement switches 394 (FIGS. 25 and 29) depressed concurrently by a wafer carrier box 18 indicate its proper registration on kinematic coupling pins 66. Central control system 349 monitors the continuity of light propagation path 392 and status of placement switches 394. Central control system 349 causes illumination of an indicator light 396 (FIGS. 1 and 6) to indicate the presence of a carrier box 18 and various combinations of four indicator lights 398 (FIGS. 1 and 6) to indicate the nature of any misalignment of carrier box 18 on slidable tray 24.

FIGS. 1, 8, 9, 12, and 15 show elevator assembly 28 supporting port door 76; FIG. 12 shows port door 76 in a fully raised position (solid lines) 350 and a fully lowered position (outlined in phantom lines) 352. Elevator assembly 28 comprises a side drive lead screw mechanism 354 that includes a lead screw 356 driven at a lower end by a smooth running, high torque, DC motor 358 and supported at an upper end by preloaded end bearings 360 for rotation about a longitudinal axis 362. Numerous servo motors are known in the art, are commercially available, and would be suitable. Motor 358 is in communication with and controlled by an input controller that generates input command voltage signals. The input controller forms a part of central control system 349, which directs the operation of the interface system of the present invention. Input command signals delivered to motor 358 are converted to rotation of a motor drive output shaft 364. Motor 358 provides bi-directional rotational output, reflecting the polarity of the voltage input signal. Motor drive output shaft 364 is operatively connected to lead screw 356. Rotation of motor drive output shaft 364 results in corresponding rotation of lead screw 356. A lead nut assembly 366 is threaded on lead screw 356 and operatively connected to port door carriage 344 connected to a side surface of port door 76 and lead screw 356. Rotation of lead screw 356 results therefore in linear displacement of lead nut assembly 366 along the length of lead screw 356. This results in linear displacement of port door carriage 344 to raise or lower port door 76 to perform a wafer scanning operation.

Optical position encoder 342 continuously monitors and provides feedback as to the position of lead nut assembly 366 and thereby the positions of wafers 152 stored in wafer cassette 32 relative to scanning fingers 292*l* and 292*r* mounted to port door 76. An encoder carriage 372 is mounted in fixed relation to and thus moves in concert with lead nut assembly 366. Encoder carriage 372 provides a housing for movable components of optical position encoder 342. Scanning assembly 290 is displaced as a consequence of the displacement of encoder carriage 372 caused by rotation of lead screw 356.

An alternative mechanism for monitoring the position of lead nut assembly 366 can be accomplished by mounting at one of its ends a rotary encoder pair, such as a Model 110514 encoder sold by Maxon for use with a Model 137540 (35 millimeter) or Model 148877 (40 millimeter) Maxon motor.

Port door 76 and encoder carriage 372 are slidably mounted on stationary vertical support plates 374 by means of high precision, low friction linear bearing assemblies 378 arranged in parallel to longitudinal axis 362. Linear bearing assemblies 378 preferably extend for the full length of travel of lead nut assembly 366 and thereby positively guide encoder carriage 372 along the full length of its travel path. Various types of position encoders and devices for continuously monitoring and providing feedback relating to the displacement of lead nut assembly 366 and encoder carriage 372 are known in the art and would be suitable. Optical encoder assemblies are generally preferred, and encoders that operate using Moire fringe pattern principles to continuously monitor the position of encoder carriage 372 are especially preferred.

Optical position encoder 342 includes a read head mounting member 380 on which an array of light emitting diodes is mounted. A reference grating is rigidly mounted on read head mounting member 380, and a stationary grating 382 extends along the full length of travel of encoder carriage 372. The structural design and functions of read head mounting member 380 and stationary grating 382 that operate using Moire fringe pattern principles are known and described in commonly assigned U.S. Pat. No. 5,382,806.

The following summarizes the operational sequence of wafer transport system 10. An operator or robot mechanism places a carrier box 18 onto slidable tray 24, and all of the eleven sensors required by SEMI specifications check for proper registration of carrier box 18 on kinematic coupling pins 66. The operator or program control causes slidable tray 24 to move carrier box 18 relatively rapidly toward aperture 74 in front plate 14. A controller slows the motion of tray motor 100 to a constant speed when box door 30 reaches the penetration point of latch keys 150 relative to slots 46 in box door 30. The controller is implemented with a force feedback system that by either sensing tray motor current or following a stored slidable tray position profile detects an obstruction or plastic component out-of-tolerance variation and prevents overpowering slidable tray 24 under conditions that would prevent proper engagement of box door 30 with latch keys 150. The motor current sense entails sensing an amount of electrical current for a time relative to a distance traveled by slidable tray 24. The following of the tray position profile entails comparing to a stored position profile a present position derived from a rotary position encoder installed in tray motor 100. The force feedback system establishes for a valid zone of engagement a low force criterion applied to carrier box 18 that, when exceeded, causes tray motor 100 to stall and thereby allow for a reversal of travel direction of slidable tray 24 before penetration by latch keys 150 could be attempted.

When box door 30 mates with port door 76 and front side margin 148 forms a seal with the beveled side margin of aperture 74 in front plate 14, clamping finger 132 has completed securing carrier box 18 against slidable tray 24 and latch key motor mechanism 172 turns latch keys 150 to lock box door 30 to port door 76. Port door translation mechanism 250 pulls box door 30 and port door 76 beyond interior surface 78 of front plate 14. Presence sensor 346a determines whether any of the wafers 152 is protruding from wafer cassette 32. A second presence sensor 347a positioned near finger pivot axes 298*l* and 298*r* of scanning fingers 292*l* and 292*r* senses excessive protrusion of a wafer 152 and prevents further downward motion by elevator assembly 28.

Elevator assembly 28 causes port door carriage 344 and thereby port door 76 to descend about 3 cm, and scanning fingers 292*l* and 292*r* flip out of port door 76 to their fully extended positions. Elevator assembly 28 then causes port door carriage 344 to descend to scan the contents of wafer cassette 32. If presence sensor 346a indicates at least one wafer 152 is protruding from wafer cassette 32, scanning fingers 292*l* and 292*r* retract at each wafer position and flip outwardly to push the protruding wafer 152 back into its slot in wafer cassette 32. Scanning fingers 292*l* and 292*r* repeat the flipping process for each wafer position until sensor 346*a* indicates an obstruction is no longer present.

Following completion of a scan, scanning fingers 292*l* and 292*r* retract, elevator assembly 28 moves port door carriage 344 to its lowermost position, and port door 76 remains parked as wafer processing by robot assembly 20 takes place. Upon completion of wafer processing, elevator assembly 28 returns port door 76 to its uppermost position to separate box door 30 from port door 76 and retract carrier box 18 away from front plate 14.

With reference to FIGS. 2 and 19–24, robot assembly 20 is positionable along a linear traveling robot assembly 400. Linear traveling assembly 400 includes a stationary lead screw 402 supported at either end by a pillow block 404 mounted to a stage base 406. Each pillow block 404 is bolted or otherwise secured to stage base 406. A motor-driven rotating nut mechanism 408 is mounted to robot assembly 20 to move it along lead screw 402 between apertures 74 of side-by-side front plates 14. Nut mechanism 408 is contained within a housing 422 that is secured to a carriage 424. Carriage 424 is connected to a robot mounting plate 425 that supports robot assembly 20 so that robot assembly 20 along with carriage 424 moves along lead screw 402 between apertures 74. Carriage 424 includes upper and lower tracks 426 and 428 that travel along upper and lower rails 430 and 432 bolted or otherwise secured to stage base 406. Stage base 406 is immovably secured to front plates 14 by alignment fixtures 434 that are bolted or otherwise secured at each end. Housing 422 includes a sheet metal covering 436 to prevent dirt and dust from accumulating on nut mechanism 408 and serves as a safety cover to prevent injury that might result from clothing or anything that might get caught in nut mechanism 408 as it travels along lead screw 402. Nut mechanism 408 is further protected by sheet metal coverings 438 and 440 that are connected to stage base 406 by screws 441 and that extend into slots 442 in carriage 424 and secured by screws 444. The ends of the sheet metal coverings 438 and 440 cooperate with plastic glides 446 located within carriage 424 to prevent sheet metal coverings 438 and 440 from being bent and to absorb any misalignment and keep them straight. Glides 446 also prevent metal to metal contact between carriage 424 and sheet metal coverings 438 and 440 to reduce contamination.

Nut mechanism 408 includes a lead nut 448 rotated by a motor 450 through a belt 452. Motor 450 is mounted to housing 422 by a motor mount 454. Motor 450 includes a drive shaft 456 that rotates a motor pulley 458 connected thereto by a conical clamp 460. Belt 452 is in driving engagement with a lead nut pulley 462 to rotate lead nut 448. Lead nut pulley 462 is rotated within a bearing 464 that is connected to housing 422 through an inner race bearing clamp 466 and an outer race bearing clamp 468. Lead nut 448 is connected to lead nut pulley 462 by screw threads at one end and is prevented from rotating within lead nut pulley 462 by a lock nut 470. Lead nut 448 has resilient fingers 472 at one end that are internally threaded and are forced inwardly by a lead nut sleeve 474 for engagement with lead screw 402. Wave springs 476 located between lead nut sleeve 474 and lead nut pulley 462 urge lead nut sleeve 474 toward the finger end of lead nut 448. An internal cam surface 478 on lead nut sleeve 474 acts on an enlarged end 480 of resilient fingers 472 to force them inwardly into a secure threaded engagement with lead screw 402.

Motor 450 receives power from an electrical cable 482 located beneath carriage 424 and supported by a tray 484. Cable 482 is supported within an articulated track 486 with one end connected to a power source 488 and the opposite end connected to a power housing 490 on carriage 424 so that cable 482 can travel along with carriage 424.

Robot assembly 400 is moved from one position to another by rotating lead nut 448 in the above-described manner to advance carriage 424 along lead screw 402 until the final position is reached. A linear encoder scale 500 is connected to carriage 424 and travels along with it indicate the position of carriage 424. End stops 502 are connected to stage base 406 at each end of lead screw 402 to stop carriage 424 at the proper location. Robot assembly 20 is positioned to retrieve and return wafers from wafer carrier boxes 18 mated against front plates 14 by box load interface systems 16.

To ensure precise alignment of robot assembly 20, front plate 14 includes for stage base 406 mounting holes 410 that constitute registration points for readily referencing robot assembly 20 to front plate 14 to ensure vertical and center-to-center alignment. This feature is advantageous because additional subsystems provided in system expansion would be automatically aligned to preassigned registration points.

FIGS. 38–45 show a four-bar carriage assembly 510, which is an alternative embodiment of unitary construction that combines the functions of port door translation mechanism 250 and port door carriage mechanism 252. Components common to both embodiments are identified by the same reference numerals.

Figure 42:
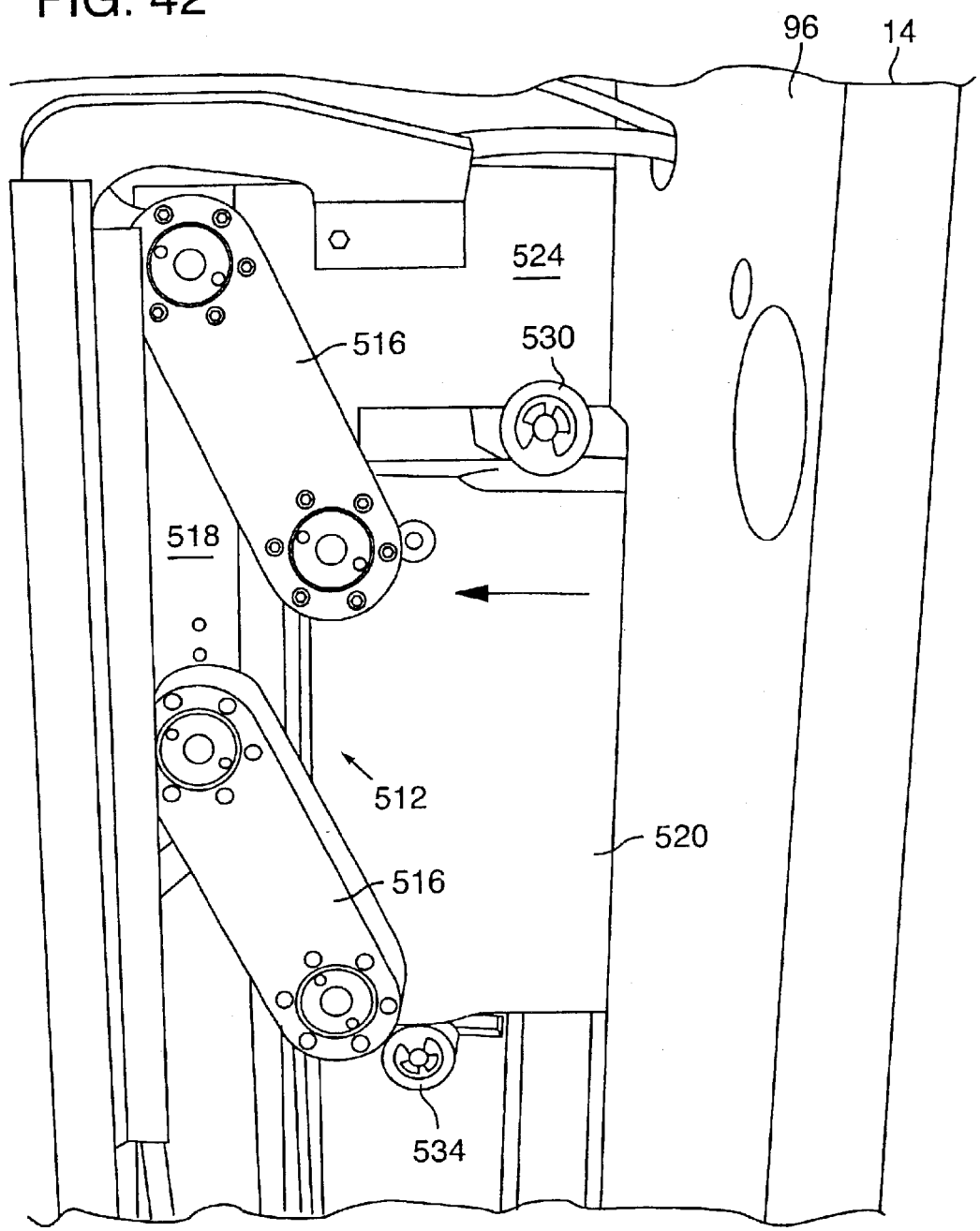
FIG. 42 is an enlarged fragmentary isometric view of a pair of bar links pivotably attached to the right-hand side surfaces of the Z and link carriages shown in FIG. 41.
Figure 43:
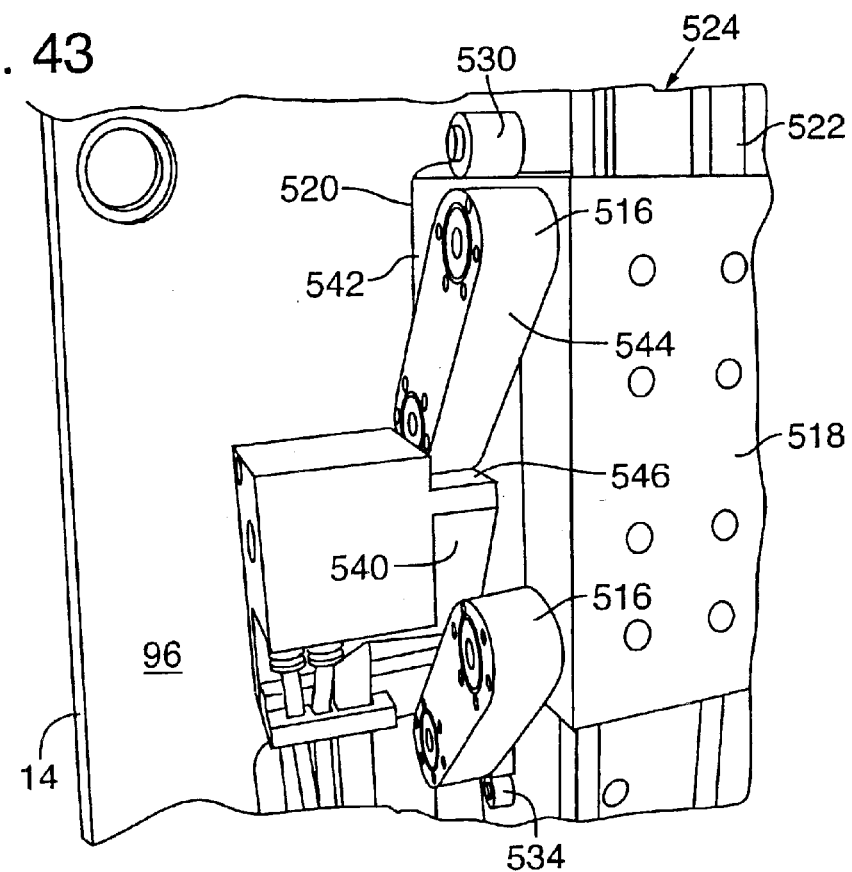
FIGS. 43 and 44 are enlarged fragmentary isometric views of a pair of bar links pivotably attached to the left-hand side surfaces of the Z and link carriages shown in FIG. 41.
Figure 44:
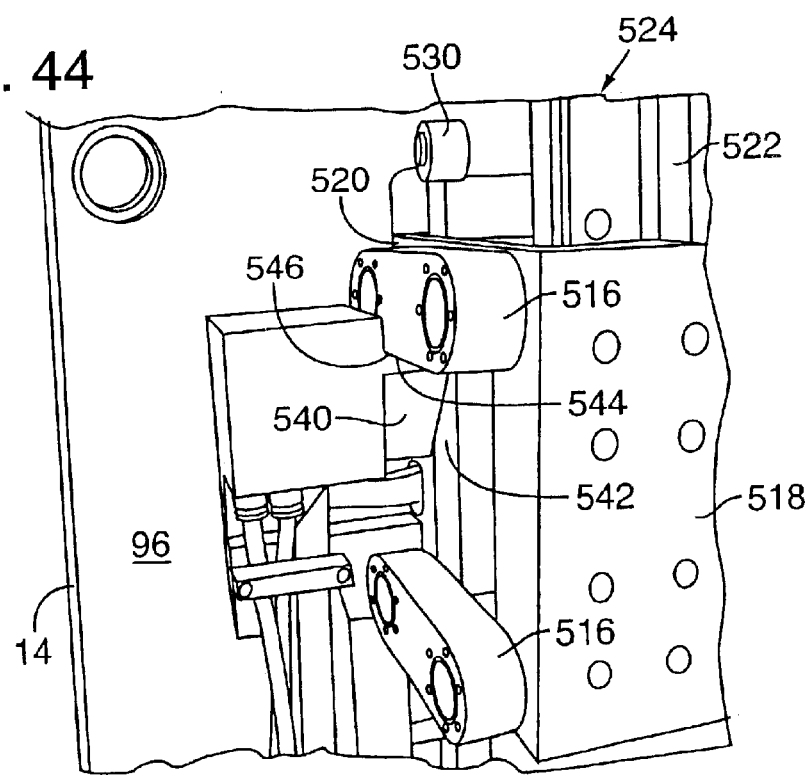

With reference to FIGS. 38–44, elevator assembly 28 preferably uses side drive lead screw mechanism 354 in cooperation with a four-bar linkage mechanism 512 to raise and lower port door 76 and to move port door 76 toward and away from aperture 74 of front plate 14. Linkage mechanism 512 couples port door 76 to lead screw mechanism 354. Linkage mechanism 512 comprises two pairs of pivot or bar links 516 pivotally mounted to and coupling together a Z carriage 518 and an H-shaped link carriage 520. Z carriage 518 is rigidly attached to lead nut assembly 366 located proximal to exterior surface 96 of front plate 14, and link carriage 520 is rigidly attached to port door 76 located proximal to interior surface 78 of front plate 14. Lead screw 356 driven by motor 358 moves Z carriage 518 vertically on rails 522 that are attached to a backbone structure 524 secured to exterior surface 96 of front plate 14. The two pairs of bar links 516 have their ends pivotally attached to different, opposite side surfaces of Z carriage 518 and link carriage 520, the latter of which including a portion extending through an elongated vertical opening in backbone structure 524. FIG. 42 and FIGS. 43 and 44 show the different pairs of bar links 516 pivotally attached to, respectively, the right-hand side and left-hand side surfaces of Z carriage 518 and link carriage 520 depicted in FIG. 41. Bar links 516 are positioned to form a parallelogram of changing height as they pivotally move in response to a linear displacement of Z carriage 518. A travel guide roller 530 mounted on backbone structure 524 operates in part as a mechanical stop that limits the vertical travel of link carriage 520 and port door 76. The maximum elevation of link carriage 520 set by guide roller 530 aligns port door 76 with aperture 74 of front plate 14. Guide roller 530 functions, therefore, as a cam surface and follower device.

Figure 39:
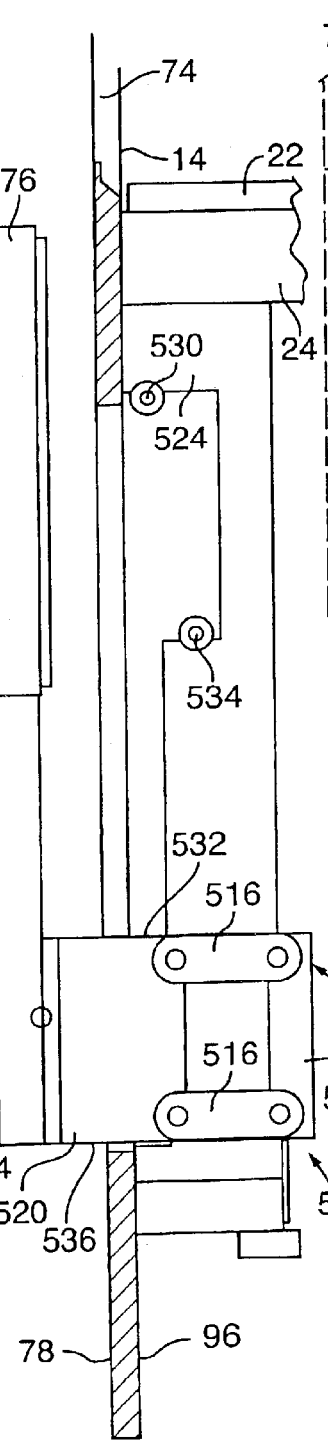

Four-bar carriage assembly 510 operates in the following manner. Elevator assembly 28 causes rotation of lead screw 356 and a corresponding linear displacement of lead nut assembly 366 along the length of lead screw 356. This results in linear displacement of Z carriage 518 to raise or lower it. Whenever the direction of rotation of lead screw 356 causes Z carriage 518 to move upwardly from its lowest position, which is shown in FIG. 39, link carriage 520 moves upwardly in unison with Z carriage 518 because bar links 516 positioned on either side are aligned parallel to each other in a horizontal direction by operation of a fluidic counterbalance mechanism, the construction and operation of which is described below with reference to FIG. 45.

Figure 40:
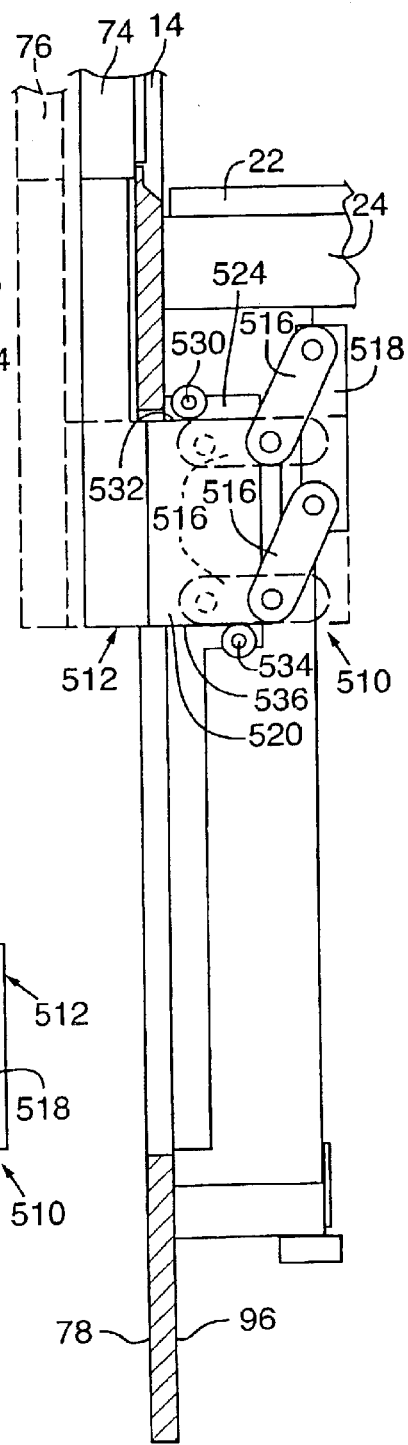
Figure 41:
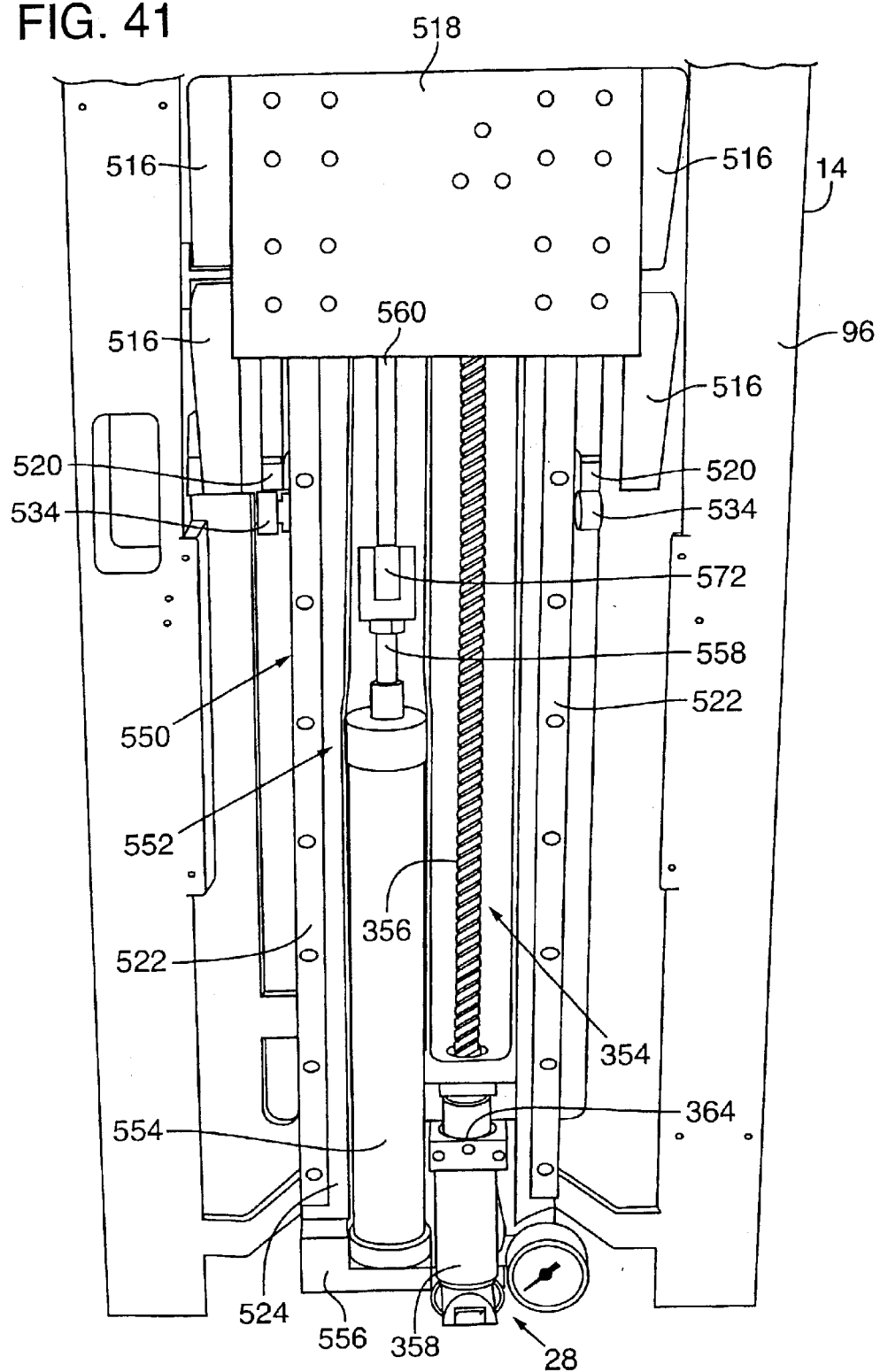
FIG. 41 is a fragmentary front side elevation view showing the arrangement of the components of the four-bar carriage assembly mounted to the exterior surface of the front plate of the wafer transport system.

Bar links 516 maintain their horizontal disposition until an upper surface 532 of link carriage 520 contacts guide roller 530, which position is shown in phantom lines in FIG. 40. Link carriage 520 rests against guide roller 530 while Z carriage 518 continues its upward movement. The continued upward movement of Z carriage 518 occurring while link carriage 520 remains stationary in the direction of upward movement causes bar links 516 to pivot as a parallelogram of decreasing height to draw link carriage 520 and therefore port door 76 in a direction perpendicular to the direction of travel of Z carriage 518. A bottom steering roller 534 is mounted on backbone structure 524 to receive a bottom surface 536 of link carriage 520 as it advances toward interior surface 78 and port door 76 advances toward and in alignment with aperture 74 of front plate 14. Bottom steering roller 534 prevents rotational motion of link carriage 520 and thereby maintains its straight line inward direction of travel perpendicular to that of Z carriage 518 as it advances toward interior surface 78. Steering roller 534 also prevents link carriage 520 from falling under fluidic pressure loss conditions associated with the fluidic counterbalance mechanism. Z carriage 518 reaches its highest position, which is shown in solid lines in FIG. 40, when port door 76 fits into and achieves sealed engagement with aperture 74 of front plate 14.

Whenever the direction of rotation of lead screw 356 causes Z carriage 518 to move downwardly from its highest position, bar links 516 pivot to form a parallelogram of increasing height to move link carriage 520 away from interior surface 78 and thereby cause port door 76 to retract from aperture 74 of front plate 14. Bar links 516 positioned on either side assume a horizontal disposition parallel to each other after upper surface 532 of link carriage 520 no longer contacts guide roller 530 as Z carriage 518 and link carriage 520 continue to descend to the lowest position of Z carriage 518.

With particular reference to FIGS. 43 and 44, a hard stop block 540 is mounted on a side surface 542 of link carriage 520 at a location beneath a surface 544 of the bar link 516 positioned nearer to guide roller 530 on the left-hand side surfaces of Z carriage 518 and link carriage 520. Hard stop block 540 provides an impact surface 546 against which surface 544 of bar link 516 slides to prevent it (and the remaining three bar links 516) from rotating past the horizontal position in a clockwise direction when upper surface 532 of link carriage 520 is not in contact with guide roller 530, as shown in FIG. 44. The tendency of bar links 516 to over-rotate results from the operation of a counterbalance mechanism 550, which is designed to over-counterbalance link carriage 520 and thereby lift port door 76, as described below.

Four-bar carriage assembly 510 is a preferred implementation of a unitary structure that combines the functions of port door translation mechanism 250 and port door carriage mechanism 252. Skilled persons will appreciate, however, that use of as few as one bar link 516 in a carriage assembly is possible in conjunction with a suitable guide mechanism to effect travel of port door 76 in the two prescribed (i.e., vertical and horizontal) directions. For example, alternative embodiments could include a pair of bar links, one positioned on each of top sides and bottom sides of a Z carriage and a link carriage, or a single bar link implemented with a cam and roller follower mechanism designed to describe the desired motion. Moreover, a two-cylinder fluidic drive mechanism can be substituted for side drive lead screw mechanism 354. Two fluidic cylinders having extensible rods of the appropriate lengths and connected in series can provide the directional displacements accomplished as described above.

Figure 45:
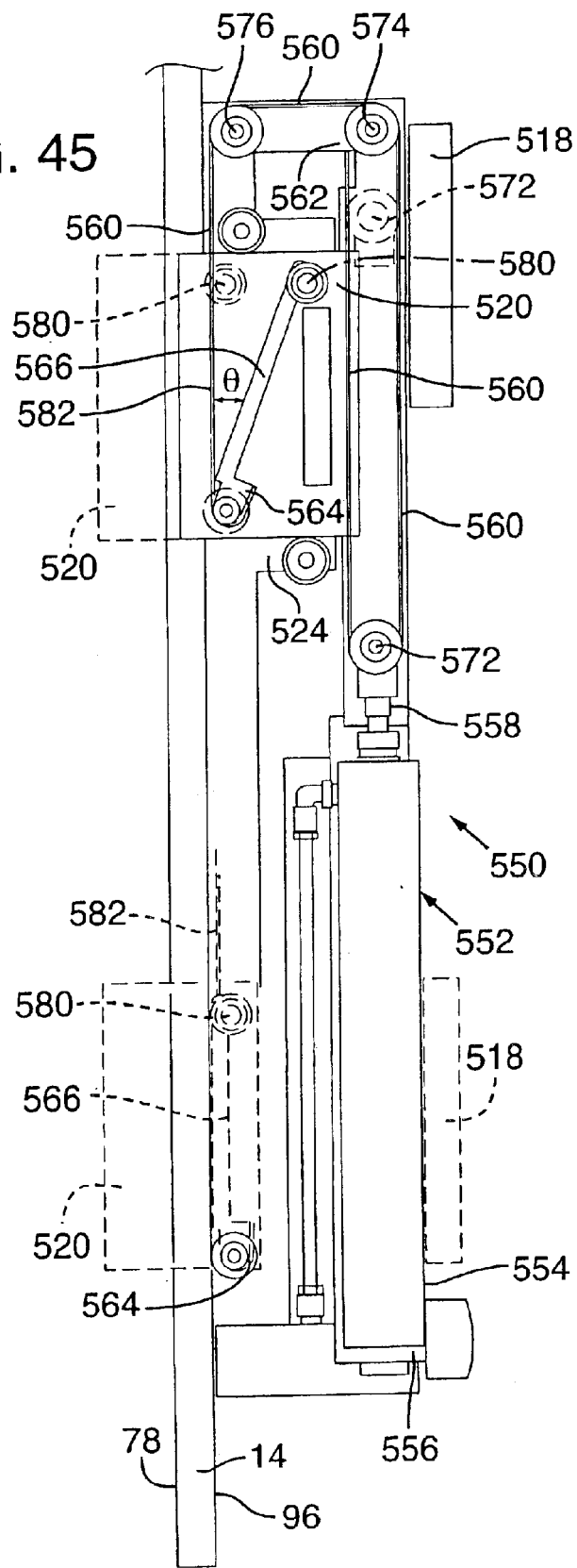
FIG. 45 is a side elevation view of a vertical/horizontal port door displacement fluidic control counterbalance mechanism of the four-bar carriage assembly of FIGS. 38–44.

With reference to FIG. 45, vertical/horizontal port door displacement fluidic-controlled counterbalance mechanism 550 counterbalances the weight of port door 76 during its sequential translational movement in the upward and downward (i.e., vertical) and inward and outward (i.e., horizontal) directions. In its preferred implementation, counterbalance mechanism 550 slightly over-counterbalances the weight of port door 76 to apply a slight lifting force to it. Counterbalance mechanism 550 includes a fluidic, preferably pneumatic, constant force cylinder 552 having a body portion 554 with a closed end supported by a lower support member 556 fixed to backbone structure 524 and an open end through which an extensible rod 558 protrudes. Cylinder body portion 554 is stationary relative to backbone structure 524, and extensible rod 558 changes its length of extension from body portion 554 in response to the vertical movement of link carriage 520 and therefore port door 76. Extensible rod 558 is operatively connected to port door 76 by a belt 560 having one end attached to an upper support member 562 fixed to backbone structure 524 and the other end attached to a free end 564 of a pivot plate 566 pivotally mounted to interior side surfaces of link carriage 520. Between its ends, belt 560 loops around a roller 572 fixed to the distal end of extensible rod 558 and around two spaced-apart rollers 574 and 576 mounted to upper support member 562. The positions of the fixed end points of belt 560 and rollers 574 and 576 produce a folded belt configuration that establishes an operational relationship in which 1.0 unit of vertical travel of Z carriage 518 produces 0.5 unit of linear extension of extensible rod 558.

Counterbalance mechanism 550 operates in the following manner. Pneumatic cylinder 552 provides a constant force, $F_{lift}$, in the direction of travel (i.e., vertical direction) of Z carriage 518 when link carriage 520 is not in contact with guide roller 530. As Z carriage 518 moves along rails 522, pneumatic cylinder 552 changes the length of extension of extensible rod 558 by corresponding amounts to take up belt slack and lead out additional belt length as port door 76, respectively, advances toward or retracts from aperture 74. Whenever link carriage 520 contacts guide roller 530 and Z carriage 518 continues upwardly directed movement, pivot plate 566, by operation of four-bar links 516, pivots in a clockwise direction about a pivot axis 580 to provide a closing force, $F_{close}=F_{lift} \sin \theta$, in which $\theta$ is the included angle between pivot plate 566 and a segment 582 of belt 560. Belt 560 pulls pivot plate 566 in a direction that causes it to fold upwardly with a force component directed toward interior surface 78 of front plate 14 to snap shut port door 76 into aperture 74. FIG. 45 (top) shows link carriage 520 in phantom lines to indicate the extent of horizontal displacement of link carriage 520 and therefore port door 76 for the minimum and maximum values of $\theta$. The pivotal action of pivot plate 566 provides a positive self-locking feature for port door 76. Whenever link carriage 520 contacts guide roller 530 and Z carriage 518 continues downward directed movement, pivot plate 566 pivots in a counterclockwise direction to provide an opening force of same magnitude but opposite direction of closing force, $F_{close}$, to retract port door 76 away from aperture 74. FIG. 45 (bottom) shows in phantom lines the positions of link carriage 520 and pivot plate 566 when Z carriage 518 is in its lowest position.

Counterbalance mechanism 550 exhibits several noteworthy features and advantages. There is no applied force required when port door 76 is in a fully open position (in which Z carriage 518 is in its lowest position) or in a fully closed position (in which pivot plate 566 snaps port door 76 shut against front plate 14). Pneumatic cylinder 552, not motor 358, carries the weight of port door 76. The counterbalancing implementation creates a stroke multiplier in which the length of the belt is twice the linear distance traveled by Z carriage 518 because of the folded belt configuration.

A scanning assembly of a type exemplified by scanning assembly 290 that includes pivotable scanning fingers 292*l* and 292*r* and is designed with either reflective or transmissive beam scanners can also be implemented with four-bar carriage assembly 510.

It will be obvious to those having skill in the art that many changes may be made to the details of the above-described embodiments of this invention without departing from the underlying principles thereof. The scope of the present invention should, therefore, be determined only by the following claims.

What is claimed is:

1. In a front-opening interface mechanical standard (FIMS) system including a transport box comprising a front-opening box cover and a removable box door that opens and closes the front opening of the box, a box door latch mechanism operatively connected to a latch actuating coupler to releasably secure the box door to the box cover in response to rotation of external latch keys inserted into the box to operate the latch actuating coupler, and a box bottom comprising a front clamping feature and a physical alignment interface having mating features that mate with mating surfaces to which the transport box is intended to be mounted, a box load interface, comprising:

a retractable port door attachable to the box door to selectively move the box door toward or away from the box cover to thereby close or open it;

a port plate having a front surface and a port plate aperture through which the box door can move as the port door moves the box door toward or away from the box cover;

a slidable tray slidably mounted to a support positioned transversely of the port plate, and a box hold down clamping mechanism mounted to the support for releasably mounting the box to the mating surfaces;

a slidable tray positioning mechanism for selectively moving the slidable tray on the support, the tray positioning mechanism moving the transport box in a direction toward or away from the port plate when the transport box is mounted to the mating surfaces; and a tray motion controller operatively associated with the tray positioning mechanism and including a motive force detection system that is responsive to the force being applied to the transport box during the movement of the slidable tray.

2. The box load interface of claim 1, in which the force to which the force detection system responds corresponds to mating of the transport box to the port plate.

3. The box load interface of claim 2, in which, upon detection of an improper mating of the transport box, the motive force detection system prevents an overpowering of the movement of the slidable tray past a reference location relative to the port plate as the slidable tray moves in the direction toward the port plate to push the front opening of the box cover against the front surface of the port plate.

4. The box load interface of claim 3, in which the tray positioning mechanism includes a tray electric motor and the motive force detection system senses tray motor electrical current flow to prevent the overpowering of the movement of the slidable tray.

5. The box load interface of claim 4, in which the motive force detection system senses an amount of electrical current for a time relative to a distance traveled by the slidable tray to establish for a valid zone of engagement relative to the port plate a transport box motive force threshold above which the motive force detection system causes the tray electric motor to stop the travel of the slidable tray.

6. The box load interface of claim 5, in which, upon stopping the travel of the slidable tray, the motive force detection system causes the tray electric motor to reverse the direction of travel of the slidable tray.

7. The box load interface of claim 3, in which the motive force detection system includes a stored slidable tray motion profile to prevent the overpowering of the movement of the slidable tray.

8. The box load interface of claim 7, in which the stored slidable tray motion profile includes tray position information representing positions of the slidable tray as it is moved by the positioning mechanism.

9. The box load interface of claim 7, in which the stored slidable motion profile includes tray electrical current information representing positions of the slidable tray as it is moved by the positioning mechanism.

10. The box load interface of claim 1, in which the force to which the force detection system responds corresponds to an obstruction to the movement of the slidable tray.

11. The box load interface of claim 10, in which, upon detection of an obstruction to the movement of the slidable tray, the motive force detection system prevents an overpowering of the movement of the slidable tray past a reference location relative to the port plate as the slidable tray moves in the direction toward the port plate to push the front opening of the box cover against the front surface of the port plate.

12. The box load interface of claim 11, in which the tray positioning mechanism includes a tray electric motor and the motive force detection system senses tray motor electrical current flow to prevent the overpowering of the movement of the slidable tray.

13. The box load interface of claim 12, in which the motive force detection system senses an amount of electrical current for a time relative to a distance traveled by the slidable tray to establish for a valid zone of engagement relative to the port plate a transport box motive force threshold above which the motive force detection system causes the tray electric motor to stop the travel of the slidable tray.

14. The box load interface of claim 13, in which, upon stopping the travel of the slidable tray, the motive force detection system causes the tray electric motor to reverse the direction of travel of the slidable tray.

15. The box load interface of claim 11, in which the motive force detection system includes a stored slidable tray motion profile to prevent the overpowering of the movement of the slidable tray.

16. The box load interface of claim 15, in which the stored slidable tray motion profile includes tray position information representing positions of the slidable tray as it is moved by the positioning mechanism.

17. The box load interface of claim 15, in which the stored slidable motion profile includes tray electrical current information representing positions of the slidable tray as it is moved by the positioning mechanism.

18. The box load interface of claim 1, in which the motive force detection system compares to a stored slidable tray motion profile a present position derived from a position sensor operatively associated with the tray positioning mechanism to establish for a valid zone of engagement relative to the port plate a transport box motive force threshold above which the motive force detection system causes the tray positioning mechanism to cease movement of the slidable tray in the direction toward the port plate.

19. The box load interface of claim 18, in which the tray positioning mechanism includes a tray electric motor and in which the motive force detection system causes the tray positioning mechanism to cease the movement of the slidable tray in the direction toward the port plate by stopping the tray electric motor.

20. The box load interface of claim 19, in which, upon causing the cessation of movement of the slidable tray, the motive force detection system causes the tray positioning mechanism to move the transport box away from the port plate.

21. The box load interface of claim 1, in which the motive force detection system includes a motive force feedback system that detects the force being applied to the transport box.

22. The box load interface of claim 21, in which the tray positioning mechanism includes a tray electric motor and the force feedback system is implemented to sense tray motor electrical current.

23. The box load interface of claim 21, in which the force feedback system is implemented to follow a stored slidable tray motion profile.

* * * * *